(12) United States Patent
Kiuchi

(10) Patent No.: US 8,013,975 B2
(45) Date of Patent: Sep. 6, 2011

(54) EXPOSURE APPARATUS, EXPOSURE METHOD, AND METHOD FOR PRODUCING DEVICE

(75) Inventor: Tohru Kiuchi, Higashi-Kurume (JP)

(73) Assignee: Nikon Corporation, Tokyo (JP)

( * ) Notice: Subject to any disclaimer, the term of this patent is extended or adjusted under 35 U.S.C. 154(b) by 675 days.

(21) Appl. No.: 11/987,371

(22) Filed: Nov. 29, 2007

(65) Prior Publication Data

US 2009/0002658 A1    Jan. 1, 2009

Related U.S. Application Data

(60) Provisional application No. 60/881,851, filed on Jan. 23, 2007.

(30) Foreign Application Priority Data

Dec. 1, 2006 (JP) .................................. 2006-325472

(51) Int. Cl.
*G03B 27/42* (2006.01)
*G03B 27/52* (2006.01)
*G03B 27/58* (2006.01)

(52) U.S. Cl. ............................... 355/30; 355/53; 355/72

(58) Field of Classification Search .................... 355/30, 355/53, 72, 77; 250/492.2; 310/12.01, 12.04–12.06, 310/12.27; 318/649
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |
| 5,610,683 A | 3/1997 | Takahashi |
| 5,715,039 A | 2/1998 | Fukuda et al. |
| 5,825,043 A | 10/1998 | Suwa |
| 6,680,774 B1 * | 1/2004 | Heinle ............................ 355/72 |
| 7,110,081 B2 | 9/2006 | Hoogendam et al. |
| 7,224,436 B2 | 5/2007 | Derksen et al. |

(Continued)

FOREIGN PATENT DOCUMENTS

DE    221563 A1    4/1985

(Continued)

OTHER PUBLICATIONS

Mar. 11, 2008 International Search Report issued in International patent application No. PCT/JP2007/073255 (with translation).

*Primary Examiner* — Hung Henry Nguyen
*Assistant Examiner* — Colin Kreutzer
(74) *Attorney, Agent, or Firm* — Oliff & Berridge, PLC

(57) ABSTRACT

An exposure apparatus includes: a first optical member via which an exposure beam exits; a first movable body movable while holding a substrate in a predetermined area; a first holding device releasably holding a first cover member, capable of forming a space retaining a liquid between the first optical member and the first cover member, such that when the first movable body is away from the first optical member, the first cover member is arranged at the position opposite to the exit surface of the first optical member; a second holding device arranged on the first movable body and capable of holding the first cover member released from the first holding device; and a third holding device arranged on the first movable body and releasably holding a second cover member. Deterioration of the performance due to the cover member can be suppressed while suppressing operating rate deterioration.

19 Claims, 30 Drawing Sheets

U.S. PATENT DOCUMENTS

| | | |
|---|---|---|
| 2004/0160582 A1 | 8/2004 | Lof et al. |
| 2004/0165159 A1 | 8/2004 | Lof et al. |
| 2004/0211920 A1 | 10/2004 | Derksen et al. |
| 2005/0036121 A1 | 2/2005 | Hoogendam et al. |
| 2005/0219489 A1* | 10/2005 | Nei et al. .......... 355/53 |
| 2006/0103818 A1* | 5/2006 | Holmes et al. .......... 355/53 |
| 2006/0103820 A1 | 5/2006 | Donders et al. |
| 2006/0132731 A1 | 6/2006 | Jansen et al. |
| 2006/0176458 A1 | 8/2006 | Derksen et al. |
| 2006/0268250 A1 | 11/2006 | Derksen et al. |
| 2006/0292846 A1* | 12/2006 | Pinto et al. .......... 438/597 |
| 2007/0115450 A1 | 5/2007 | Nagasaka et al. |
| 2007/0132970 A1 | 6/2007 | Lof et al. |
| 2007/0242242 A1 | 10/2007 | Nagasaka et al. |
| 2007/0268471 A1 | 11/2007 | Lof et al. |
| 2008/0002162 A1 | 1/2008 | Jansen et al. |
| 2008/0137045 A1* | 6/2008 | Kiuchi .......... 355/30 |

FOREIGN PATENT DOCUMENTS

| | | |
|---|---|---|
| DE | 224448 A1 | 7/1985 |
| JP | A-58-202448 | 11/1983 |
| JP | A-59-19912 | 2/1984 |
| JP | A-62-065326 | 3/1987 |
| JP | A-63-157419 | 6/1988 |
| JP | A-4-305915 | 10/1992 |
| JP | A-4-305917 | 10/1992 |
| JP | A-5-062877 | 3/1993 |
| JP | A-6-124873 | 5/1994 |
| JP | A-7-220990 | 8/1995 |
| JP | A-8-316125 | 11/1996 |
| JP | A-10-303114 | 11/1998 |
| JP | A-10-340846 | 12/1998 |
| JP | A-11-176727 | 7/1999 |
| JP | A-2000-058436 | 2/2000 |
| JP | A-2004-289128 | 10/2004 |
| JP | A-2005-191557 | 7/2005 |
| JP | A-2006-140498 | 6/2006 |
| JP | A-2006-179909 | 7/2006 |
| JP | A-2006-324619 | 11/2006 |
| WO | WO 99/49504 | 9/1999 |
| WO | WO 2004/019128 | 3/2004 |
| WO | WO 2007/029829 | 3/2007 |

* cited by examiner

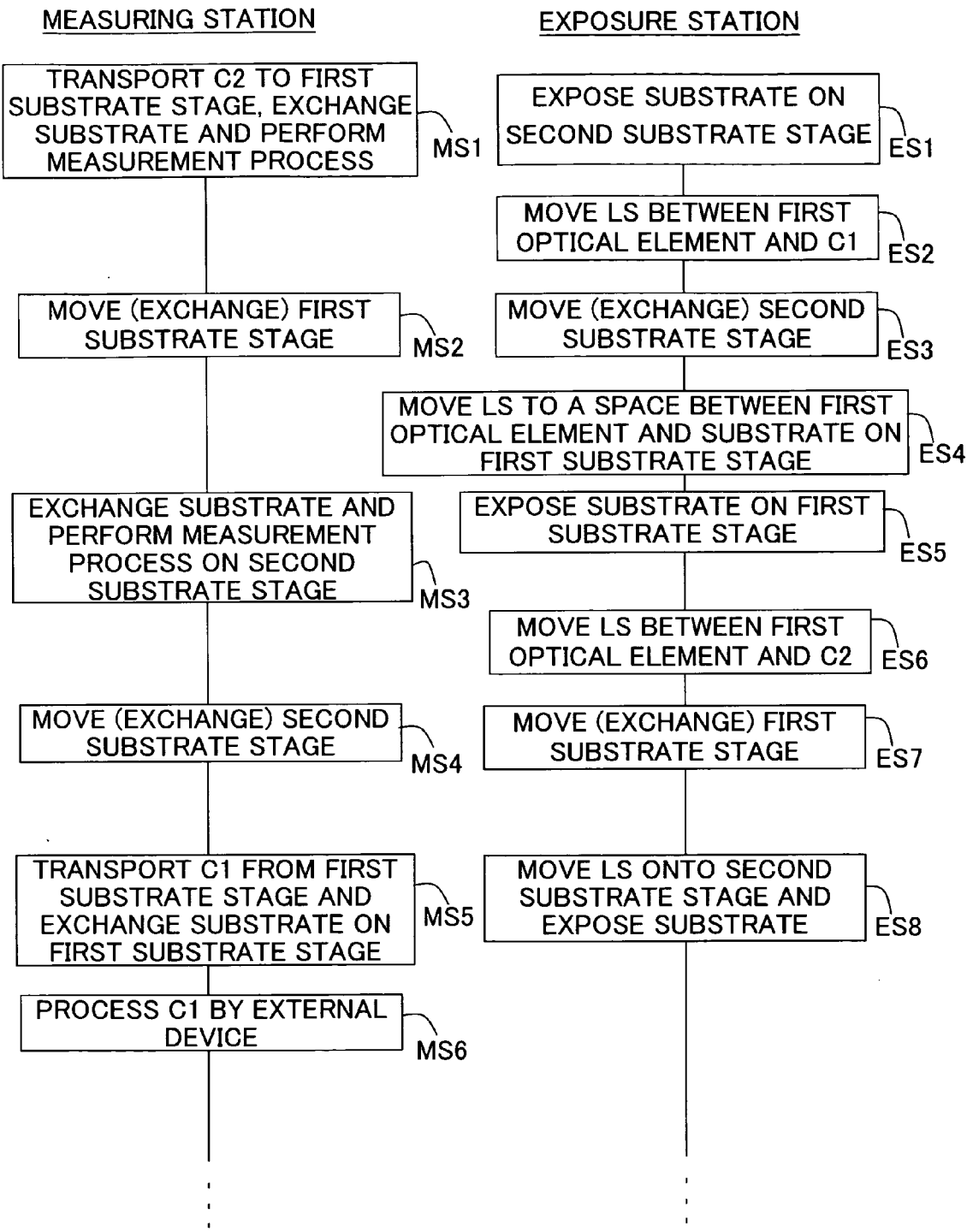

EXPOSURE APPARATUS, EXPOSURE METHOD, AND METHOD FOR PRODUCING DEVICE

CROSS-REFERENCES TO RELATED APPLICATIONS

This application claims the benefit of priority of Japanese Patent Application No. 2006-325472 filed on Dec. 1, 2006 and U.S. Provisional Application No. 60/881,851 filed on Jan. 23, 2007, the entire disclosures of which are incorporated herein by reference.

BACKGROUND OF THE INVENTION

1. Field of the Invention

The present invention relates to an exposure apparatus which exposes a substrate, an exposure method, and a method for producing a device.

2. Description of the Related Art

A liquid immersion exposure apparatus, in which a substrate is exposed through or via a liquid, has been contrived as disclosed in Japanese Patent Application Laid-open No. 2004-289128 in relation to an exposure apparatus to be used for the photolithography step.

In the conventional technique, a shutter member is arranged at a position opposite to or facing a light exit surface (light outgoing surface) of the projection optical system to form a space holding or retaining the liquid between the shutter member and the light exit surface of the projection optical system. There is a possibility that the shutter member is deteriorated and/or polluted. If the shutter member is continuously used while leaving the state that the shutter member is deteriorated and/or polluted as it is, the following possibility arises such that, for example, the liquid, which is retained between the shutter member and the light exit surface of the projection optical system, leaks, and/or that the light exit surface of the projection optical system is polluted (for example, any water mark appears, etc.). If such an inconvenience or problem arises, for example, there is a possibility that the exposure accuracy is deteriorated. Further, if it is necessary that the maintenance operation is performed frequently due to, for example, the leakage of the liquid and/or the pollution of the projection optical system, then there is a possibility that the working rate of the exposure apparatus is lowered.

The present invention has been made taking the foregoing circumstances into consideration, an object of which is to provide an exposure apparatus and an exposure method which make it possible to suppress the deterioration of the performance which would be otherwise caused by a member holding or retaining the liquid between the member and an optical element (for example, a terminal (final) optical element of a projection optical system, etc.) when a substrate is exposed through a liquid while suppressing the lowering of the operation rate, and a method for producing a device by using the exposure apparatus and the exposure method.

SUMMARY OF THE INVENTION

In order to achieve the objects as described above, the present invention adopts the following constructions corresponding to respective drawings as illustrated in embodiments. However, parenthesized reference numerals affixed to respective elements merely exemplify the elements by way of example, with which it is not intended to limit the respective elements.

According to a first aspect of the present invention, there is provided an exposure apparatus which exposes a substrate by radiating an exposure beam onto the substrate, the exposure apparatus comprising: a first optical member having an exit surface via which the exposure beam exits; a first movable body which is movable, while holding the substrate, in a predetermined area including a first area and a second area, the first area including a position opposite to the exist surface of the first optical member and the second area being different from the first area; a first holding device which releasably holds a first cover member, capable of forming a liquid-retaining space retaining a liquid between the first optical member and the first cover member, such that when the first movable body is away from the first optical member, the first cover member is arranged at the position opposite to the exit surface of the first optical member; and a second holding device which is arranged at a first position on the first movable body and which is capable of holding the first cover member released from the first holding device; and a third holding device which is arranged at a second position on the first movable body and which releasably holds a second cover member different from the first cover member.

According to the first aspect of the present invention, the second holding device capable of holding the first cover member released from the first holding device and the third holding device which releasably holds the second cover member different from the first cover member are provided on the first movable body. Therefore, it is possible to suppress the deterioration of the performance due to the cover member while suppressing the deterioration of the operating rate.

According to a second aspect of the present invention, there is provided an exposure apparatus which exposes a substrate by radiating an exposure beam onto the substrate, the exposure apparatus comprising: a first optical member having an exit surface via which the exposure beam exits; a first movable body which is movable, while holding the substrate, in a predetermined area including a first area and second area, the first area including a position opposite to the exist surface of the first optical member and the second area being different from the first area; a first holding device which releasably holds a first cover member capable of forming a liquid-retaining space retaining a liquid between the first optical member and the first cover member, such that when the first movable body is away from the first optical member, the first cover member is arranged at the position opposite to the exit surface of the first optical member; and an exchange system which exchanges the first cover member for a second cover member different from the first cover member while forming the liquid-retaining space between the first optical member and the exchange system.

According to the second aspect of the present invention, there is provided the exchange system which exchanges the first cover member for the second cover member while forming the liquid-retaining space retaining the liquid between the first optical member and the exchange system. Therefore, it is possible to suppress the deterioration of the performance due to the cover member while suppressing the deterioration of the operating rate.

According to a third aspect of the present invention, there is provided an exposure apparatus which exposes a substrate by radiating an exposure beam onto the substrate via an optical member, the exposure apparatus comprising: a liquid immersion member which is capable of retaining a liquid in a space between the optical member and the substrate; a holding device which is capable of holding a cover member such that the cover member faces the optical member, the cover member capable of forming a liquid-retaining space retaining the liquid between the optical member and the cover member; and a movable body having first and second holding portions capable of holding another cover member different from the cover member such that the cover member is exchangeable while retaining the liquid under the optical member.

According to the third aspect of the present invention, the first and second holding portions of the movable body are used so that the cover member is exchangeable while retaining the liquid under the optical member. Therefore, it is possible to suppress the deterioration of throughput (or of operating rate) and suppress any pollution (or deterioration of performance) due to the cover member.

According to a fourth aspect of the present invention, there is provided a method for producing a device, comprising exposing a substrate by using the apparatus as defined in the above aspect; developing the exposed substrate; and processing the developed substrate.

According to the fourth aspect of the present invention, the device can be produced by using the exposure apparatus in which the deterioration of the performance is suppressed.

According to a fifth aspect of the present invention, there is provided an exposure method for exposing a substrate with an exposure beam via an optical member, the method comprising: moving a liquid retained between the optical member and a first cover member to be retained between the optical member and the substrate; exposing the substrate with the exposure beam via the optical member and the liquid; and moving the liquid retained between the optical member and the substrate to be retained between the optical member and a second cover member; wherein the first cover member is exchanged for the second cover member while retaining the liquid under the optical member.

According to the fifth aspect of the present invention, the first cover member is exchanged for the second cover member while retaining the liquid under the optical member. Therefore, it is possible to suppress the degradation of throughput (or operation rate) of the exposure apparatus and to suppress the pollution (or degradation of the performance) of the exposure apparatus.

According to a sixth aspect of the present invention, there is provided a method for producing a device, comprising exposing a substrate by using the exposure method as defined in the fifth aspect; developing the exposed substrate; and processing the developed substrate.

According to the present invention, it is possible to suppress the deterioration of the performance of the exposure apparatus while suppressing the deterioration of the operation rate of the exposure apparatus. Therefore, a device having the desired performance can be produced at a high productivity.

BRIEF DESCRIPTION OF THE DRAWINGS

FIG. 30 shows a flow chart illustrating an example of the exposure method of the present invention.

DESCRIPTION OF THE PREFERRED EMBODIMENTS

Although embodiments of the present invention will be explained below with reference to the drawings, the present invention is not limited to the embodiments. In the following description, a XYZ rectangular coordinates system is defined, and the positional relationship between respective members is explained with reference to the XYZ rectangular coordinates system. An X axis direction is a predetermined direction in a horizontal plane, a Y axis direction is a direction which is perpendicular to the X axis direction in the horizontal plane, and a Z axis direction is a direction which is perpendicular to the X axis direction and the Y axis direction (i.e., vertical direction). The directions of rotation (inclination) about the X axis, the Y axis, and the Z axis are designated as θX, θY, and θZ directions respectively.

First Embodiment

Figure 1:
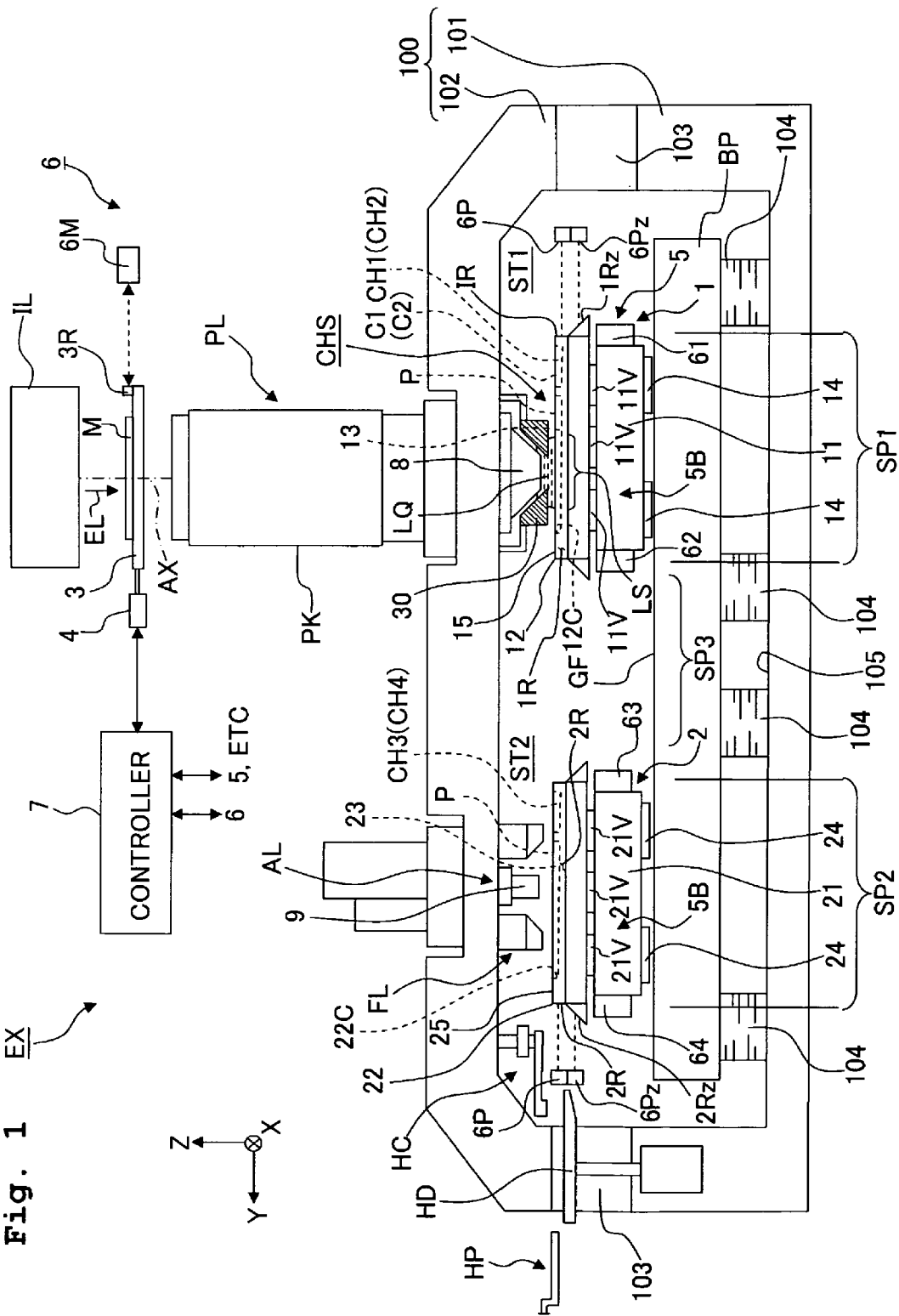
FIG. 1 is a schematic arrangement view of an exposure apparatus according to a first embodiment.

A first embodiment will be explained. FIG. 1 is a schematic arrangement view of an exposure apparatus EX according to this embodiment. In this embodiment, an explanation will be made as exemplified by a case that the exposure apparatus EX is an exposure apparatus of the multi-stage (twin-stage) type provided with a plurality of (two) substrate stages 1, 2 which are movable while holding substrates P, as disclosed, for example, in Japanese Patent Application Laid-open No. 10-163099, Japanese Patent Application Laid-open No. 10-214783 (corresponding to U.S. Pat. No. 6,590,634), Published Japanese Translation of PCT International Publication for Patent Application No. 2000-505958 (corresponding to U.S. Pat. No. 5,969,441), Published Japanese Translation of PCT International Publication for Patent Application No. 2000-511704 (corresponding to U.S. Pat. No. 5,815,246), Japanese Patent Application Laid-open No. 2000-323404 (corresponding to U.S. Pat. No. 6,674,510), Japanese Patent Application Laid-open No. 2000-505958 (corresponding to U.S. Pat. No. 5,969,081), Published Japanese Translation of PCT International Publication for Patent Application No. 2001-513267 (corresponding to U.S. Pat. No. 6,208,407), and Japanese Patent Application Laid-open No. 2002-158168 (corresponding to U.S. Pat. No. 6,710,849). That is, in this embodiment, the exposure apparatus EX has a first substrate stage 1 which is movable while holding the substrate P, and a second substrate stage 2 which is movable while holding the substrate P independently from the first substrate stage 1. The exposure apparatus of the multi-stage (twin-stage) type is also disclosed in U.S. Pat. Nos. 6,341,007, 6,400,441, 6,549, 269, and 6,590,634 in addition to the above-identified United States patents, and contents of these United States patents are incorporated herein by reference.

With reference to FIG. 1, the exposure apparatus EX includes a mask stage 3 which is movable while holding a mask M, the first substrate stage 1 which is movable while holding the substrate P, the second substrate stage 2 which is movable while holding the substrate P independently from the first substrate stage 1, a mask stage-driving system 4 which moves the mask stage 3, a substrate stage-driving system 5 which moves the first substrate stage 1 and the second substrate stage 2, a measuring system 6 including laser interferometers each of which measures the position information of one of the stages 1, 2, 3, an illumination system IL which illuminates the mask M with an exposure light (exposure beam) EL, a projection optical system PL which projects, onto the substrate P, an image of a pattern of the mask M illuminated with the exposure light EL, and a controller 7 which controls the operation of the entire exposure apparatus EX.

The substrate P referred to herein is, for example, a substrate such as a silicon wafer for device production, and includes substrates obtained by forming various types of films such as a photosensitive material (photoresist) and a protective film (top coat film) on a base material such as a semiconductor wafer. The mask M includes a reticle formed with a device pattern to be projected onto the substrate P, for example, a reticle having a predetermined pattern formed therein by using a light-shielding film such as chromium or the like on a transparent plate member such as a glass plate. In this embodiment, a transmissive type mask is used as the mask. However, it is also possible to use a reflective type mask. The transmissive type mask is not limited to a binary mask on which a pattern is formed with a light-shielding film, and also includes, for example, a phase shift mask based on, for example, the spatial frequency modulation type or a half tone type.

The exposure apparatus EX of this embodiment is provided with an exposure station ST1 which exposes the substrate P, and a measuring station ST2 which performs a predetermined measurement in relation to the exposure for the substrate P and the exchange of the substrate P. The first substrate stage 1 and the second substrate stage 2 are each movable between the exposure station ST1 and the measuring station ST2 while holding the substrate P. The exposure apparatus EX is provided with a base member BP which has a guide surface GF arranged to range over the exposure station ST1 and the measuring station ST2. Each of the first substrate stage 1 and the second substrate stage 2 is movable between the exposure station ST1 and the measuring station ST2 along the guide surface GF. In this embodiment, the guide surface GF, of the base member BP, which movably supports each of the first substrate stage 1 and the second substrate stage 2 is substantially parallel to the XY plane.

The illumination system IL, the mask stage 3, and the projection optical system PL and the like are arranged in the exposure station ST1. The projection optical system PL has a plurality of optical elements. These optical elements include a terminal end optical element 8. The terminal end optical element 8 is closest to the image plane of the projection optical system PL among the optical elements and has a light exit surface (lower surface) via which the exposure light EL exits. The first substrate stage 1 is movable on the light-exit side (image plane side of the projection optical system PL) of the terminal end optical element 8 of the projection optical system PL which radiates the exposure light EL. The second substrate stage 2 is movable independently from the first substrate stage 1 on the light-exit side (image plane side of the projection optical system PL) of the terminal end optical element 8 of the projection optical system PL. Although not shown, the projection optical system PL is provided on a surface plate of a barrel (barrel surface plate) supported by three support columns via an anti-vibration mechanism. However, the projection optical system PL may be supported by hanging the projection optical system PL with respect to an unillustrated main frame member arranged over or above the projection optical system PL, an unillustrated mask base supporting the mask stage 3, or the like as disclosed, for example, in International Publication No. 2006/038952.

Those arranged in the measuring station ST2 include various types of measuring devices capable of executing the measurement in relation to the exposure for the substrate P, the measuring devices including an alignment system AL which obtains the position information about the substrate P, a focus/leveling-detecting system FL, and the like. The alignment system AL has a plurality of optical elements. The alignment system AL uses the optical elements to obtain the position information about the substrate P. The focus/leveling-detecting system FL also has a plurality of optical elements. The focus/leveling-detecting system FL uses the optical elements to obtain the position information about the substrate P.

In the vicinity of the measuring station ST2, there is provided a substrate transport system HP which exchanges the substrate P. The controller 7 uses the substrate transport system HP to thereby make it possible to execute a substrate exchange operation for unloading (transporting) a substrate P, for which the exposure process has been performed, from the first substrate stage 1 (or the second substrate stage 2) moved to a substrate exchange position (loading position) of the measuring station ST2, and for loading (transporting) another substrate P, which is to be subjected to the exposure process, on the first substrate stage 1 (or the second substrate stage 2). In this embodiment, the loading position and the unloading position are at a same position in the measuring station ST2. However, the load and the unload may be performed at different positions.

The exposure apparatus EX of the embodiment is a liquid immersion exposure apparatus to which the liquid immersion method is applied in order that the exposure wavelength is substantially shortened to improve the resolution and the depth of focus is substantially widened. The exposure apparatus EX is provided with a seal member (nozzle member) 30 which is capable of forming a liquid immersion space LS of a liquid LQ so that the optical path space for the exposure light EL is filled with the liquid LQ. In this embodiment, the seal member 30 constructs at least a part of a liquid immersion mechanism which is provided on the exposure apparatus EX. The optical path space for the exposure light EL is a space which includes the optical path along which the exposure light EL is advanced or allowed to travel. The liquid immersion space LS is a space which is filled with the liquid LQ. The exposure apparatus EX radiates the exposure light EL onto the substrate P via the projection optical system PL and the liquid LQ to expose the substrate P. In this embodiment, water (pure or purified water) is used as the liquid LQ. Those transmissive through pure water include not only the ArF excimer laser light beam but also, for example, the emission line radiated, for example, from a mercury lamp and the far ultraviolet light beam (DUV light beam) such as the KrF excimer laser beam. In this embodiment, the optical element 8 is formed of calcium fluoride ($CaF_2$). The calcium fluoride has a high affinity for water. Therefore, the liquid LQ is successfully allowed to make tight contact substantially with an entire surface of a liquid contact surface (light exit surface) of the optical element 8. The optical element 8 may be silica glass which has a high affinity for water.

The seal member 30 includes a seal member disclosed, for example, in Japanese Patent Application Laid-open No. 2004-289126 (corresponding to U.S. Pat. No. 6,952,253) and Japanese Patent Application Laid-open No. 2004-289128 (corresponding to U.S. Pat. No. 7,110,081). The seal member 30 is also referred to as "liquid immersion space-forming member", "containment member" (or "confinement member"), or the like. The seal member 30 is capable of forming the liquid immersion space LS between the seal member 30 and an object opposite to or facing the seal member 30. In this embodiment, the seal member 30 is arranged in the vicinity of the terminal end optical element 8 of the projection optical system PL. The seal member 30 is capable of forming the liquid immersion space LS between the seal member 30 and an object arranged at a position at which the exposure light EL can be radiated, namely the object arranged at the position opposite to or facing the light exit surface of the terminal end optical element 8, on the light-exit side of the terminal end optical element 8 (on the image plane side of the projection optical system PL). The seal member 30 holds or retains the liquid LQ between the seal member 30 and the object to thereby form the liquid immersion space LS of the liquid LQ so that the optical path space for the exposure light EL on the light-exit side of the terminal end optical element 8, specifically an optical path space for the exposure light EL between the terminal end optical element 8 and the object is filled with the liquid LQ. As for the seal member 30, it is also possible to use a nozzle member or a seal member having the structure as disclosed, for example, in United State Patent Application Publication No. 2005/0280791, International Publication No. 2005/024517, European Patent Application Publication No. 1420298, International Publication No. 2004/055803, International Publication No. 2004/057589, International Publication No. 2004/057590, United States Patent Application Publication No. 2006/0231206, and U.S. Pat. No. 6,952,253. Namely, as an example, it is allowable that the seal member 30 is not provided with a member which forms a gas seal 82, which will be explained later on, for confining (retaining) the liquid LQ; the seal member 30 may be a nozzle member capable of by employing surface tension to form a liquid immersion area LS of the liquid LQ. Further, in this embodiment, the seal member 30 is provided on a support frame 102 which will be explained later and which supports the projection optical system PL. However, when the projection optical system PL is suspended and supported, then the seal member 30 may be suspended and supported integrally with the projection optical system PL, or the seal member 30 may be provided on a measurement frame or the like which is suspended and supported independently from the projection optical system PL. In the latter case, it is allowable that the projection optical system PL is not suspended and supported.

The object, which can be opposite (opposable) to the seal member 30 and the terminal end optical element 8, includes an object which is movable on the light-exit side of the terminal end optical element 8. In this embodiment, the object, which can be opposite to the seal member 30 and the terminal end optical element 8, includes at least one of the first substrate stage 1 and the second substrate stage 2 which are movable with respect to the terminal end optical element 8 on the light-exit side of the terminal end optical element 8. Further, the object, which can be opposite to the seal member 30 and the terminal end optical element 8, also includes the substrates P held or retained by the first substrate stage 1 and the second substrate stage 2. Each of the first substrate stage 1 and the second substrate stage 2 is movable to the position opposite to or facing the seal member 30 and the terminal end optical element 8. The seal member 30 is capable of forming the liquid immersion space LS of the liquid LQ between the seal member 30 and at least one of the first substrate stage 1 and the second substrate stage 2, by retaining the liquid LQ between the seal member 30 and at least one of the first substrate stage 1 and the second substrate stage 2, so that the optical path space for the exposure light EL on the light-exit side of the terminal end optical element 8 is filled with the liquid LQ. The object may include the measuring stage or a cap member etc. as described later on. The liquid immersion space LS, which is formed between the object and the seal member 30 and the terminal end optical element 8, is also simply referred to, on the object, as "liquid immersion area" or the like. The first and second substrate stages 1, 2, the mask stage 3, the measuring stage and the like are each also referred to as "movable body", "movable member", "stage assembly", or the like.

In this embodiment, the seal member 30 forms the liquid immersion space LS between the terminal end optical element 8 and the seal member 30 and the object (for example, at least one of the first substrate stage 1, the second substrate stage 2, and the substrate P) so that a partial area (local area) on the surface of the object is covered with the liquid LQ of the liquid immersion space LS. That is, in this embodiment, the exposure apparatus EX adopts the local liquid immersion system in which the liquid immersion space LS is formed between the terminal end optical element 8 and the seal member 30 and the substrate P so that the partial area on the substrate P is covered with the liquid LQ of the liquid immersion space LS at least during the exposure for the substrate P. When a shot area, among shot areas, which is located at the periphery or circumference of the substrate P is exposed, the liquid immersion space LS protrudes or extends from the substrate P, and a part or portion of opposing surface 15, 25 of the substrate stage which will be described later on, is also covered with the liquid LQ.

The alignment system AL of the measuring station ST2 has an optical element 9 capable of being opposite to the object (for example, at least one of the first substrate stage 1, the second substrate stage 2, and the substrate P). The alignment system AL detects, for example, an alignment mark on the substrate P and reference marks FM, etc. on the first and second substrate stages 1, 2 via the optical element 9 in order to obtain the position information about the substrate P. Each of the first substrate stage 1 and the second substrate stage 2 is movable to a position opposite to or facing the optical element 9.

In the following description, the terminal end optical element 8 of the projection optical system PL, which is arranged in the exposure station ST1 in order to radiate the exposure light EL, is appropriately referred to as "first optical element 8". The optical element 9, of the alignment system AL, which is arranged in the measuring station ST2 in order to obtain the position information about the substrate P held by at least one of the first substrate stage 1 and the second substrate stage 2, is appropriately referred to as "second optical element 9". The position, which is opposite to the light exit surface of the first optical element 8 and at which the exposure light EL is radiated from the first optical element 8, is appropriately referred to as "first position". The position, which is opposite to or facing the second optical element 9, is appropriately referred to as "second position". The exposure for the substrate P is performed at the first position. Therefore, the first position can be also referred to as "exposure position". The detection of the mark is performed at the second position. Therefore, the second position can be also referred to as "detecting position" or "measuring position".

As shown in FIG. 1, the exposure apparatus EX is provided with a first area SP1 and a second area SP2 which are defined on the base member BP. The first area SP1 is an area which includes the first position opposite to the first optical element 8 of the projection optical system PL and which is defined in at least a part of the exposure station ST1. The second area SP2 is an area which is different from the first area SP1, and includes the second position opposite to the second optical element 9 of the alignment system AL, and is defined in at least a part of the measuring station ST2. The exposure station ST1 includes the first area SP1 in which the first optical element 8 having the light exit surface via which the exposure light EL exits is arranged. The measuring station ST2 includes the second area SP2 in which the second optical element 9 is arranged to obtain the position information about the substrate P. In this embodiment, the first area SP1 of the exposure station ST1 and the second area SP2 of the measuring station ST2 are defined in the Y axis direction. The first area SP1 is arranged on the −Y side of the second area SP2. In this embodiment, a third area SP3 is defined between the first area SP1 and the second area SP2. Each of the first substrate stage 1 and the second substrate stage 2 is movable while holding the substrate P in a predetermined area on the base member BP (guide surface GF) including the first area SP1, the second area SP2, and the third area SP3.

In the exposure station ST1, the substrate P is exposed via the projection optical system PL and the liquid LQ. In the measuring station ST2, the measurement in relation to the exposure and the exchange of the substrate P are performed. Each of the first substrate stage 1 and the second substrate stage 2 is movable, while holding the substrate P, between the first area SP1 of the exposure station ST1 and the second area SP2 of the measuring station ST2.

The exposure apparatus EX of this embodiment is provided with a plurality of shutter members disclosed, for example, in Japanese Patent Application Laid-open No. 2004-289128, or a member similar to the shutter member, namely a plurality of cap members (also referred to as "cover members" and including, for example, a plate, etc.) capable of forming the space holding or retaining the liquid LQ (liquid-retaining space) between the first optical element 8 and the cap member. In this embodiment, the exposure apparatus EX includes at least two cap members capable of forming the space retaining the liquid LQ between the first optical element 8 and the cap member. In the following explanation, among the two cap members provided on the exposure apparatus EX, one of the cap members is referred to as "first cap member (first cover member) C1" as appropriate, and the other of the cap members is referred to as "second cap member (second cover member) C2" as appropriate.

Similar to the first substrate stage 1, the second substrate stage 2 and the substrate P, each of the first cap member C1 and the second cap member C2 is arranged at the first position opposite to the light exit surface of the first optical element 8 to make it possible to form, between the first optical element 8 and each of the first and second cap members C1, C2, a space in which the liquid LQ is retained so that the liquid LQ is retained (or covered, or capped), thereby forming the liquid immersion space LS.

As described later on, in this embodiment, the seal member 30 can releasably hold at least one of the first cap member C1 and the second cap member C2 so that at least one of the first cap member C1 and the second cap member C2 is arranged at the position opposite to or facing the light exit surface of the first optical element 8. In this embodiment, the seal member 30 releasably holds at least one of the first cap member C1 and the second cap member C2 so that at least one of the first cap member C1 and the second cap member C2 is arranged at the position opposite to the light exit surface of the first optical element 8 when both of the first substrate stage 1 and the second substrate stage 2 are away (separated) from the first optical element 8. In this embodiment, although the seal member 30 is used as a cap holder (holding device) which holds the first cap member C1 and the second cap member C2 releasably, another member, for example, such as a clamp mechanism may be used. In such a case, the cap holder may be provided, for example, on the support frame 102 which will be explained later and which supports the projection optical system PL.

The exposure apparatus EX of this embodiment is provided with an exchange system CHS which exchanges one of the first cap member C1 and the second cap member C2 for the other of the first cap member C1 and the second cap member C2 while forming the space retaining the liquid under the first optical element 8. The exchange system CHS is capable of exchanging the first cap member C1 arranged at the position opposite to the light exit surface of the first optical element 8 for the second cap member C2 while forming the space retaining the liquid LQ under the first optical element 8, and arranges the second cap member C2 at the position opposite to the light exit surface of the first optical element 8; and the exchange system CHS is capable of exchanging the second cap member C2 for the first cap member C1 arranged at the position opposite to the light exit surface of the first optical element 8 while forming the space retaining the liquid LQ under the first optical element 8, and arranges the first cap member C1 at the position opposite to the light exit surface of the first optical element 8. Note that the second cap member C2 may be exchanged for another cap member which is different from the first and second cap members C1, C2. In the following explanation, a cap member, which is held by the seal member 30 when the cap member is exchanged for the second cap member C2, is referred to also as "third cap member". In the embodiment, the third cap member includes the first cap member C1 and/or another cap member.

The exchange system CHS is provided with a first cap holder (first holding portion) CH1 which is arranged at a first position on the first substrate stage 1 and is capable of releasably holding the first and second cap members C1, C2; and a second cap holder (second holding portion) CH2 which is arranged at a second position on the first substrate stage 1 and is capable of releasably holding the first and second cap members C1, C2. The first cap holder CH1 is capable of holding the first and second cap members C1, C2 released from the seal member 30; and the second cap holder CH2 is capable of holding the first and second cap members C1, C2 released from the seal member 30. For example, the exchange system CHS is capable of holding, with the first cap holder CH1, the first cap member C1 released from the seal member 30 and the exchange system CHS is capable of releasing the second cap member C2, held by the second cap holder CH2, from the second cap holder CH2 to make the second cap member C2 to be held by the seal member 30. Further, the exchange system CHS is capable of holding, with the second cap holder CH2, the first cap member C1 released from the seal member 30, and the exchange system CHS is capable of releasing the second cap member C2, held by the first cap holder CH1, from the first cap holder CH1 to make the second cap member C2 to be held by the seal member 30.

Namely, the exposure apparatus EX of this embodiment is provided with the first cap holder CH1 which is arranged at the first position on the first substrate stage 1 and which is capable of releasably holding the first and second cap holders CH1, CH2 released from the seal member 30, and the second cap holder CH2 which is arranged at the second position on the first substrate stage 1 and which is capable of holding the first and second cap holders CH1, CH2 released from the seal member 30. Further, the exposure apparatus EX of the embodiment is provided with a third cap holder (third holding portion) CH3 which is arranged at a third position on the second substrate stage 2 and which is capable of holding the first and second cap holders CH1, CH2 released from the seal member 30, and a fourth cap holder (fourth holding portion) CH4 which is arranged at a fourth position on the second substrate stage 2 and which is capable of releasably holding the first and second cap holders CH1, CH2 released from the seal member 30. The exchange system CHS is also capable of holding the first cap member C1 (or the second cap member C2), released from the seal member 30, with one of the third and fourth cap holders CH3 and CH4, and capable of releasing the second cap member C2 (or the first cap member C1), held by the other of the third and fourth cap holders CH3 and CH4, from the other of the third and fourth cap holders CH3 and CH4 to make the second cap member C2 (or the first cap member C1) to be held by the seal member 30. In other words, in this embodiment, the second substrate stage 2 can be used to exchange one of the first and second cap members C1 and C2 for the other of the first and second cap members C1 and C2 while forming the space retaining the liquid under the first optical element 8. Note that in the embodiment, it is allowable to use only one of the first and second substrate stages 1 and 2 to perform the exchange of the cap member which is held by the seal member 30. In this case, it is allowable to provide, on the other of the first and second substrate stages 1 and 2 which is not used for the exchange of the cap members, only one piece of the cap holder capable of releasably holding the cap member, instead of two pieces. In the other of the substrate stages provided with only one cap holder, any exchange of the cap member is not performed, and the cap member, released from the seal member 30 and held by the one cap holder, is returned to the seal member 30 to be held thereby.

Further, the exposure apparatus EX of the embodiment is provided with a cap-member transport system (transport device) HC which transports, to a predetermined position, at least one of the first and second cap members C1 and C2 released from the first, second, third and fourth cap holders CH1, CH2, CH3 and CH4. The predetermined position to which the first cap member C1 or the second cap member C2 is transported may be defined in the first exposure station ST1 (or the first area SP1) or in the measuring station ST2 (or the second area SP2), or may be defined at the outside of the above-described predetermined area on the base member BP or at the outside of the exposure apparatus EX. In this embodiment, the cap-member transport system HC is arranged at the measuring station ST2. Note that the cap-member transport system HC may be arranged at the exposure station ST1 (or the first area SP1) or the like.

The exposure apparatus EX of this embodiment is a scanning type exposure apparatus (so-called scanning stepper) which projects the image of the pattern of the mask M onto the substrate P while synchronously moving the mask M and the substrate P in a predetermined scanning direction. In this embodiment, a scanning direction (synchronous movement direction) of the substrate P is the Y axis direction, and the scanning direction (synchronous movement direction) of the mask M is also the Y axis direction. The exposure apparatus EX radiates the exposure light EL onto the substrate P via the projection optical system PL and the liquid LQ to expose the substrate P, while moving the substrate P in the Y axis direction with respect to the projection area of the projection optical system PL, and moving the mask M in the Y axis direction with respect to the illumination area of the illumination system IL in synchronization with the movement of the substrate P in the Y axis direction. Accordingly, the image of the pattern of the mask M is projected onto the substrate P.

The exposure apparatus EX is provided with a body 100 including a column 101 which is provided, for example, on the floor in a clean room, and a support frame 102 which is provided on the column 101 via an anti-vibration device 103. The column 101 has a support surface 105 which supports the base member BP via an anti-vibration device 104. The support frame 102 supports the projection optical system PL, the alignment system AL, the focus/leveling system FL, etc. The anti-vibration device 104, which is arranged between the base member BP and the support surface 105, includes an active anti-vibration device provided with a predetermined actuator and a damper mechanism.

At first, the illumination system IL and the projection optical system PL will be explained. The illumination system IL illuminates the predetermined illumination area of the mask M with the exposure light EL having a uniform illuminance distribution. Lights usable as the exposure light EL radiated from the illumination system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used as the exposure light EL.

The projection optical system PL projects the image of the pattern of the mask M onto the substrate P at a predetermined projection magnification. The projection optical system PL has a plurality of optical elements. The optical elements are held by a barrel PK. In this embodiment, the projection optical system PL is of a reduction system having the projection magnification which is, for example, ¼, ⅕, ⅛ or the like. The projection optical system PL may be any one of the 1× magnification system and the magnifying system. In this embodiment, an optical axis AX of the projection optical system PL is parallel to the Z axis direction. The projection optical system PL may be any one of a dioptric system including no catoptric optical element, a catoptric system including no dioptric optical element, and a catadioptric system including dioptric and catoptric optical elements. The projection optical system PL may form any one of the inverted image and the erecting image.

The exposure light EL, radiated from the illumination system IL and passing through the mask M, comes into the projection optical system PL from the object plane side of the projection optical system PL. The projection optical system PL is capable of making the exposure light EL coming from the object plane side to exit from the light exit surface (lower surface) of the first optical element 8 so that the exposure light EL is radiated onto the substrate P.

Next, an explanation will be made about the mask stage 3 and the mask stage-driving system 4. The mask stage 3 has a mask holder which holds the mask M. The mask stage 3 is movable while holding the mask M with the mask holder. The mask stage-driving system 4 includes, for example, an actuator such as a linear motor or a voice coil motor. The mask stage-driving system 4 is capable of moving the mask stage 3 holding the mask M. The operation of the mask stage-driving system 4 is controlled by the controller 7. The mask stage 3 is movable in the X axis, Y axis, and θZ directions by the mask stage-driving system 4 while holding the mask M by the mask holder. The controller 7 is capable of using the mask stage-driving system 4 to move the mask stage 3, to thereby adjust the position of the mask M held by the mask stage 3 in relation to the X axis, Y axis, and θZ directions. In this embodiment, the mask stage 3 is supported by a mask base (not shown) supported independently from the support frame 102 in terms of the vibration.

Figure 2:
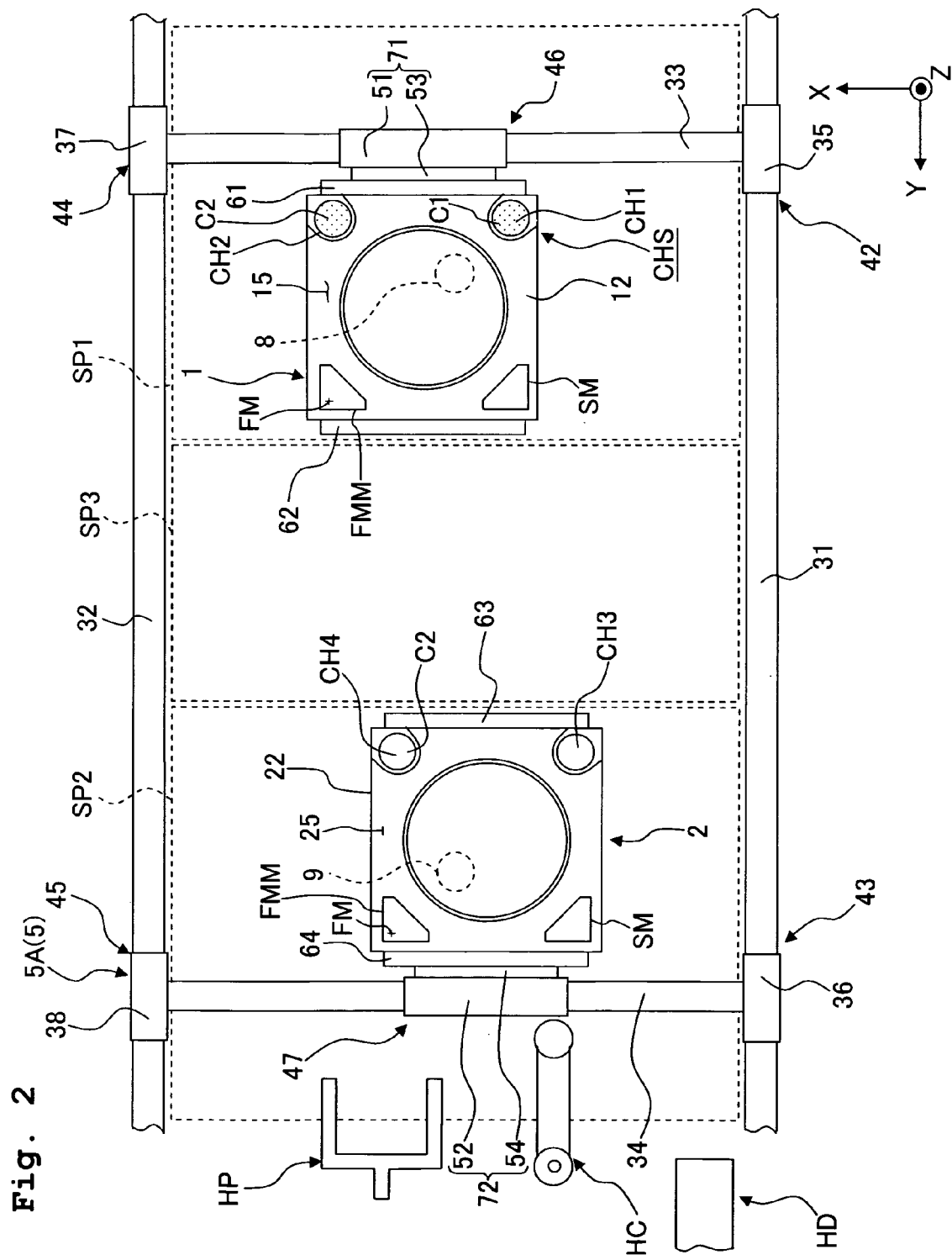
FIG. 2 is a plan view of a first substrate stage and a second substrate stage as seen from an upper position.
Figure 3:
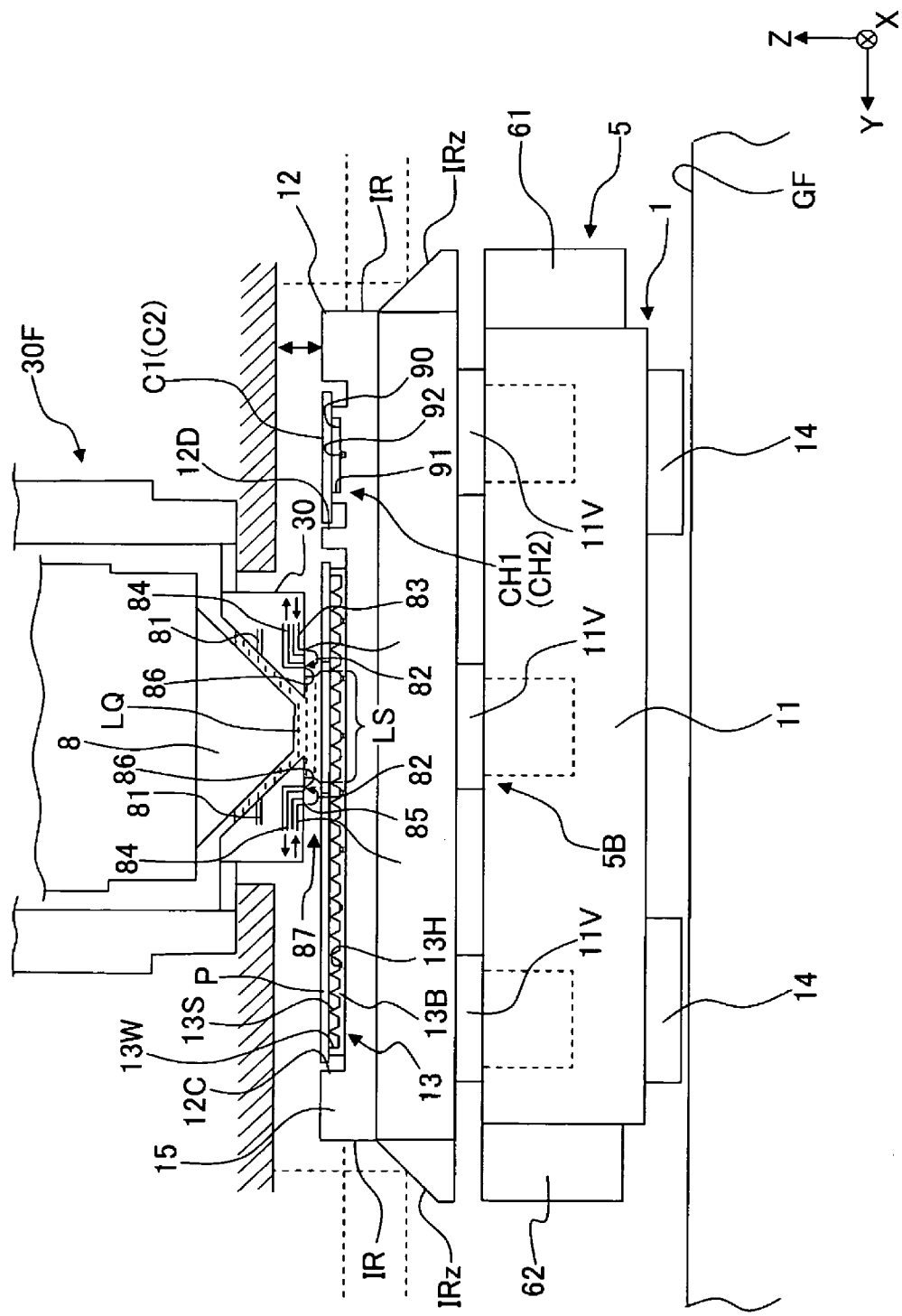
FIG. 3 shows a part of the exposure apparatus according to the first embodiment.

Next, an explanation will be made with reference to FIGS. 1, 2, and 3 about the first and second substrate stages 1, 2 and the substrate stage-driving system 5. FIG. 2 is a plan view of the first and second substrate stages 1, 2 and the substrate stage-driving system 5 as seen from an upper position. FIG. 3 is a magnified view showing the vicinity of the first substrate stage 1.

The first substrate stage 1 has a stage body 11, and a first substrate table 12 supported by the stage body 11 and having a substrate holder 13 which detachably holds the substrate P. The stage body 11 is supported in a non-contact manner by the upper surface (guide surface GF) of the base member BP with, for example, an air bearing 14. The first substrate table 12 has an opposing surface 15 which is capable of being opposite to (opposable to) the seal member 30 and the first optical element 8. The substrate holder 13 is provided at the inside of a recess 12C which is formed at a predetermined position of the opposing surface 15 of the first substrate table 12. At least a part of the area, of the opposing surface 15, around the recess 12C of the first substrate table 12 is substantially flat, and has an approximately same height as that of (is flush with) the surface of the substrate P held by the substrate holder 13.

As shown in FIG. 3, the substrate holder 13 is provided with a base member 13B which has the upper surface capable of being opposite to the lower surface of the substrate P arranged at the inside of the recess 12C; a support portion 13S which is provided on the upper surface of the base member 13B and which is constructed of a plurality of pin-shaped members supporting the lower surface of the substrate P; and a circumferential wall 13W which has the upper surface opposite to the lower surface of the substrate P and which is provided to surround the support portion 13S. A suction port 13H, which is connected to an unillustrated vacuum system, is provided on the upper surface of the base member 13B. The controller 7 drives the vacuum system to suck, via the suction port 13H, a gas present in a space formed by the upper surface of the base member 13B, the circumferential wall 13W and the lower surface of the substrate P supported by the support portion 13S to negatively pressurize the space. By doing so, the controller 7 holds the lower surface of the substrate P so as to attract the lower surface to the support portion 13S. Namely, the substrate holder 13 of this embodiment includes a so-called pin chuck mechanism. The controller 7 can release or stop the suction operation, performed by the aid of the suction port 13H, to thereby separate or release the substrate P from the substrate holder 13. In this way, the substrate holder 13 releasably holds the substrate P.

The second substrate stage 2 has the same construction as that of the first substrate stage 1. The second substrate stage 2 has a stage body 21, and a second substrate table 22 supported by the stage body 21 and having a substrate holder 23 which detachably holds the substrate P. The stage body 21 is supported in a non-contact manner by the upper surface (guide surface GF) of the base member BP, for example, with an air bearing 24. The second substrate table 22 has an opposing surface 25 which is capable of being opposite to (opposable to) the seal member 30 and the first optical element 8. The substrate holder 23 is provided at the inside of a recess 22C which is formed at a predetermined position of the opposing surface 25 of the second substrate table 22. At least a part of the area, of the opposing surface 25, around the recess 22C of the second substrate table 22 is substantially flat, and has an approximately same height as that of (is flush with) the surface of the substrate P held by the substrate holder 23.

The substrate holder 23 is constructed in a same manner as the substrate holder 13. The substrate holder 23 includes the pin chuck mechanism and releasably holds the substrate P.

As shown in FIG. 2, reference members FMM each having a reference mark FM formed therein and measuring members SM each having a transmission portion (window) required for various types of measurement formed therein are provided on the opposing surfaces 15, 25 of the first substrate stage 1 and the second substrate stage 2 respectively. The reference marks FM are used to perform detection, by an unillustrated mask alignment system, of the positional relationship with respect to the mark formed on the mask. Further, the reference marks FM are used to perform determination by the alignment system AL of the positions of alignment marks formed in the shot areas, respectively, of the substrate P on the substrate stage 1, 2 (or to perform determination of the reference marks FM with respect to the alignment marks) as described later on. An unillustrated optical sensor is provided under or below the measuring member SM. Those usable as the optical sensor include an optical sensor for constructing at least a part of a spatial image measuring system as disclosed, for example, in United States Patent Application Publication No. 2002/0041377, etc. Alternatively, the optical sensor may be an optical sensor capable of measuring the intensity (transmittance) of the exposure light EL as disclosed, for example, in United States Patent Application Publication No. 2007/0127006 and European Patent Application Publication No. 1791164, etc. Various types of detectors or measuring devices, which include an uneven illuminance measuring device, a illuminance meter, a wave aberration measuring device and the like, may be arranged under or below the measuring member SM instead of the optical sensor or together with the optical sensor. The light beam (light) is transmitted through the transmission portion provided for the measuring member SM, and the light beam comes into the optical sensor or the measuring device.

The substrate stage-driving system 5 includes an actuator such as a linear motor or a voice coil motor. The substrate stage-driving system 5 is capable of moving each of the first substrate stage 1 and the second substrate stage 2. The operation of the substrate stage-driving system 5 is controlled by the controller 7.

The first substrate stage 1 is movable by the substrate stage-driving system 5 in the directions of six degrees of freedom of the X axis, Y axis, Z axis, θX, θY, and θZ directions on the base member BP while holding the substrate P with the substrate holder 13. The controller 7 uses the substrate stage-driving system 5 to move the first substrate stage 1, thereby making it possible to adjust the position of the substrate P held by the first substrate stage 1 in relation to the X axis, Y axis, Z axis, θX, θY, and θZ directions.

The second substrate stage 2 is movable by the substrate stage-driving system 5 in the directions of six degrees of freedom of the X axis, Y axis, Z axis, θX, θY, and θZ directions on the base member BP while holding the substrate P with the substrate holder 23. The controller 7 uses the substrate stage-driving system 5 to move the second substrate stage 2, thereby making it possible to adjust the position of the substrate P held by the second substrate stage 2 in relation to the X axis, Y axis, Z axis, θX, θY, and θZ directions.

The substrate stage-driving system 5 is provided with a coarse movement system 5A which moves each of the stage bodies 11, 21 on the base member BP, and a fine movement system 5B which moves the substrate tables 11, 22 on the stage bodies 11, 21 respectively.

The coarse movement system 5A includes, for example, an actuator such as a linear motor, and is capable of moving each of the stage bodies 11, 21 on the base member BP in the X axis, Y axis, and θZ directions. When each of the stage bodies 11, 21 is moved in the X axis, Y axis, and θZ directions by the coarse movement system 5A, then the substrate tables 12, 22, provided on the stage bodies 11, 21 respectively, are also moved in the X axis, Y axis, and θZ directions together with the stage bodies 11, 21 respectively.

With reference to FIG. 2, the coarse movement system 5A, which moves the first substrate stage 1 and the second substrate stage 2, is provided with a plurality of linear motors 42, 43, 44, 45, 46, 47. The coarse movement system 5A is provided with a pair of Y axis guide members 31, 32 extending in the Y axis direction. The Y axis guide members 31, 32 are provided with magnet units each having a plurality of permanent magnets respectively. The Y axis guide member 31, as one of Y axis guide members 31, 32, supports two slide members 35, 36 movably in the Y axis direction. The Y axis guide member 32, as the other of Y axis guide members 31, 32, supports two slide members 37, 38 movably in the Y axis direction. Each of the slide members 35, 36, 37, 38 is provided with a coil unit having an armature coil. That is, in this embodiment, Y axis linear motors 42, 43, 44, 45 of the moving coil type are formed by the slide members 35, 36, 37, 38 having the coil units and the Y axis guide members 31, 32 having the magnet units.

Further, the coarse movement system 5A is provided with a pair of X axis guide members 33, 34 extending in the X axis direction. The X axis guide members 33, 34 are provided with coil units having armature coils respectively. The X axis guide member 33, as one of the X axis guide members 33, 34, supports a slide member 51 movably in the X axis direction. The X axis guide member 34, as the other of the X axis guide members 33, 34, supports a slide member 52 movably in the X axis direction. Each of the slide members 51, 52 is provided with a magnet unit having a plurality of permanent magnets. With reference to FIG. 2, the slide member 51 is connected to the stage body 11 of the first substrate stage 1, and the slide member 52 is connected to the stage body 21 of the second substrate stage 2. That is, in this embodiment, an X axis linear motor 46 of the moving magnet type is formed by the slide member 51 having the magnet unit and the X axis guide member 33 having the coil unit. Similarly, an X axis linear motor 47 of the moving magnet type is formed by the slide member 52 having the magnet unit and the X axis guide member 34 having the coil unit. With reference to FIG. 2, the first substrate stage 1 (stage body 11) is moved in the X axis direction by the X axis linear motor 46, and the second substrate stage 2 (stage body 21) is moved in the X axis direction by the X axis linear motor 47.

The slide members 35, 37 are fixed to one end and the other end of the X axis guide member 33 respectively; and the slide members 36, 38 are fixed to one end and the other end of the X axis guide member 34 respectively. Therefore, X axis guide member 33 is movable in the Y axis direction by the Y axis linear motors 42, 44; and the X axis guide member 34 is movable in the Y axis direction by the Y axis linear motors 43, 45. With reference to FIG. 2, the first substrate stage 1 (stage body 11) is moved in the Y axis direction by the Y axis linear motors 42, 44, and the second substrate stage 2 (stage body 21) is moved in the Y axis direction by the Y axis linear motors 43, 45.

The position of the first substrate stage 1 in the θZ direction can be controlled by making the thrust forces generated by the pair of Y axis linear motors 42, 44 respectively to be slightly different between the Y axis linear motors 42, 44; and the position of the second substrate stage 2 in the θZ direction can be controlled by making the thrust forces generated by the pair of between the Y axis linear motors 43, 45 respectively to be slightly different between Y axis linear motors 43, 45.

As shown in FIG. 1, the fine movement system 5B includes actuators 11V, 21V such as voice coil motors which are intervened between the stage bodies 11, 21 and the substrate tables 12, 22 respectively; and unillustrated measuring devices (for example, encoder systems) which measure the driving amounts of the actuators respectively. The fine movement system 5B is capable of moving the substrate tables 12, 22 on the stage bodies 11, 21 respectively at least in the Z axis, θX, and θY directions. Further, the fine movement system 5B is capable of moving (finely moving) the substrate tables 12, 22 on the stage bodies 11, 21 respectively in the X axis, Y axis, and θZ directions.

As described above, the driving system 5, which includes the coarse movement system 5A and the fine movement system 5B, is capable of moving each of the first substrate table 12 and the second substrate table 22 in the directions of six degrees of freedom of the X axis, Y axis, Z axis, θX, θY, and θZ directions.

The first substrate stage 1 (stage body 11) and the second substrate stage 2 (stage body 21) are releasably connected to the slide members 51, 52 via joint members respectively, as disclosed, for example, in Published Japanese Translation of PCT International Publication for Patent Application No. 2000-505958 (corresponding to U.S. Pat. No. 5,969,441), Published Japanese Translation of PCT International Publication for Patent Application No. 2000-511704 (corresponding to U.S. Pat. No. 5,815,246), Japanese Patent Application Laid-open No. 2001-223159 (corresponding to U.S. Pat. No. 6,498,350), and the like.

As shown in FIGS. 1 and 2, the first substrate stage 1 is provided with a first joint member 61 which is provided on a side surface of the stage body 11 on the −Y side, and a second joint member 62 which is provided on a side surface on the +Y side of the stage body 11. Similarly, the second substrate stage 2 is provided with a third joint member 63 which is provided on a side surface of the stage body 21 on the −Y side, and a fourth joint member 64 which is provided on a side surface on the +Y side of the stage body 21.

On the other hand, the substrate stage-driving system 5 is provided with a joint member 53 which is provided for the slide member 51, and a joint member 54 which is provided for the slide member 52. The joint member 53 is provided on the side surface of the slide member 51 on the +Y side so that the joint member 53 is directed or oriented toward the measuring station ST2 (toward the +Y side). The joint member 54 is provided on the side surface of the slide member 52 on the −Y side so that the joint member 54 is directed toward the exposure station ST1 (toward the −Y side).

The joint member 53 is releasably connected to the slide member 51 as described later on, and the slide member 51 and the joint member 53 are movable together. Further, the joint member 54 is releasably connected to the slide member 52 as described later on, and the slide member 52 and the joint member 54 are movable together. Therefore, the linear motors 42, 44, 46 are capable of moving the slide member 51 and the joint member 53 together, and the linear motors 43, 45, 47 are capable of moving the slide member 52 and the joint member 54 together.

The first joint member 61 of the stage body 11 and the third joint member 63 of the stage body 21 are successively connected releasably to the joint member 53 provided for the slide member 51. The second joint member 62 of the stage body 11 and the fourth joint member 64 of the stage body 21 are successively connected releasably to the joint member 54 provided for the slide member 52.

Namely, the stage body 11 of the first substrate stage 1 and the stage body 21 of the second substrate stage 2 are successively connected releasably to the joint member 53 provided for the slide member 51 via the first joint member 61 and the third joint member 63 respectively; and the stage body 11 of the first substrate stage 1 and the stage body 21 of the second substrate stage 2 are successively connected releasably to the joint member 54 provided for the slide member 52 via the second joint member 62 and the fourth joint member 64 respectively.

In the following description, the joint member 53 to which the stage body 11 of the first substrate stage 1 and the stage body 21 of the second substrate stage 2 are successively connected releasably and the slide member 51 which is fixed to the joint member 53 are appropriately referred to as "first connecting member 71" in combination. Further, the joint member 54 to which the stage body 11 of the first substrate stage 1 and the stage body 21 of the second substrate stage 2 are successively connected releasably and the slide member 52 which is fixed to the joint member 54 are appropriately referred to as "second connecting member 72" in combination.

Therefore, the linear motors 42, 44, 46 are capable of moving the first connecting member 71, and the linear motors 43, 45, 47 are capable of moving the second connecting member 72.

The controller 7 executes, on the base member BP, the release of the connection between the first connecting member 71 and the first substrate stage 1 (or the second substrate stage 2) and the release of the connection between the second connecting member 72 and the second substrate stage 2 (or the first substrate stage 1), as well as executes the connection between the first connecting member 71 and the second substrate stage 2 (or the first substrate stage 1) and the connection between the second connecting member 72 and the first substrate stage 1 (or the second substrate stage 2), at a predetermined timing. That is, the controller 7 executes the exchange operation for the first connecting member 71 and the second connecting member 72 with respect to the first substrate stage 1 and the second substrate stage 2 at the predetermined timing. In this embodiment, as an example, the exchange operation for the first connecting member 71 and the second connecting member 72 with respect to the first substrate stage 1 and the second substrate stage 2 is executed in the third area SP3 on the base member BP.

The first connecting member 71 is alternately connected to the first joint member 61 of the stage body 11 and the third joint member 63 of the stage body 21. The second connecting member 72 is alternately connected to the second joint member 62 of the stage body 11 and the fourth joint member 64 of the stage body 21. That is, the first connecting member 71 is alternately connected to the stage body 11 of the first substrate stage 1 and the stage body 21 of the second substrate stage 2 via the first joint member 61 and the third joint member 63 respectively; and the second connecting member 72 is alternately connected to the stage body 11 of the first substrate stage 1 and the stage body 21 of the second substrate stage 2 via the second joint member 62 and the fourth joint member 64 respectively.

The first connecting member 71 moves of one of the first substrate stage 1 and the second substrate stage 2, to which the first connecting member 71 is connected, by the driving of the linear motors 42, 44, 46; and the second connecting member 72 moves the other of the first and second substrate stages 1, 2, to which the second connecting member 72 is connected, by the driving of the linear motors 43, 45, 47. The first substrate stage 1, which is connected to at least one of the first connecting member 71 and the second connecting member 72, is movable by the substrate stage-driving system 5 while holding the substrate P in the predetermined area on the base member BP including the first area SP1, the second area SP2, and the third area SP3. Similarly, the second substrate stage 2, which is connected to at least one of the first connecting member 71 and the second connecting member 72, is movable by the substrate stage-driving system 5 while holding the substrate P, independently from the first substrate stage 1, in the predetermined area on the base member BP including the first area SP1, the second area SP2, and the third area SP3.

Next, an explanation will be made with reference to FIG. 1 about an example of the measuring system 6 which measures the position information about the mask stage 3, the first substrate stage 1, and the second substrate stage 2.

The measuring system 6 has a laser interferometer 6M which is capable of radiating a measuring light (measuring beam) for the position measurement onto a measuring mirror 3R provided on the mask stage 3. Although detailed illustration is omitted, the measuring mirror 3R has a reflecting surface which is substantially parallel to the YZ plane and a reflecting surface which is substantially parallel to the XZ plane. The laser interferometer 6M radiates a measuring light having the measuring axis of the X axis and a measuring light having a measuring axis of the Y axis onto the reflecting surfaces of the measuring mirror 3R, respectively. The measuring system 6 is capable of measuring the position information about the mask stage 3 by radiating the measuring lights from the laser interferometer 6M onto the measuring mirror 3R. In this embodiment, the measuring system 6 is capable of measuring the position information about the mask stage 3 in relation to the X axis, Y axis, and θZ directions by using the measuring mirror 3R provided on the mask stage 3.

The controller 7 drives the mask stage-driving system 4 based on the measurement result of the measuring system 6 including the laser interferometer 6M to control the position of the mask M held by the mask stage 3.

The measuring system 6 further includes laser interferometers 6P capable of radiating measuring lights for the position measurement onto a measuring mirror 1R which is provided on the first substrate table 12 of the first substrate stage 1 and onto a measuring mirror 2R which is provided on the second substrate table 22 of the second substrate stage 2 respectively. The laser interferometers 6P are provided for the exposure station ST1 and the measuring station ST2 respectively. Although detailed illustration is omitted, each of the measuring mirrors 1R, 2R has a reflecting surface which is substantially parallel to the YZ plane and a reflecting surface which is substantially parallel to the XZ plane. Each of the laser interferometers 6P radiates a measuring light having the measuring axis of the X axis and a measuring light having the measuring axis of the Y axis onto the reflecting surfaces of one of the measuring mirrors 1R, 2R.

In this embodiment, the measuring system 6 further includes laser interferometers (Z interferometers) 6Pz capable of measuring the position information in the Z axis direction about the first and second substrate tables 12, 22 as disclosed, for example, in Japanese Patent Application Laid-open No. 2000-323404 (corresponding to U.S. Pat. No. 7,206,058), Published Japanese Translation of PCT International Publication for Patent Application No. 2001-513267 (corresponding to U.S. Pat. No. 6,208,407), and the like. The laser interferometers 6Pz are provided for the exposure station ST1 and the measuring station ST2 respectively. Measuring mirrors 1Rz, 2Rz, having reflecting surfaces which are directed obliquely upwardly and onto which the measuring lights are irradiated from the laser interferometers 6Pz, are arranged on the first and second substrate tables 12, 22 respectively. The laser interferometers 6Pz radiate the measuring lights having the measuring axis of the Z axis onto the respective reflecting surfaces of the measuring mirrors 1Rz, 2Rz.

The laser interferometers 6P, 6Pz, which are provided for the exposure station ST1, measure the position information about the first substrate table 12 (or the second substrate table 22) existing in the exposure station ST1. The laser interferometers 6P, 6Pz, which are provided for the measuring station ST2, measure the position information about the second substrate table 22 (or the first substrate table 12) existing in the measuring station ST2.

The measuring system 6 can radiate the measuring lights from the laser interferometers 6P, 6Pz onto the measuring mirrors 1R, 2R, 1Rz, 2Rz to measure the position informations about the first substrate stage 1 and the second substrate stage 2 respectively. In this embodiment, the measuring system 6 is capable of measuring the position information in relation to the directions of six degrees of freedom of the X axis, Y axis, Z axis, θX, θY, and θZ directions of the first substrate table 12 by using the measuring mirrors 1R, 1Rz provided on the first substrate table 12. Further, the measuring system 6 is capable of measuring the position information in relation to the directions of six degrees of freedom of the X axis, Y axis, Z axis, θX, θY, and θZ directions of the second substrate table 22 by using the measuring mirrors 2R, 2Rz provided on the second substrate table 22.

The controller 7 drives the substrate stage-driving system 5 based on the measurement result of the measuring system 6 including the laser interferometers 6P, 6Pz to control the positions of the substrate P held by the first substrate stage 1 and the substrate P held by the second substrate stage 2.

The measuring system 6 further includes the alignment system AL including the second optical element 9 and the focus/leveling-detecting system FL. The alignment system AL is arranged in the measuring station ST2, and is capable of detecting the alignment mark of the substrate P and the reference mark FM (see FIG. 2) arranged on each of the opposing surfaces 15, 25 of the first and second substrate tables 12, 22. The focus/leveling-detecting system FL is arranged in the measuring station ST2, and detects the surface position information about the surface of the substrates P held by the first and second substrate tables 12, 22 (position information in relation to the Z axis, θX, and θY directions). The focus/leveling-detecting system FL alternately detects, in the measuring station ST2, the surface position information about the surface of the substrate P held by the first substrate table 12 and the surface position information about the surface of the substrate P held by the second substrate table 22.

Next, the seal member 30 will be explained with reference to FIG. 3. As described above, the seal member 30 of this embodiment includes the seal member as disclosed, for example, in Japanese Patent Application Laid-open Nos. 2004-289126 and 2004-289128, and the like, and is provided with a flow passage 81 supplying and recovering the liquid LQ with respect to the optical path space for the exposure light EL. Those connected to the flow passage 81 include a liquid supply device (not shown) which supplies the liquid LQ to the optical path space for the exposure light EL via the flow passage 81, and a liquid recovery device (not shown) which recovers the liquid LQ. The liquid supply device is capable of supplying the liquid LQ for forming the liquid immersion space LS to the optical path space for the exposure light EL via the flow passage 81. The liquid recovery device is capable of recovering the liquid LQ in the liquid immersion space LS via the flow passage 81. The liquid supply device is provided with, for example, a liquid supply section which is capable of feeding the liquid LQ, a supply tube which has one end connected to the liquid supply section, a tank which accommodates the liquid LQ, a filter, a pressurizing pump and the like. The liquid recovery device is provided with, for example, a liquid recovery section which is capable of recovering the liquid LQ, a recovery tube which has one end connected to the liquid recovery section, a tank which accommodates the liquid LQ, a filter, a suction pump and the like. It is not necessarily indispensable that the exposure apparatus EX is provided with all of the liquid supply device and the liquid recovery device as well as the tank, the filter, the pump and the like constructing the liquid supply and recovery devices. As a part or all of these components, an equipment of the factory or the like in which the exposure apparatus EX is installed may be used instead.

The seal member 30 of this embodiment is provided with a gas inlet port 83 and a gas outlet port 84 which form a gas seal 82 for confining the liquid LQ between the lower surface of the seal member 30 and the surface of the object (surface of the substrate P in FIG. 3) opposite to or facing the lower surface of the seal member 30. Those formed on the lower surface of the seal member 30 include a first groove 85 which is connected to the gas inlet port 83 and which is formed to have an annular form to surround the optical path space for the exposure light EL, and a second groove 86 which is connected to the gas outlet port 84 and which is formed to have an annular form to surround the optical path space for the exposure light EL. The first groove 85 is formed at the outside of the second groove 86 with respect to the optical path space for the exposure light EL.

The seal member 30 of this embodiment is capable of forming a gas bearing 87 between the lower surface of the seal member 30 and the surface of the object (surface of the substrate P in FIG. 3) facing the lower surface of the seal member 30. The controller 7 is capable of forming the gas bearing 87 between the lower surface of the seal member 30 and the surface of the object (surface of the substrate P) opposite to the lower surface of the seal member 30 by gas introducing (supplying) operation via the gas inlet port 83 and gas discharging (sucking) operation via the gas outlet port 84. The gas bearing 87 of the pressurizing vacuum type is formed between the lower surface of the seal member 30 and the surface of the object (surface of the substrate P). A gap (of, for example, 0.1 to 1.0 mm) is maintained by the gas bearing 87 between the lower surface of the seal member 30 and the surface of the object (surface of the substrate P).

The seal member 30 is supported by the support frame 102 via a support mechanism 30F. The support mechanism 30F includes, for example, a spring member, an elastic member such as a flexure, or a flexible member, and supports the seal member 30 flexibly (swingably). The gas bearing 87 is formed between the lower surface of the seal member 30 and the surface of the object (surface of the substrate P), and the seal member 30 is flexibly supported by the support mechanism 30F. Therefore, even when the position and the posture of the object (substrate P) opposite to the lower surface of the seal member 30 are changed, the position and the posture of the seal member 30 are changed to follow the change of the position and the posture of the object (substrate P). Therefore, even when the position and the posture of the object (substrate P) are changed, the gap is maintained between the lower surface of the seal member 30 and the surface of the object (substrate P).

Next, the first and second cap members C1 and C2 will be explained. The first and second cap members C1 and C2 are members which are capable of holding or retaining the liquid LQ between the first optical element 8 and the first and second cap members C1 and C2 as disclosed, for example, in Japanese Patent Application Laid-open No. 2004-289128. The first cap members C1 and C2 are formed to be in approximately same size and shape. The first and second cap members C1 and C2 are formed in conformity with the size and the shape of the liquid immersion space LS formed by the seal member 30. In this embodiment, the first and second cap members C1 and C2 are each a member which has approximately the same thickness as that of the substrate P and which is substantially circular and plate-shaped in the XY plane. A surface (upper surface) of each of the first and second cap members C1 and C2 is liquid-repellent with respect to the liquid LQ. At least a surface of each of the first and second cap members C1 and C2 which makes contact with the liquid LQ may be liquid-repellent. However, the other surface opposite to the surface, of each of the first and second cap members C1 and C2, may also be liquid-repellent. In this embodiment, each of the first and second cap members C1 and C2 is formed of a liquid-repellent material such as fluorine-based resin materials including polytetrafluoroethylene. Alternatively, the first and second cap members C1 and C2 may be formed of a predetermined metal such as stainless steel or titanium, and the surface thereof may be coated with a liquid-repellent material. The first and second cap members C1 and C2 are capable of retaining the liquid LQ between the first optical element 8 and the first and second cap members C1 and C2 by being arranged at a position opposite to the light exit surface of the first optical element 8.

Next, an explanation will be given about the first, second, third and fourth cap holders CH1, CH2, CH3 and CH4. As shown in FIG. 2, the exposure apparatus EX of this embodiment is provided with the first cap holder CH1 which is provided at the first position of the first substrate table 12 of the first substrate stage 1 and which releasably holds the first and second cap members C1, C2; the second cap holder CH2 which is provided at the second position of the first substrate table 12 and which releasably holds the first and second cap members C1, C2; the third cap holder CH3 which is provided at the third position of the second substrate table 22 of the second substrate stage 2 and which releasably holds the first and second cap members C1, C2; and the fourth cap holder CH4 which is provided at the fourth position of the second substrate table 22 of the second substrate stage 2 and which releasably holds the first and second cap members C1, C2.

In this embodiment, the first substrate stage 1 which includes the stage body 11 and the first substrate table 12 and the second substrate stage 2 which includes the stage body 21 and the second substrate table 22 have approximately the same shape and the same size. The first and second cap holders CH1, CH2 and the third and fourth cap holders CH3, CH4 are provided at approximately identical positions on the first and second substrate tables 12, 22 respectively. In this embodiment, each of the first and second substrate tables 12, 22 of the first and second substrate stages 1, 2 is substantially rectangular in the XY plane; and four corners are provided for each of the opposing surfaces 15, 25 of the first and second substrate tables 12, 22. The first cap holder CH1 is arranged at a corner (first position), among the four corners, which is disposed on the −X side and the −Y side of the opposing surface 15 of the first substrate table 12; and the second cap holder CH2 is arranged at a corner (second position), among the four corners, which is disposed on the +X side and the −Y side of the opposing surface 15 of the first substrate table 12. The third cap holder CH3 is arranged at a corner (third position), among the four corners, which is disposed on the −X side and the −Y side of the opposing surface 25 of the second substrate table 22; and the fourth cap holder CH4 is arranged at a corner (fourth position), among the four corners, which is disposed on the +X side and the −Y side of the opposing surface 25 of the second substrate table 22.

As shown in FIG. 3, the first cap holder CH1 is provided at the inside of a recess 12D which is formed at the first position of the opposing surface 15 of the first substrate table 12. An upper surface 90, which is capable of being opposite to the lower surface of the first cap member C1 arranged inside the recess 12D, is provided at the inside of the recess 12D. A circumferential wall 91, which has an upper surface opposite to the circumferential edge area of the lower surface of the first cap member C1, is provided on the upper surface 90. A suction port 92, which is connected to an unillustrated vacuum system, is provided on the upper surface 90. The controller 7 drives the vacuum system to suck, via the suction port 92, a gas in the space formed by the upper surface 90, the circumferential wall 91, and the lower surface of the first cap member C1 supported by the circumferential wall 91, thereby negatively pressurizing the space and thus holding the lower surface of the first cap member C1 by suction-attraction. That is, the first cap holder CH1 of this embodiment includes a so-called vacuum chuck mechanism. The controller 7 can separate the first cap member C1 away from the upper surface 90 (circumferential wall 91) of the first cap holder CH1 by stopping or releasing the sucking operation having been performed via the suction port 92. As described above, the first cap holder CH1 releasably holds the lower surface of the first cap member C1 opposite to the first cap holder CH1.

Further, the first cap holder CH1 and the second cap holder CH2 are formed to be in approximately same size and shame shape, and the first cap holder CH1 can releasably hold the lower surface of the second cap member C2 also.

The second cap holder CH2 has a construction same as that of the first cap holder CH1, and is provided at the inside of a recess 12D formed at the second position in the opposing surface 15 of the first substrate table 12. The second cap holder CH2 also releasably holds the lower surfaces of the first cap member C1 and the second cap member C2 opposite to or facing the second cap holder CH2.

The third cap holder CH3 and the fourth cap holder CH4 are also formed to be have a construction same as those of first and second cap holders CH1 and CH2, and are provided inside recesses formed at the third and fourth positions in the opposing surface 25 of the second substrate table 22, respectively. The third and fourth cap holders CH3 and CH4 releasably hold the lower surfaces of the first and second cap members C1 and C2 which are opposite to or facing the third and fourth cap holders CH3 and CH4.

The opposing surface 15 of the first substrate table 12 is arranged around the upper surfaces of the first cap member C1 and the second cap member C2 held by the first cap holder CH1 and the second cap holder CH2; and the upper surfaces of the first cap member C1 and the second cap member C2 held by the first cap holder CH1 and the second cap holder CH2 are substantially flush with at least a part of the opposing surface 15 of the first substrate table 12. Similarly, the opposing surface 25 of the second substrate table 22 is arranged around the upper surfaces of the first cap member C1 and the second cap member C2 held by the third cap holder CH3 and the fourth cap holder CH4; and the upper surfaces of the first and second cap members C1 and C2 held by the third cap holder CH3 and the fourth cap holder CH4 are substantially flush with at least a part of the opposing surface 25 of the second substrate table 22.

In this embodiment, the exposure apparatus EX releases the first cap member C1 (or the second cap member C2), held by the seal member 30, from the seal member 30 and exposes the substrate P held by the first substrate stage 1 (the first substrate table 12) in a state that the first cap member C1 (or the second cap member C2) is held by either one of the first and second cap holders CH1 and CH2. Namely, during the exposure of the substrate P held by the first substrate stage 1 (the first substrate table 12), at least one of the first and second cap holders CH1 and CH2 holds the first cap member C1 (or the second cap member C2) which has been released from the seal member 30.

Similarly, the exposure apparatus EX releases the first cap member C1 (or the second cap member C2), held by the seal member 30, from the seal member 30 and exposes the substrate P held by the second substrate stage 2 (second substrate table 22) in a state that the first cap member C1 (or second cap member C2) is held by either one of the third and fourth cap holders CH3 and CH4. Namely, during the exposure of the substrate P held by the second substrate stage 2 (the second substrate table 22), at least one of the third and fourth cap holders CH3 and CH4 holds the first cap member C1 (or the second cap member C2) which has been released from the seal member 30.

In this embodiment, the seal member 30 can releasably hold at least one of the first and second cap members C1 and C2 so that at least one of the first and second cap members C1 and C2 is arranged at the position opposite to or facing the light exit surface of the first optical element 8. The seal member 30 holds at least one of the first and second cap members C1 and C2 so that at least one of the first and second cap members C1 and C2 is arranged at the position opposite to or facing the light exit surface of the first optical element 8 when each of the first substrate stage 1 and the second substrate stage 2 is away (apart) from the first optical element 8.

That is, even when the first substrate stage 1 and the second substrate stage 2 are away from the first optical element 8, one of the first and second cap members C1 and C2 is not away from the position under or below the first optical element 8. Accordingly, the liquid LQ is not separated and away from the first optical element 8.

As described above, the seal member 30 of this embodiment is capable of forming the gas bearing 87 between the seal member 30 and the surface of the object arranged at the position opposite to or facing the lower surface of the seal member 30. The seal member 30 can hold the first cap member C1 (or the second cap member C2) in the state that the predetermined gap is maintained between the lower surface of the seal member 30 and the upper surface of the first cap member C1 (or the second cap member C2) by utilizing the attracting action generated by forming the gas bearing 87 between the seal member 30 and the first cap member C1 (or the second cap member C2). The seal member 30 releasably holds the upper surface, of the first cap member C1 (or the second cap member C2), opposite to or facing the seal member 30.

Figure 4:
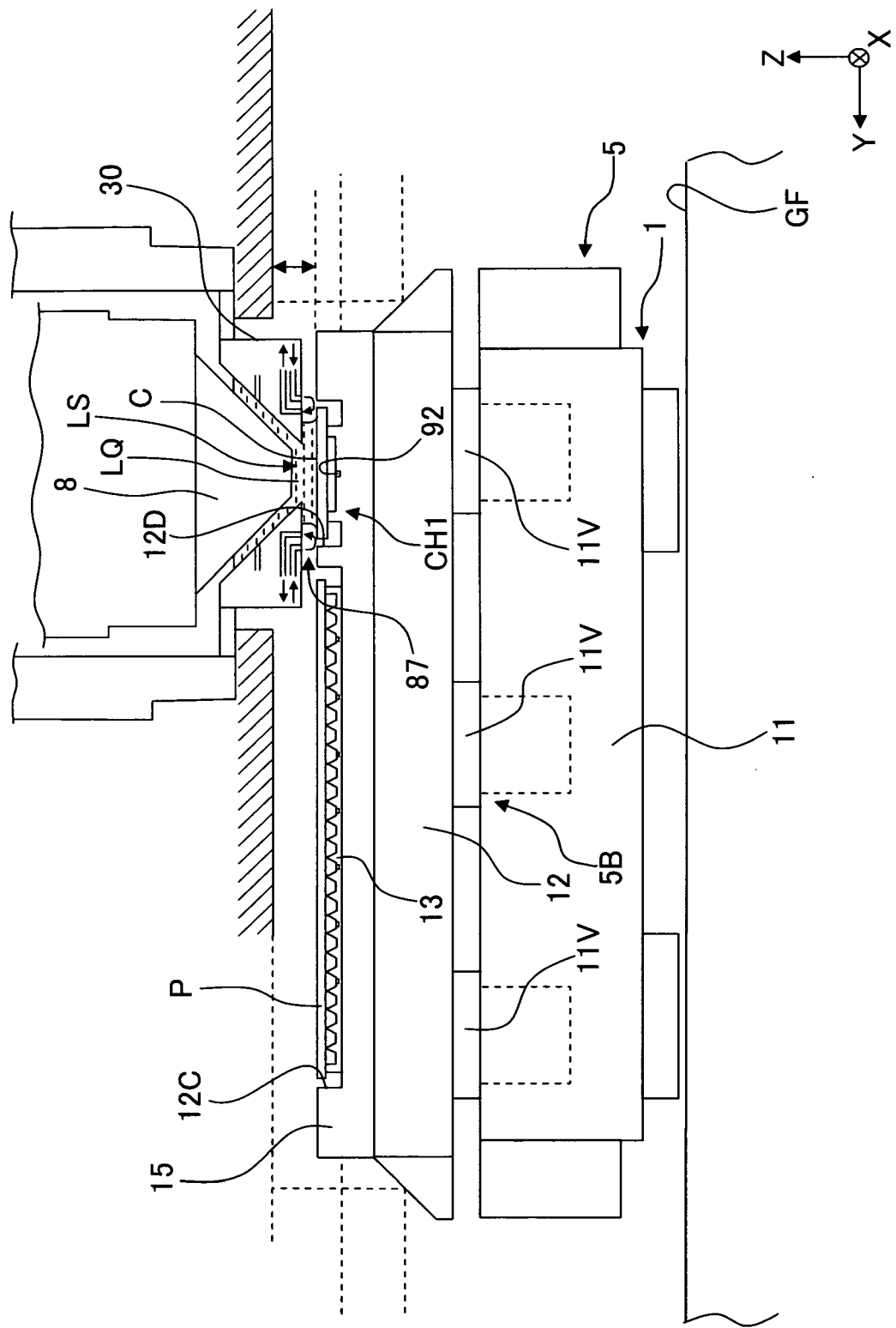
FIG. 4 illustrates an example of the operation of the exposure apparatus according to the first embodiment.

Next, an explanation will be made with reference to FIGS. 4 and 5 about an example of the operation of the first cap member C1. For example, when the first cap member C1, held by the first cap holder CH1, is to be held by the seal member 30, the controller 7 controls the substrate stage-driving system 5 in the state that the liquid immersion space LS is formed between the first optical element 8 and the seal member 30 and the first substrate stage 1 (including the substrate P), so that as shown in FIG. 4 the first substrate stage 1 is moved in the XY directions with respect to the first optical element 8 and the seal member 30, thereby making the light exit surface of the first optical element 8 and the lower surface of the seal member 30 to be opposite to or face the upper surface of the first cap member C1 held by the first cap holder CH1. By doing so, the liquid immersion space LS is formed between the first optical element 8 and the seal member 30 and the upper surface of the first cap member C1. The gas bearing 87 is formed between the lower surface of the seal member 30 and the upper surface of the first cap member C1.

In this situation, the position information about the first substrate table 12 is measured by the measuring system 6. The controller 7 controls the substrate stage-driving system 5 based on the measurement result of the measuring system 6 to thereby make it possible to arrange, at a desired position, the first cap member C1 held by the first cap holder CH1 of the first substrate table 12 with respect to the seal member 30.

The upper surface of the first cap member C1 held by the first cap holder CH1, the upper surface of the substrate P held by the substrate holder 13 of the first substrate table 12, and the opposing surface 15 of the first substrate table 12 are substantially flush with one another. Further, the gap formed between the side surface of the substrate P held by the substrate holder 13 and the inner side surface of the recess 12C and the gap formed between the side surface of the first cap member C1 held by the first cap holder CH1 and the inner side surface of the recess 12D are small, which are, for example, about 0.1 to 1 mm. Therefore, the controller 7 can smoothly move the liquid immersion space LS on the first substrate table 12 while suppressing the inflow of the liquid LQ into the inside of the first substrate table 12.

Subsequently, the controller 7 stops the holding of the first cap member C1 having been effected with the first cap holder CH1. Accordingly, the first cap holder CH1 can release the first cap member C1. The gas bearing 87 is formed between the lower surface of the seal member 30 and the upper surface of the first cap member C1. The seal member 30 holds the first cap member C1 in the state that the predetermined gap is maintained between the lower surface of the seal member 30 and the upper surface of the first cap member C1 by utilizing the sucking action generated by forming the gas bearing 87 between the seal member 30 and the first cap member C1.

Figure 5:
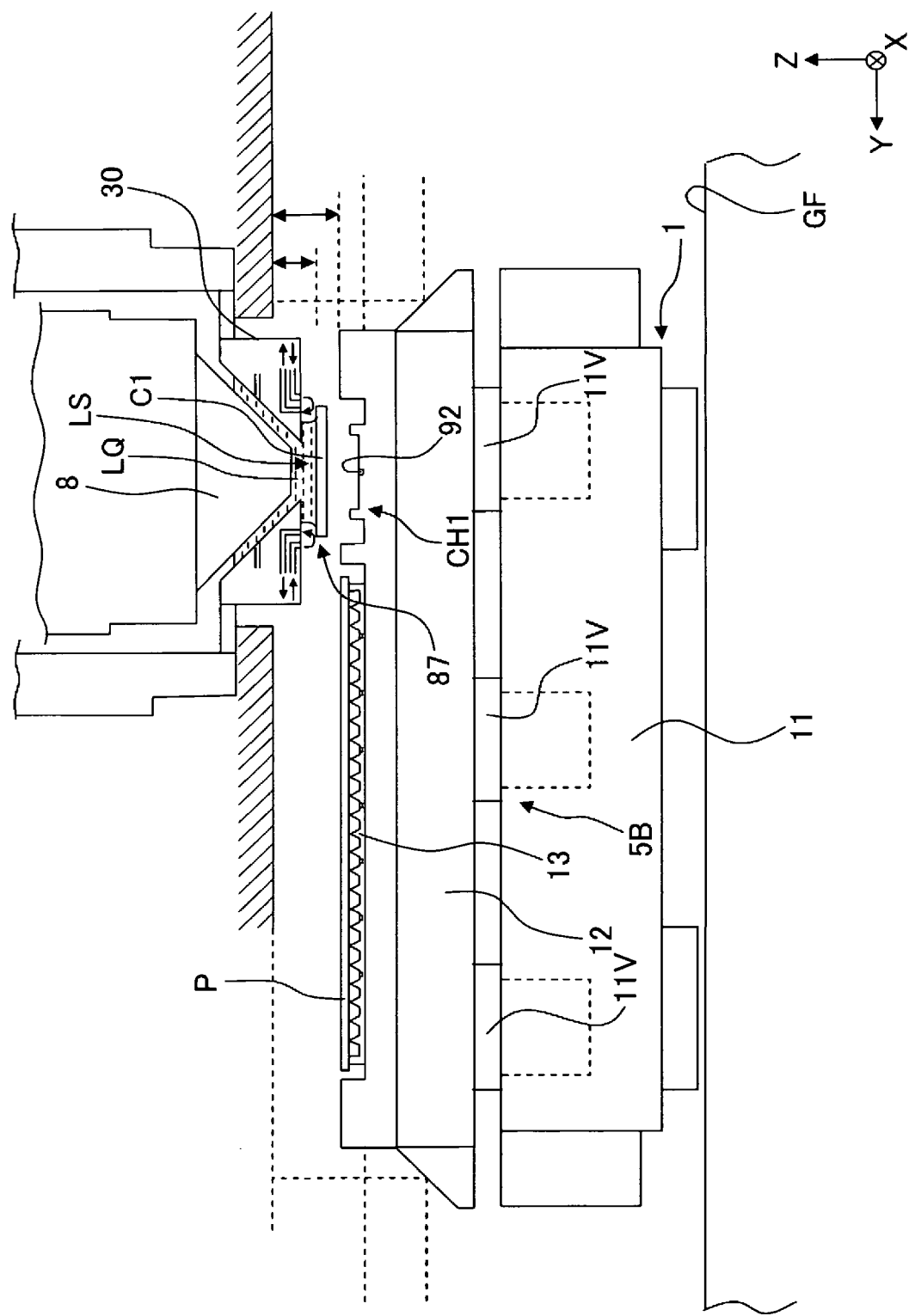
FIG. 5 illustrates an example of the operation of the exposure apparatus according to the first embodiment.

As shown in FIG. 5, the controller 7 controls the fine movement system 5B of the substrate stage-driving system 5 in the state that the gas bearing 87 is formed between the lower surface of the seal member 30 and the upper surface of the first cap member C1 to adjust the positional relationship in the Z axis direction between the first cap member C1 held by the seal member 30 and the first cap holder CH1 of the first substrate table 12 so that the first cap member C1 is detached or removed from the first cap holder CH1. Specifically, the controller 7 controls the fine movement system 5B of the substrate stage-driving system 5 to move the first substrate table 12 in the downward direction (in the −Z direction) so that the lower surface of the first cap member C1 held by the seal member 30 is separated from the upper surface of the first cap holder CH1. By moving the first substrate table 12 in the downward direction (in the −Z direction), the first cap member C1, which is held by the seal member 30, is removed or detached from the first cap holder CH1 of the first substrate stage 1, and the first cap member C1 is held by the seal member 30. In this way, the first cap member C1, which has been held by the first cap holder CH1, is released from the first cap holder CH1, and the first cap member C1 is held by the seal member 30.

The seal member 30 holds the upper surface of the first cap member C1 so that the first cap member C1 is arranged at the position opposite to the light exit surface of the first optical element 8 in the state that the gap is maintained between the lower surface of the seal member 30 and the upper surface of the first cap member C1 by utilizing the sucking action effected by the gas bearing 87 formed between the lower surface of the seal member 30 and the upper surface of the first cap member C1. The first cap member C1, which is released from the first cap holder CH1 and which is held by the seal member 30, forms a space capable of holding or retaining the liquid LQ between the first cap member C1 and the first optical element 8 and the seal member 30 to hold or retain the liquid LQ between the first cap member C1 and the first optical element 8 and the seal member 30.

When the first cap member C1, held by the seal member 30, is to be held by the first cap holder CH1, the controller 7 uses the substrate stage-driving system 5 to move the first substrate stage 1 so that the lower surface, of the first cap member C1, which is held by the seal member 30, is opposite to the first cap holder CH1 provided on the first substrate table 12, while retaining the liquid LQ between the first cap member C1 and the first optical element 8. When the first cap holder CH1 is to be arranged under or below the seal member 30, the controller 7 moves the first substrate stage 1 in the horizontal direction in the state that the first substrate table 12 is lowered by a predetermined distance in the −Z direction with respect to the first cap member C1 held by the seal member 30 such that the seal member 30 or the first cap member C1 held by the seal member 30 does not abut against the first substrate stage 1.

The controller 7 adjusts the positional relationship in the Z axis direction between the first cap member C1 held by the seal-member 30 and the first cap holder CH1 of the first substrate table 12 to thereby places or mounts the first cap member C1 held by the seal member 30 onto the first cap holder CH1. Specifically, the controller 7 controls the fine movement system 5B of the substrate stage-driving system 5 to move the first substrate table 12 in the upward direction (in the +Z direction) to thereby bring the lower surface of the first cap member C1 held by the seal member 30 into contact with the upper surface of the first cap holder CH1.

In this situation, the position information about the first substrate table 12 is measured by the measuring system 6. The controller 7 controls the substrate stage-driving system 5 based on the measurement result of the measuring system 6 to thereby make it possible to arrange the first cap holder CH1 of the first substrate table 12 at the desired position with respect to the first cap member C1 held by the seal member 30.

After bringing the first cap member C1 held by the seal member 30 into contact with the first cap holder CH1, the controller 7 controls the vacuum system connected to the suction port 92 of the first cap holder CH1 to thereby hold the first cap member C1 with the first cap holder CH1 by suction-attraction. Accordingly, the first cap member C1, which has been held by the seal member 30, is released from the seal member 30, and the first cap member C1 is held by the first cap holder CH1 of the first substrate table 12. The liquid immersion space LS is formed between the first optical element 8 and the seal member 30 and the first cap member C1 held by the first cap holder CH1. The gas bearing 87 is formed between the lower surface of the seal member 30 and the upper surface of the first cap member C1. The gap, which is formed between the lower surface of the seal member 30 and the upper surface of the first cap member C1 held by the first cap holder CH1, is maintained.

The controller 7 controls the substrate stage-driving system 5 in the state that the liquid immersion space LS is formed between the first optical element 8 and the seal member 30 and the first cap member C1 held by the first cap holder CH1 to move the first substrate stage 1 in the XY directions with respect to the first optical element 8 and the seal member 30, thereby making the light exit surface of the first optical element 8 and the lower surface of the seal member 30 to be opposite to the first substrate stage 1 (including the substrate P). With this, the liquid immersion space LS is formed between the first optical element 8 and the seal member 30 and the first substrate stage 1 (including the substrate P). That is, the liquid LQ, which has been retained in the space between the first optical element 8 and the first cap member C1, is moved to the space between the first optical element 8 and the substrate P in accordance with the movement of the first substrate stage 1. The gas bearing 87 is formed between the lower surface of the seal member 30 and the first substrate stage 1. Then, the controller 7 exposes the substrate P via the first optical element 8 and the liquid LQ.

The explanation has been made above about the operation for releasing the first cap member C1 having been held by the first cap holder CH1 from the first cap holder CH1 and making the first cap member C1 to be held by the seal member 30 and the operation for releasing the first cap member C1 having been held by the seal member 30 from the seal member 30 and making the first cap member C1 to be held by the first cap holder CH1, namely, about the operation for delivering the first cap member C1 between the first cap holder CH1 and the seal member 30. Since the first cap member C1 and the second cap member C2 have approximately same structure (size and shape), the exposure apparatus EX can perform delivery of the second cap member C2 between the first cap holder CH1 and the seal member 30 in a similar manner as that with respect to the first cap member C1.

Further, in a similar manner as the operation for delivering the first cap member C1 (or the second cap member C2) between the first cap holder CH1 and the seal member 30, the exposure apparatus EX is capable of executing an operation for delivering the first cap member C1 (or the second cap member C2) between the second cap holder CH2 and the seal member 30; an operation for delivering the first cap member C1 (or the second cap member C2) between the third cap holder CH3 and the seal member 30; and an operation for delivering the first cap member C1 (or the second cap member C2) between the fourth cap holder CH4 and the seal member 30. In this embodiment, in an operation for exposing a plurality of pieces of the substrate P in a same lot, the first cap member C1 or the second cap member C2 is transferred from the seal member 30 alternately to the first substrate stage 1 (one of the first and second cap holders CH1 and CH2) and the second substrate stage 2 (one of the third and fourth cap holders CH3 and CH4). For example, in a case of using the first cap member C1 to retain the liquid between the first optical member 8 and the first cap member C1, then, after completing the exposure for a substrate P held to the first substrate stage 1, the first cap member C1 is released from the first cap holder CH1 (or from the second cap holder CH2) and is held by the seal member 30. Next, prior to the exposure for a substrate P held to the second substrate stage 2, the first cap member C1 is released from the seal member 30 and is held by the third cap holder CH3 (or by the fourth cap holder CH4). Then, after the completion of the exposure for the substrate P held to the second substrate stage 2, the first cap member C1 is released from the third cap holder CH3 (or from the fourth cap holder CH4) and is held by the seal member 30. Next, prior to the exposure for a substrate P held to the first substrate stage 1, the first cap member C1 is released from the seal member 30 and is held by the first cap holder CH1 (or by the second cap holder CH2). Thereafter, the above operations are repeated until the exposure for all the substrates in the lot is completed. Further, in a case that in the middle of the above-described exposure operation, for example, when the first cap member C1 is to be exchanged for the second cap member C2 after the completion of exposure of the substrate P held by the first substrate stage 1, the second cap member C2 is released from the second cap holder C2 (or from the first cap holder C1) and is held by the seal member 30 while the first cap member C1 is remained to be held by the first cap holder CH1 (or by the second cap holder CH2). Then, by the exposure station ST1, the first cap member C1 is unloaded (transported) from the exposure station ST1 together with the exposed substrate P; and in the exposure station ST1, the second cap member C2 is released from the seal member 30 and is held by the third cap holder CH3 (or by the fourth cap holder CH4) of the second substrate stage 2. Afterwards, until the second cap member C2 is exchanged for the third cap member C3, the liquid LQ is retained by the second cap member C2 between the first optical element 8 and the second cap member C2.

Figure 6:
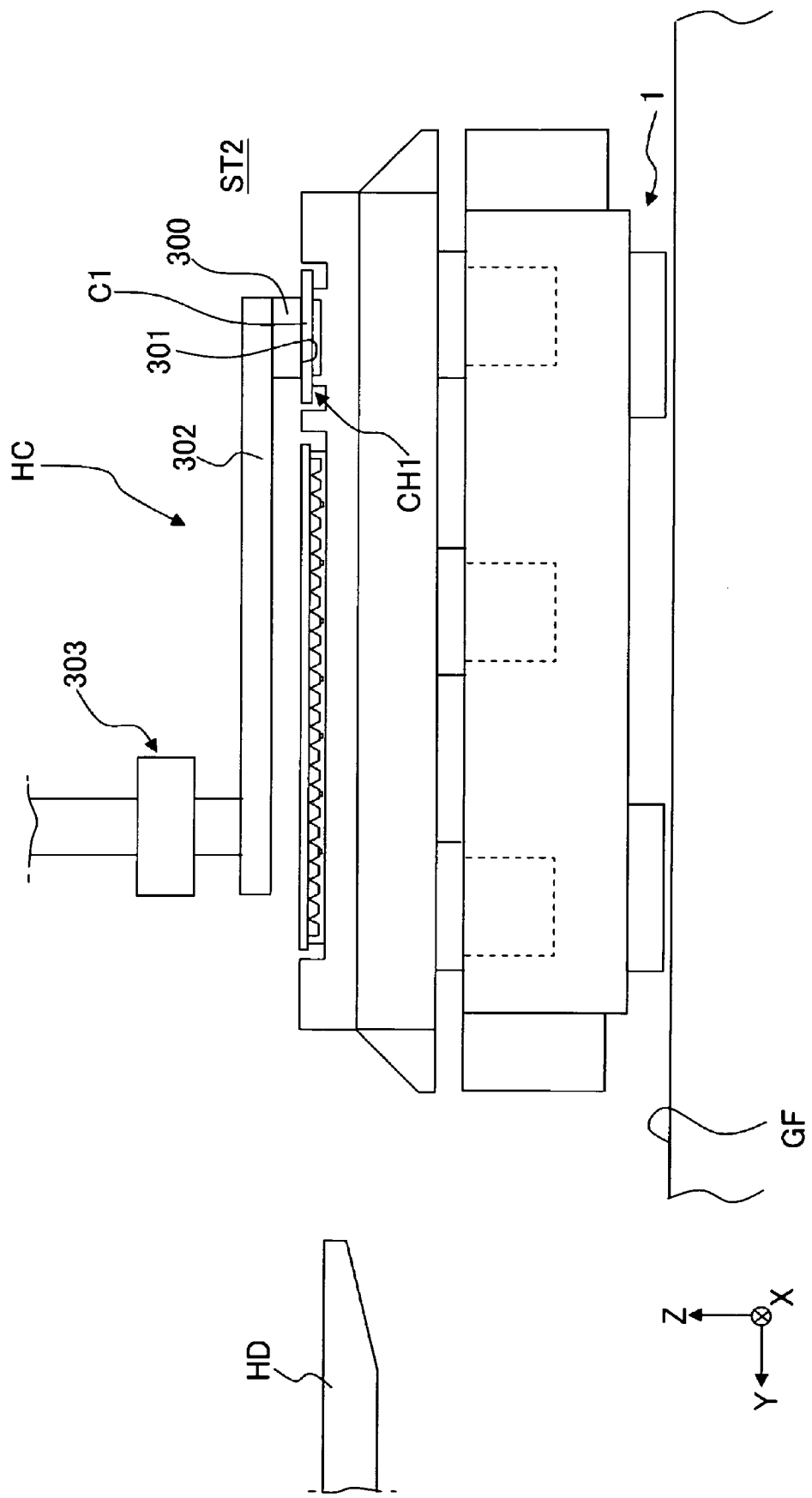
FIG. 6 shows an example of a cap member transport system according to the first embodiment.
Figure 7:
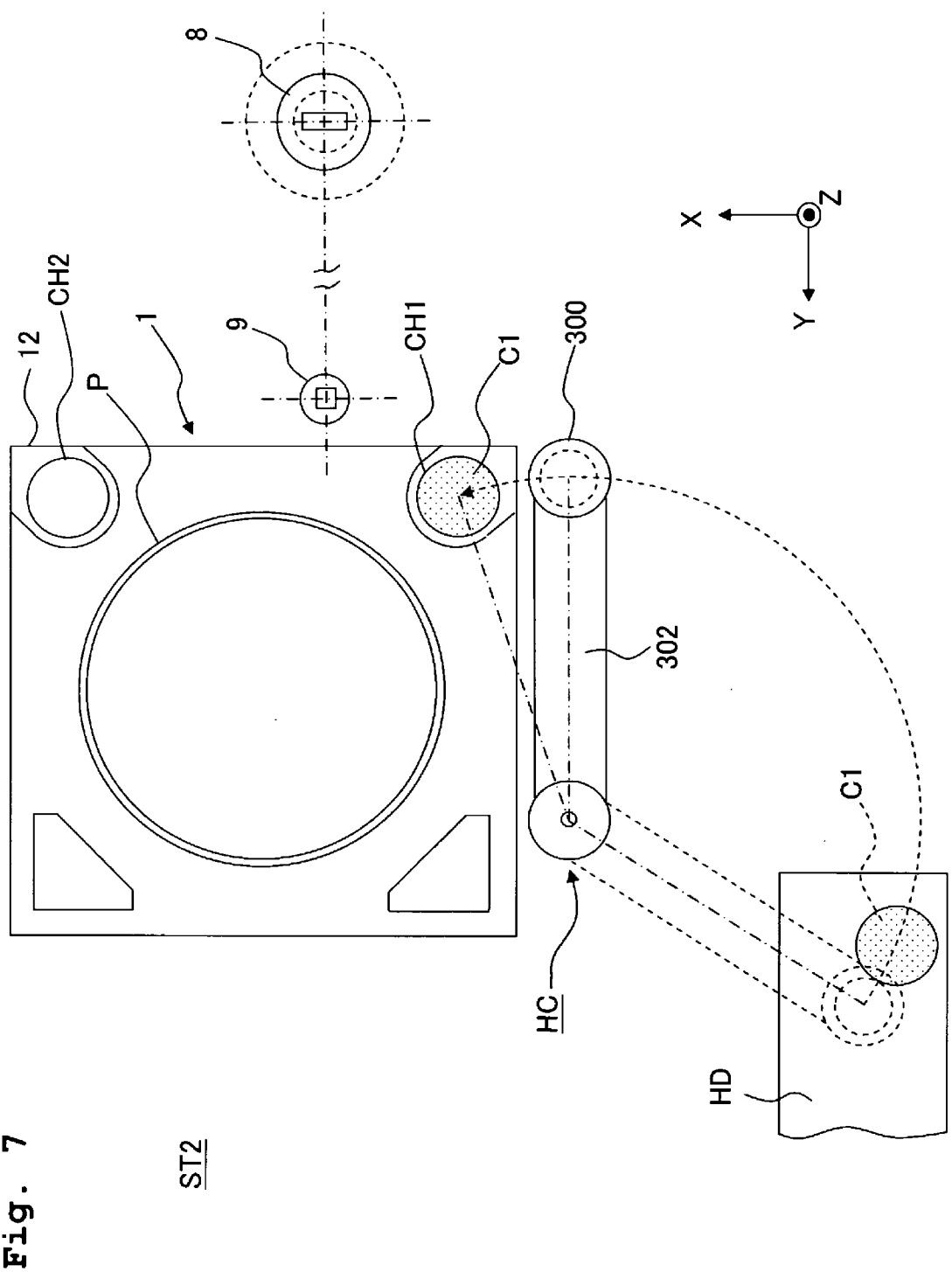
FIG. 7 illustrates an example of the operation of the cap member transport system.
Figure 8:
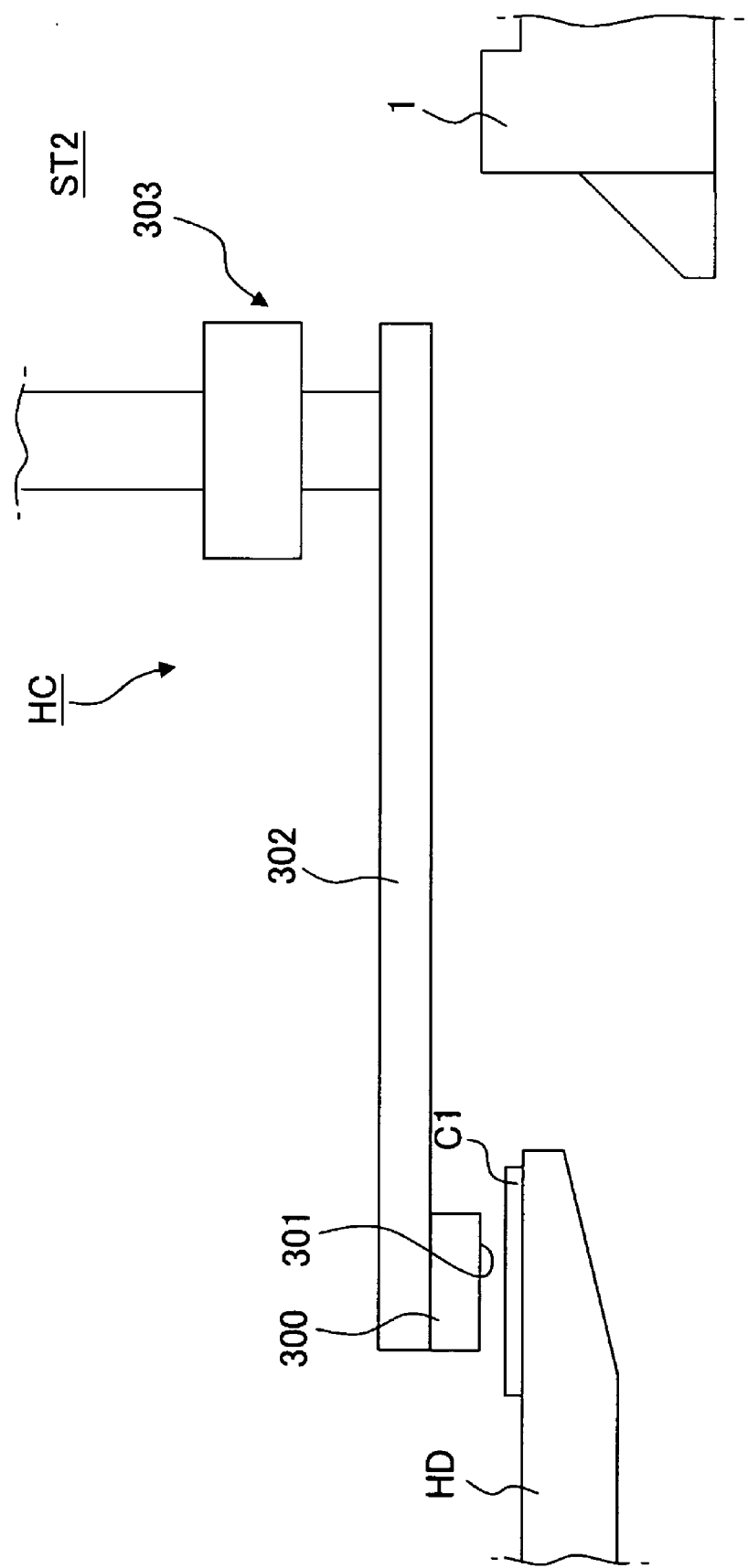
FIG. 8 illustrates an example of the operation of the cap member transport system.

Next, the cap member transport system HC will be explained with reference to FIGS. 6 to 8. FIG. 6 is a side view of the cap member transport system HC. FIG. 7 is a plan view of the cap member transport system HC. FIG. 8 shows the operation of the cap member transport system HC.

The cap member transport system HC can transport, to a predetermined position, at least one of the first cap member C1 and the second cap member C2 released from the seal member 30 and the first, second, third, fourth cap holders CH1, CH2, CH3, CH4. In this embodiment, the cap member transport system HC is arranged in the measuring station ST2.

The exposure apparatus EX of this embodiment is provided with a placing stand HD which is constructed to be accessible by an external apparatus or device and which has a placing surface capable of placing the first and second cap members C1, C2 thereon. In this embodiment, the placing stand HD is arranged in the measuring station ST2 (namely, in the above-described predetermined position). The cap member transport system HC is capable of transporting the first and second cap members C1, C2 to the placing stand HD. Further, in the embodiment, the first and second cap members C1, C2 are transported at the predetermined position in the measuring station S2, for example, between the placing stand HD and the first substrate stage 1 or the second substrate stage 2 arranged at the above-described substrate exchange position. Therefore, the cap member transport system HC is capable of executing the exchange of the cap member (including at least one of the loading and unloading the cap member) concurrently with at least a part of the exchange operation of the substrate P, and the cap member transport system HC is arranged in the measuring station ST2 so as not to mechanically interferer with the substrate transport system HP. When the cap member transport system HC is placed in the exposure station ST1, the placing stand HD also may be arranged in the exposure station ST1.

The cap member transport system HC transports, to the placing stand HD, the first cap member C1 (the second cap member C2) released from at least one of the first and second cap holders CH1, CH2 of the first substrate stage 1 moved to the second area SP2 of the measuring station ST2 and the third and fourth cap holders CH3, CH4 of the second substrate stage 2 moved to the second area SP2 of the measuring station ST2.

Further, the cap member transport system HC is capable of transporting the first cap member C1 (second cap member C2) placed on the placing stand HD to at least one of the first and second cap holders CH1, CH2 of the first substrate stage 1 moved to the second area SP2 of the measuring station ST2 and the third and fourth cap holders CH3, CH4 of the second substrate stage 2 moved to the second area SP2 of the measuring station ST2. Note that in the embodiment, another cap member, which is different from the first and second cap members C1 and C2, may be placed on the placing stand HD. The another cap member may be an unused cap member or a reused (for example, cleaned) cap member.

In the following, an explanation will be made about a case, as an example, in which the cap member transport system HC transports the first cap member C1 between the first cap holder CH1 and the placing stand HD.

The cap member transport system HC includes a holding mechanism 300 which has a holding surface 301 capable of holding the first cap member C1, a support member 302 which supports the holding mechanism 300, and a driving mechanism 303 which is capable of moving the support member 302 supporting the holding mechanism 300 to thereby move the holding mechanism 300. The operation of the cap member transport system HC is controlled by the controller 7. The cap member transport system HC is capable of transporting the first cap member C1 to the desired position by holding the first cap member C1 with the holding mechanism 300 and moving the holding mechanism 300 holding the first cap member C1, with the driving mechanism 300 via the support member 302.

In this embodiment, the holding surface 301 of the holding mechanism 300 is directed in the downward direction (in the −Z direction), and is capable of holding the upper surface of the first cap member C1. The holding mechanism 300 includes, for example, a vacuum chuck mechanism, and is capable of holding the upper surface of the first cap member C1 by suction-attraction. The controller 7 can separate the first cap member C1 from the holding surface 301 of the holding mechanism 300 by releasing or stopping the holding operation (sucking operation) performed by the holding mechanism 300. In this way, the holding mechanism 300 releasably holds the first cap member C1.

The support member 302 is, for example, a rod-shaped (arm-shaped) member, supporting the holding mechanism 300 by one end (end portion) of the support member 302, and being connected to the driving mechanism 303 at the other end of the support member 302. The driving mechanism 303 supports the support member 302 so that the support member 302 and the XY plane are substantially parallel to each other.

The driving mechanism 303 includes an actuator such as a rotary motor, and is capable of rotating the other end of the support member 302 in the θZ direction. The driving mechanism 303 is capable of swinging the holding mechanism 300 supported by one end of the support member 302 in the θZ direction by rotating the other end of the support member 302 in the θZ direction. In this embodiment, the driving mechanism 303 is capable of moving (finely moving) the support member 302 not only in the θZ direction but also in the X axis, Y axis, Z axis, θX, and θY directions. That is, the driving mechanism 303 is capable of swinging the holding mechanism 300 supported by one end of the support member 302 in the θZ direction, and the driving mechanism 303 is capable of moving (finely moving) the holding mechanism 300 in the X axis, Y axis, Z axis, θX, and θY directions.

Next, an explanation will be made about an example of the operation of the cap member transport system HC. For example, when the first cap member C1 held by the first cap holder CH1 of the first substrate stage 1 is transported by the cap member transport system HC, the controller 7 uses the substrate stage-driving system 5 to move the first substrate stage 1 to the second area SP2 of the measuring station ST2 as shown in FIG. 6. The controller 7 controls at least one of the cap member transport system HC and the substrate stage-driving system 5 to make the holding surface 301 of the holding mechanism 300 to face the upper surface of the first cap member C1 held by the first cap holder CH1.

Subsequently, the controller 7 controls at least one of the driving mechanism 303 of the cap member transport system HC and the substrate stage-driving system 5 to adjust the positional relationship in the Z axis direction between the holding surface 301 of the holding mechanism 300 and the upper surface of the first cap member C1 held by the first cap holder CH1, thereby bringing the holding surface 301 of the holding mechanism 300 into contact with the upper surface of the first cap member C1 held by the first cap holder CH1.

Subsequently, the controller 7 stops or releases the holding of the first cap member C1 having been effected by the first cap holder CH1. With this, the first cap holder CH1 can release the first cap member C1. The controller 7 drives the holding mechanism 300 to hold the upper surface of the first cap member C1 so that the upper surface of the first cap member C1 is attracted and held by the holding surface 301 of the holding mechanism 300.

The controller 7 controls at least one of the driving mechanism 303 of the cap member transport system HC and the substrate stage-driving system 5 in the state that the upper surface of the first cap member C1 is held by the holding surface 301 of the holding mechanism 300 to adjust the positional relationship in the Z axis direction between the first cap member C1 held by the holding mechanism 300 and the first cap holder CH1 of the first substrate table 12, thereby removing or detaching the first cap member C1 from the first cap holder CH1. Specifically, the controller 7 controls the fine movement system 5B of the substrate stage-driving system 5 to move the first substrate table 12 in the downward direction (in the −Z direction) and/or the controller 7 controls the driving mechanism 303 of the cap member transport system HC to move the holding mechanism 300 in the upward direction (in the +Z direction) so as to separate the lower surface of the first cap member C1, held by the holding mechanism 300, from the upper surface of the first cap holder CH1. Accordingly, the first cap member C1, which has been held by the first cap holder CH1, is released from the first cap holder CH1, and the first cap member C1 is held by the holding mechanism 300.

The controller 7 controls the driving mechanism 303 in the state that the first cap member C1 is held by the holding mechanism 300 to swing the holding mechanism 300 holding the first cap member C1 in the θZ direction. The placing stand HD is arranged at the predetermined position in the measuring station ST2; and as shown in FIG. 7, the controller 7 transports, to the placing stand HD, the first cap member C1 held by the holding mechanism 300, by swinging the holding mechanism 300 holding the first cap member C1.

The controller 7 stops or releases the holding operation having been effected for the first cap member C1 by the holding mechanism 300 in the state that the first cap member C1 held by the holding mechanism 300 is opposite to the placing surface of the placing stand HD. With this, as shown in FIG. 8, the first cap member C1 is placed on the placing stand HD. As described above, the cap member transport system HC can transport, to the placing stand HD, the first cap member C1 released from the first cap holder CH1 of the first substrate stage 1 moved to the second area SP2 of the measuring station ST2.

The cap member transport system HC is capable of transporting the first cap member C1 placed on the placing stand HD to the first cap holder CH1 of the first substrate stage 1 moved to the second area SP2 of the measuring station ST2. When the controller 7 transports the first cap member C1 placed on the placing stand HD to the first cap holder CH1 of the first substrate stage 1 by using the cap member transport system HC, the controller 7 uses the substrate stage-driving system 5 to move the first substrate stage 1 to the second area SP2 of the measuring station ST2. Further, the controller 7 holds the upper surface of the first cap member C1 placed on the placing stand HD with the holding mechanism 300 of the cap member transport system HC. In the state that the first cap member C1 is held by the holding mechanism 300, the controller 7 controls the driving mechanism 303 to swing the holding mechanism 300 holding the first cap member C1 in the θZ direction. The first substrate stage 1 is arranged in the measuring station ST2; and the controller 7 swings the holding mechanism 300 holding the first cap member C1 to thereby make the lower surface of the first cap member C1 held by the holding mechanism 300 to be opposite to or to face the upper surface of the first cap holder CH1 of the first substrate stage 1.

The controller 7 adjusts the positional relationship in the Z axis direction between the first cap member C1 held by the holding mechanism 300 and the first cap holder CH1 of the first substrate table 12 in the state that the lower surface of the first cap member C1 held by the holding mechanism 300 is opposite to the upper surface of the first cap holder CH1 so that the first cap member C1, held by the holding mechanism 300, is placed on the first cap holder CH1. Specifically, the controller 7 controls the fine movement system 5B of the substrate stage-driving system 5 to move the first substrate table 12 in the upward direction (in the +Z direction), and/or the controller 7 controls the driving mechanism 303 of the cap member transport system HC to move the holding mechanism 300 in the downward direction (in the −Z direction), to thereby bring the lower surface of the first cap member C1 held by the holding mechanism 300 into contact with the upper surface of the first cap holder CH1.

After the controller 7 brings the first cap member C1 held by the holding mechanism 300 into contact with the first cap holder CH1, the controller 7 controls the vacuum system connected to the suction port 92 of the first cap holder CH1 to hold the first cap member C1 with the first cap holder CH1 by suction-attraction. Further, the controller 7 stops or releases the sucking operation for the first cap member C1 by the holding mechanism 300. Accordingly, the first cap member C1, which has been held by the holding mechanism 300, is released from the holding mechanism 300, and the first cap member C1 is held by the first cap holder CH1 of the first substrate table 12.

As described above, in this embodiment, the cap member transport system HC is capable of transporting the first cap member C1 released from the first cap holder CH1 to the placing stand HD arranged at the predetermined position. Further, the cap member transport system HC is capable of transporting the first cap member C1 placed on the placing stand HD to the first cap holder CH1.

The explanation above has been made about a case that the cap member transport system HC transports the first cap member C1 between the first cap holder CH1 and the placing stand HD. However, the cap member transport system HC can transport the second cap member C2 between the first cap holder CH1 and the placing stand HD as well.

Further, the cap member transport system HC is capable of transporting the first cap member C1 (or the second cap member C2) released from the second cap holder CH2 of the first substrate table 12 to the placing stand HD arranged at the predetermined position, and is capable of transporting the first cap member C1 (or the second cap member C2) placed on the placing stand HD to the second cap holder CH2 of the first substrate table 12. When the cap member transport system HC is used to transport the first cap member C1 (or the second cap member C2) between the second cap holder CH2 and the placing stand HD, the first substrate stage 1 is moved to the second area SP2 of the measuring station ST2. Further, the controller 7 controls at least one of the driving mechanism 303 of the cap member transport system HC and the substrate stage-driving system 5 to adjust the positional relationship between the holding mechanism 300 and the second cap holder CH2 so that the first cap member C1 (or the second cap member C2) can be delivered between the holding mechanism 300 of the cap member transport mechanism HC and the second cap holder CH2 of the first substrate table 12.

Similarly, the cap member transport system HC is capable of transporting the first and second cap members C1, C2 released from the third and fourth cap holders CH3, CH4 of the second substrate table 22 to the placing stand HD arranged at the predetermined position. Further, the cap member transport system HC is capable of transporting the first and second cap member 2 C1, C2 placed on the placing stand HD to the third and fourth cap holders CH3, CH4 of the second substrate table 22. When the first and second cap members C1, C2 are transported between the third and fourth cap holders CH3, CH4 and the placing stand HD by using the cap member transport system HC, the second substrate stage 2 is moved to the second area SP2 of the measuring station ST2. Furthermore, the controller 7 controls at least one of the driving mechanism 303 of the cap member transport system HC and the substrate stage-driving system 5 to adjust the positional relationship between the holding mechanism 300 and the third and fourth cap holders CH3, CH4 such that the first and second cap members C1, C2 can be delivered between the holding mechanism 303 of the cap member transport system HC and the third and fourth cap holders CH3, CH4 of the second substrate stage 22.

Next, an explanation will be made with reference to plan views shown in FIGS. 9 to 14 about an example of the method for exposing the substrate P by using the exposure apparatus EX constructed as described above, especially about the sequence using the first cap member C1. The explanation using FIGS. 9 to 14 is about an ordinary exposure sequence. Note that during the ordinary exposure sequence to be explained below, the seal member 30 always concurrently performs the supply operation of the liquid LQ and recovery operation of the liquid LQ using the flow passage 81.

Figure 9:
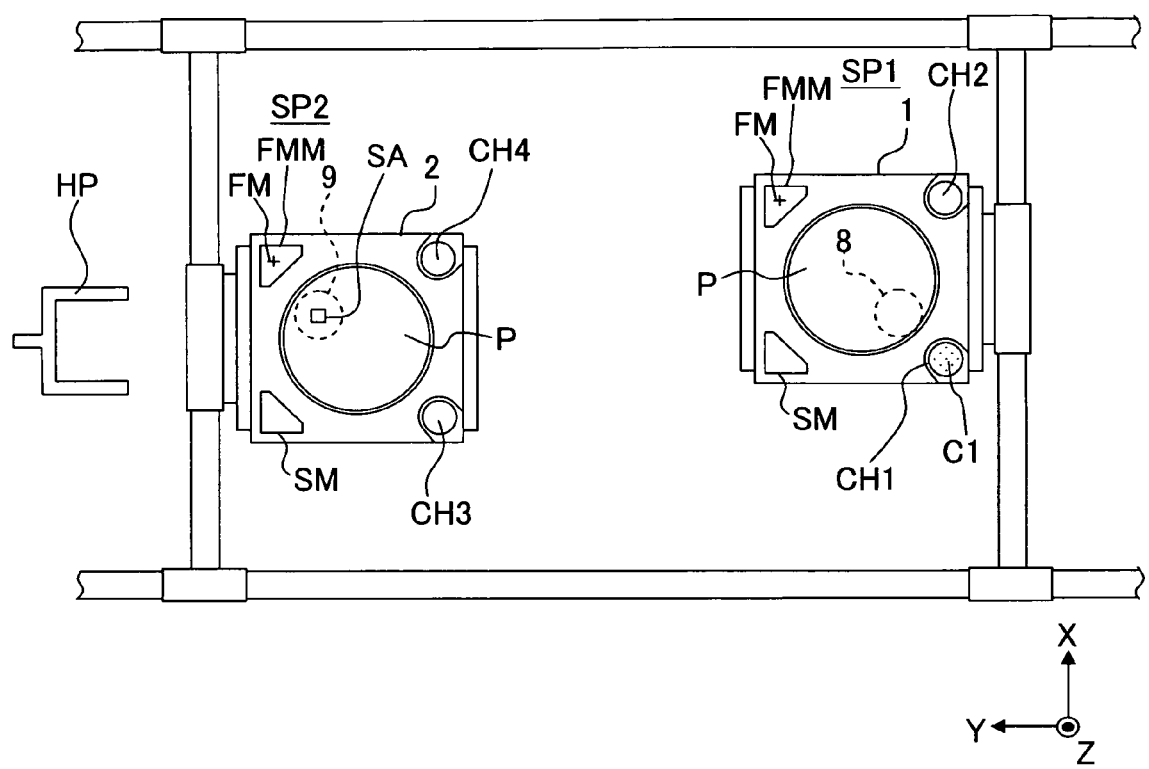
FIG. 9 illustrates an exposure method according to the first embodiment.
Figure 10:
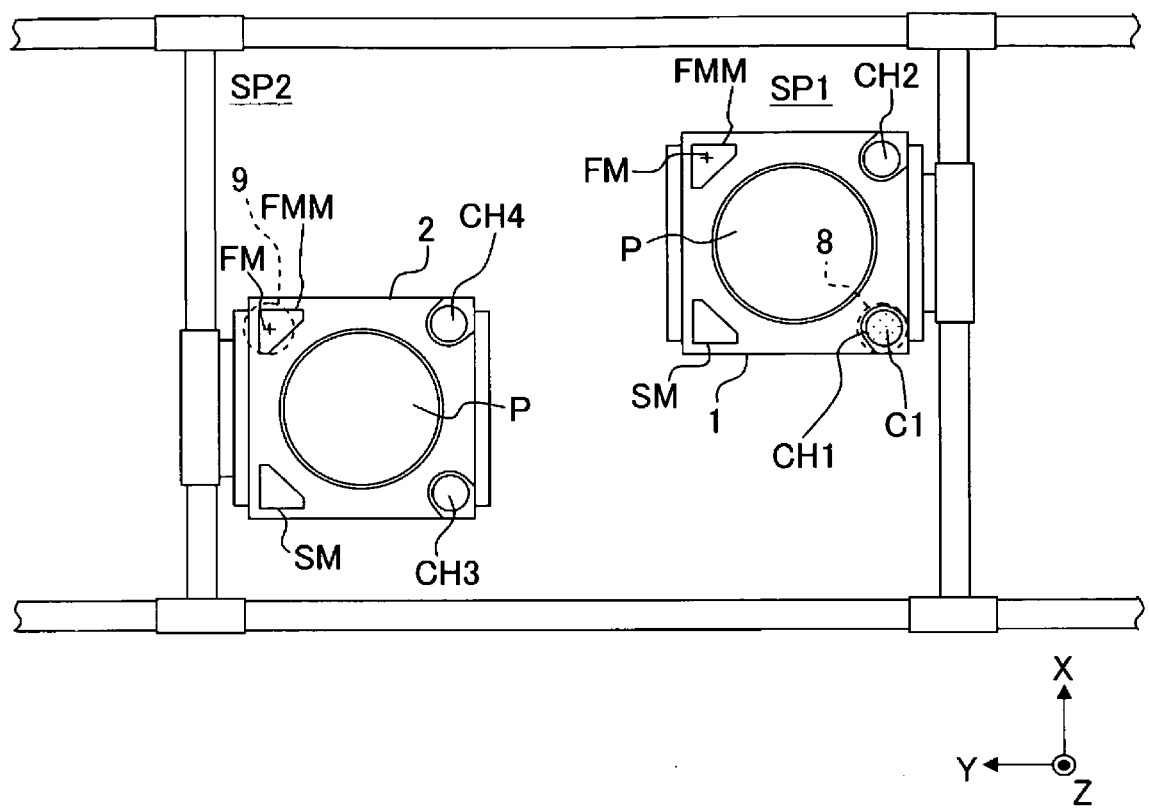
FIG. 10 illustrates the exposure method according to the first embodiment.

As shown in FIG. 9, the liquid immersion exposure is performed for a substrate P held by the first substrate stage 1 in the first area SP1 of the exposure station ST1; and the substrate exchange operation for the second substrate stage 2, the measurement process for another substrate P held to the second substrate stage 2, and the like are performed in the measuring station ST2. The measurement process includes the measurement process using the alignment system AL described above and the measurement process using the focus/leveling-detecting system FL. Further, the first cap member C1 is held to the first cap holder CH1 of the first substrate stage 1. In the measurement process using the alignment system AL, the detection of the position information about the alignment mark in a shot area SA on the substrate P as shown in FIG. 9, and the detection of the reference mark FM as shown in FIG. 10 are performed. The controller 7 determines the position information about each of the plurality of shot areas on the substrate P with respect to the predetermined reference position (for example, positional relationship between the reference mark FM and each of the plurality of shot areas on the substrate P) by the calculating process based on the measured position information about the shot areas.

The controller 7 uses the seal member 30 to form the liquid immersion space LS between the first optical element 8 and the substrate P held by the first substrate stage 1 and exposes, in the step-and-scan manner, a plurality of shot areas on the substrate P through the liquid LQ in the liquid immersion space LS. As shown in FIG. 9, the first cap holder CH1 of the first substrate stage 1 holds the first cap member C1 during the exposure for the substrate P held by the substrate holder 13 of the first substrate stage 1.

As shown in FIG. 10, after the liquid immersion exposure is completed for the substrate P on the first substrate stage 1, the controller 7 controls the substrate stage-driving system 5 to move the first substrate stage 1 in the XY directions so that the state that the light exit surface of the first optical element 8 is opposite to the surface of the substrate P held by the substrate holder 13 of the first substrate stage 1, is changed to a state that the light exit surface of the first optical element 8 is opposite to the upper surface of the first cap member C1 held by the first cap holder CH1 of the first substrate stage 1. Accordingly, the liquid immersion space LS is formed between the light exit surface of the first optical element 8 and the upper surface of the first cap member C1 held by the first cap holder CH1.

Subsequently, the controller 7 stops the holding of the first cap member C1 having been effected by the first cap holder CH1 to thereby release the first cap member C1 from the first cap holder CH1, and the controller 7 utilizes the sucking-attracting action of the gas bearing 87 to hold the first cap member C1 with the seal member 30. The first cap member C1, which is held by the seal member 30, is arranged at the position opposite to the light exit surface of the first optical element 8.

Figure 11:
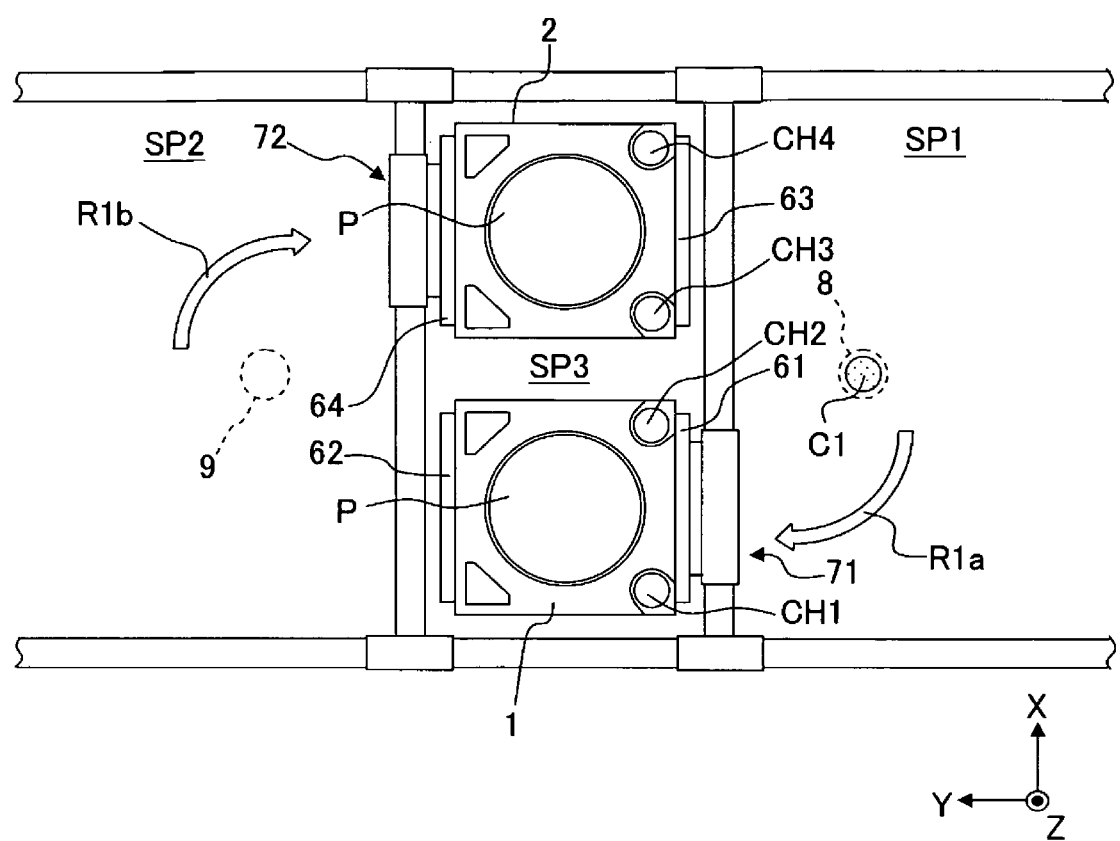
FIG. 11 illustrates the exposure method according to the first embodiment.

After moving the opposing surface 15 of the first substrate table 12 to a position lower than (in the −Z direction with respect to) the lower surface of the first cap member C1 in the state that the cap member C is held by the seal member 30, the controller 7 moves the first substrate stage 1 from the first area SP1 to the third area SP3 as shown in FIG. 11.

When both of the first substrate stage 1 and the second substrate stage 2 are away or apart from the first area SP1 including the first position opposite to the light exit surface of the first optical element 8 as described above, then the seal member 30 holds the first cap member C1.

The first cap member C1 held by the seal member 30 can retain the liquid LQ between the first cap member C1 and the first optical element 8; and the liquid immersion space LS is formed between the first optical element 8 and the first cap member C1 held by the seal member 30.

The controller 7 controls the substrate stage-driving system 5 to move each of the first substrate stage 1 and the second substrate stage 2 to the third area SP3 as shown in FIG. 11, while using the measuring system 6 to measure the positions of the first and second substrate stages 1, 2. In this embodiment, the first substrate stage 1 moved from the first area SP1 to the third area SP3 is arranged in an area which is included in the third area SP3 and which is on the −X side as shown in the drawing; and the second substrate stage 2 moved from the second area SP2 to the third area SP3 is arranged in an area which is included in the third area SP3 and which is on the +X side as shown in the drawing. When the first substrate stage 1 is moved from the first area SP1 to the third area SP3, the first substrate stage 1 is moved along a route indicated by an arrow R1$a$ in FIG. 11; and when the second substrate stage 2 is moved from the second area SP2 to the third area SP3, the second substrate stage 2 is moved along a route indicated by an arrow R1$b$ in FIG. 11.

Figure 12:
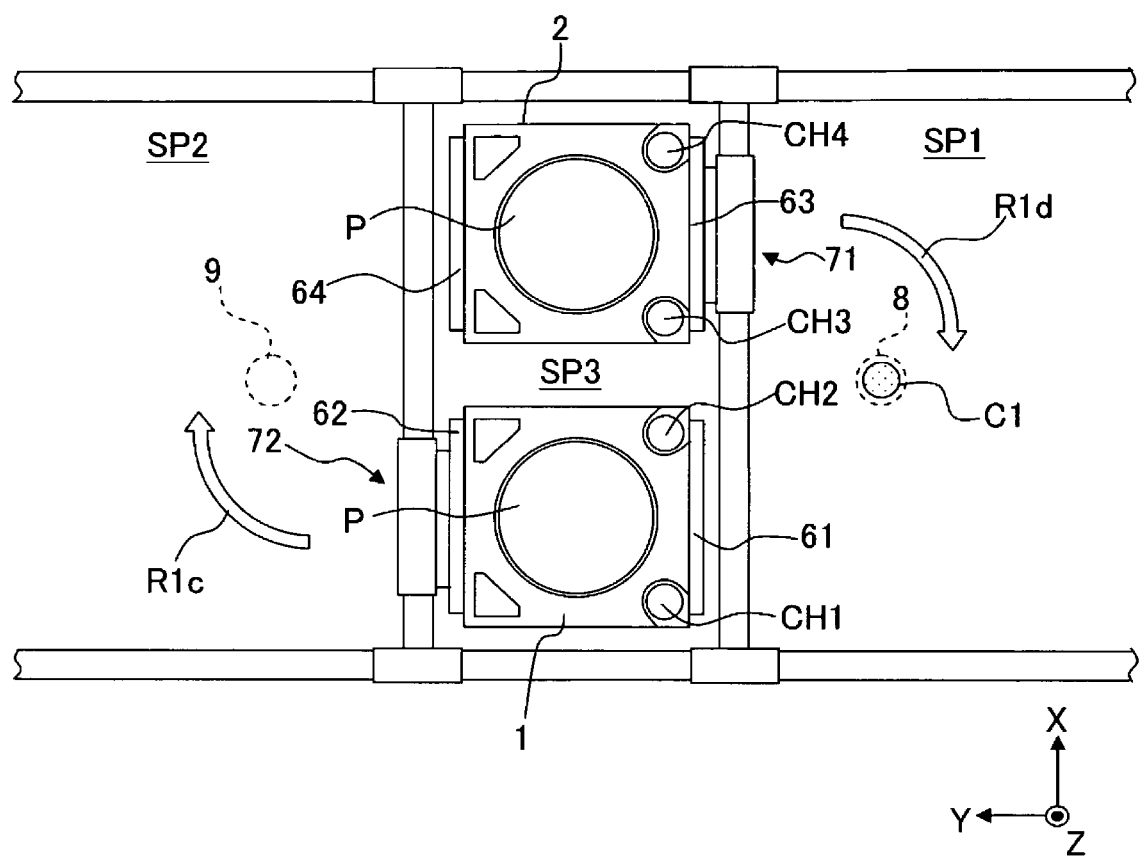
FIG. 12 illustrates the exposure method according to the first embodiment.

Subsequently, as shown in FIG. 12, the controller 7 executes the release of the connection between the first connecting member 71 and the first joint member 61 of the first substrate stage 1 and the release of the connection between the second connecting member 72 and the fourth joint member 64 of the second substrate stage 2 in the third area SP3; and the controller 7 executes the connection between the first connecting member 71 and the third joint member 63 of the second substrate stage 2 and the connection between the second connecting member 72 and the second joint member 62 of the first substrate stage 1 in the third area SP3. In this way, the controller 7 executes the exchange operation for the first connecting member 71 and the second connecting member 72 with respect to the first substrate stage 1 and the second substrate stage 2 in the third area SP3.

Subsequently, the controller 7 controls the substrate stage-driving system 5 to move the second substrate stage 2 to the first area SP1 of the exposure station ST1, and to move the first substrate stage 1 to the second area SP2 of the measuring station ST2. When the first substrate stage 1 is moved from the third area SP3 to the second area SP2, the first substrate stage 1 is moved along a route indicated by an arrow R1$c$ in FIG. 12; and when the second substrate stage 2 is moved from the third area SP3 to the first area SP1, the second substrate stage 2 is moved along a route indicated by an arrow R1$d$ in FIG. 12.

Figure 13:
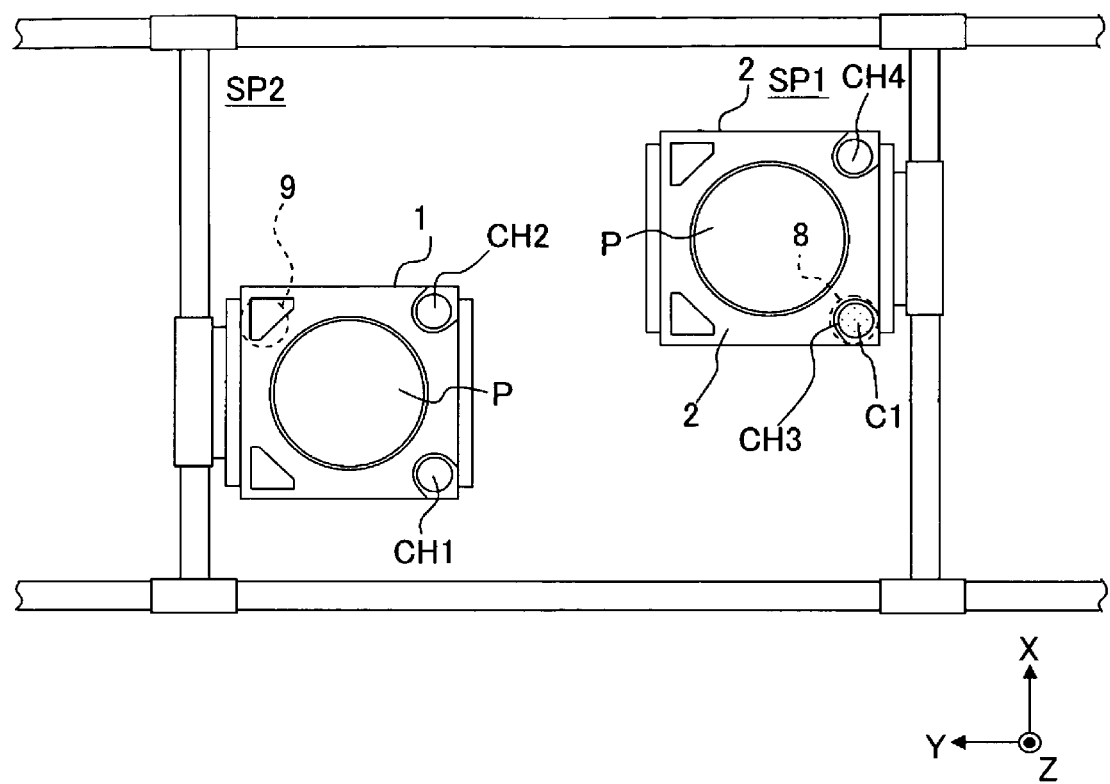
FIG. 13 illustrates the exposure method according to the first embodiment.

As shown in FIG. 13, the controller 7 moves the second substrate stage 2 so that the first cap member C1 held by the seal member 30 faces the third cap holder CH3 of the second substrate stage 2. Subsequently, the controller 7 releases, from the seal member 30, the first cap member C1 having been held by the seal member 30 and to makes the first cap member C1 to be held by the third cap holder CH3. In the second area SP2 of the measuring station ST2, the exchange of substrate P on the first substrate stage 1 is performed, and the measurement process for a substrate P placed on the first substrate P is performed (for example, the alignment mark of the substrate P and the reference mark FM is detected, etc).

Figure 14:
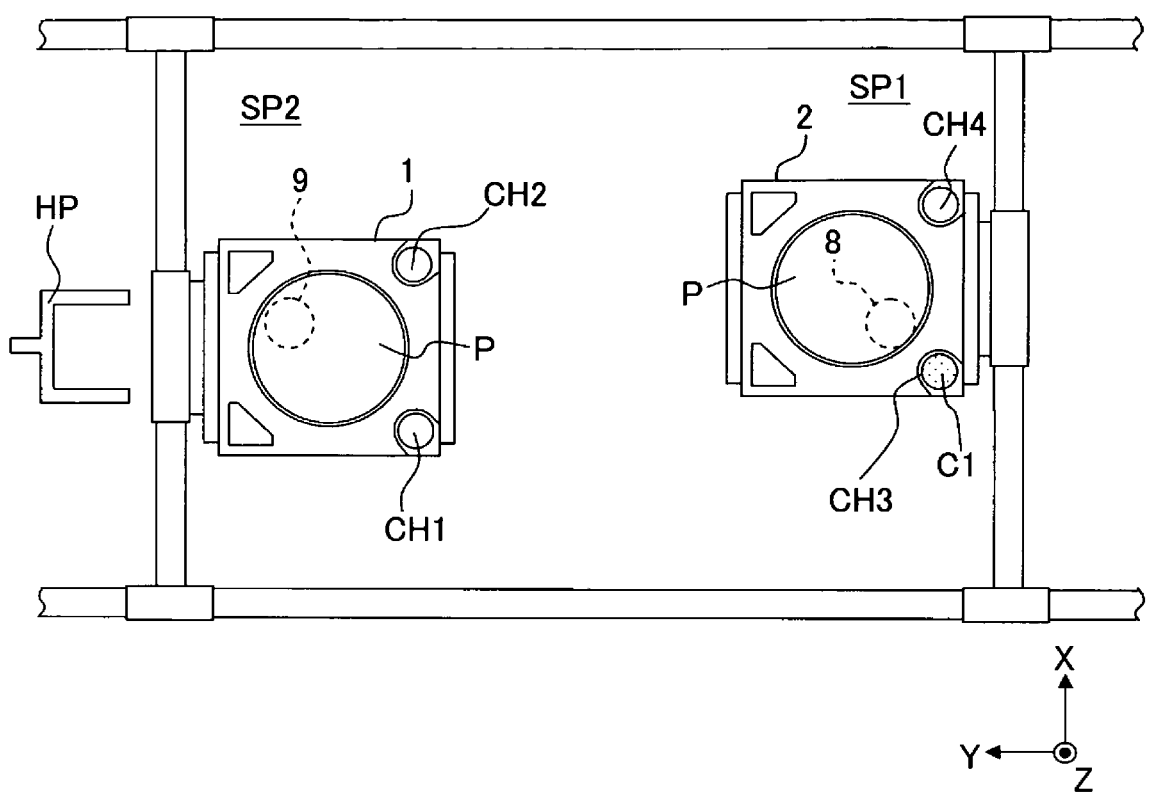
FIG. 14 illustrates the exposure method according to the first embodiment.

Then, after the first cap member C1 is held by the third cap holder CH3, the controller 7 controls the substrate stage-driving system 5 to move the second substrate stage 2 in the XY directions so that the state that the light exit surface of the first optical element 8 is opposite to the upper surface of the first cap member C1 held by the third cap holder CH3 of the second substrate stage 2, is changed to a state that the light exit surface of the first optical element 8 is opposite to the opposing surface 25 of the second substrate stage 2 or the surface of the substrate P held by the substrate holder 23 of the second substrate stage 2. By doing so, the liquid LQ retained under the first optical element 8 is moved on the second substrate stage 2 from the first cap member C1 to the opposing surface 25 or to the substrate P, and as shown in FIG. 14, the liquid immersion space LS is formed between the light exit surface of the first optical element 8 and the opposing surface 25 of the second substrate stage 2 or the surface of the substrate P held by the substrate holder 23 of the second substrate stage 2. Note that in FIG. 14, the liquid immersion space LS is formed between the first optical element 8 and the substrate P. Further, although not shown in the drawing, due to the movement of the second substrate stage 2, the liquid LQ retained under the first optical element 8, namely the liquid immersion space LS, is moved, on the second substrate stage 2, from the first cap member C1 and arrives at the substrate P via a part of the opposing surface 25 (in the embodiment, the part includes the measuring member SM and the reference member FMM). Specifically, when the liquid immersion space LS arrives from the first cap member C1 at a position on the measuring member SM, then, for example, intensity of the exposure light EL etc. is detected by a detecting system such as an optical sensor installed under or below the measurement member SM. Further, the liquid immersion space LS is moved to a position on the reference member FMM, and the reference mark FM and the mark of the mask is detected by the above-described mask alignment system. The controller 7 controls the position of the second substrate stage 2 based on the detection result of the above-described alignment system AL and the detection result of the mask alignment system. Next, the liquid immersion space LS is moved onto the substrate P, and the first optical element 8 and the substrate P are arranged to be mutually opposite or to face each other. With this, the first shot area on the substrate P is moved to an exposure start position.

The liquid immersion exposure is performed for the substrate P held by the second substrate stage 2 in the first area SP1 of the exposure station ST1; and the substrate exchange operation for the first substrate stage 1, the measurement process for the substrate P held by the first substrate stage 1, and the like are performed in the measuring station ST2. The third cap holder CH3 of the second substrate stage 2 holds the first cap member C1 during the exposure for the substrate P held by the substrate holder 23 of the second substrate stage 2.

Afterwards, the same process is repeated. That is, after completing the liquid immersion exposure for the substrate P on the second substrate stage 2, the controller 7 releases the first cap member C1 from the third cap holder CH3, and holds the first cap member C1 with the seal member 30. The first cap member C1 held by the seal member 30 retains the liquid LQ between the first cap member C1 and the first optical element 8.

Subsequently, the controller 7 controls the substrate stage-driving system 5 to move, to the third areas SP3, each of the first substrate stage 1 holding the substrate P for which the measurement process has been completed and the second substrate stage 2 holding the substrate P for which the exposure process has been completed. The controller 7 executes the exchange operation for the first connecting member 71 and the second connecting member 72 with respect to the first substrate stage 1 and the second substrate stage 2.

Subsequently, the controller 7 controls the substrate stage-driving system 5 to move the first substrate stage 1 to the first area SP1 of the exposure station ST1, and to move the second substrate stage 2 to the second area SP2 of the measuring station ST2. Afterwards, the controller 7 releases, from the seal member 30, the first cap member C1 having been held by the seal member 30 and holds the first cap member C1 with the first cap holder CH1 of the first substrate stage 1 moved to the first area SP1. Then, the controller 7 executes the liquid immersion exposure for the substrate P held by the substrate holder 13 of the first substrate table 12 in the state that the first cap member C1 is held by the first cap holder CH1 of the first substrate table 12. The controller 7 executes the measurement process and the substrate exchange operation using the second substrate stage 2 arranged in the measuring station ST2 concurrently with at least a part of the process using the first substrate stage 1 arranged in the exposure station ST1. In this embodiment, prior to liquid immersion exposure for a substrate P held by one of the first and second substrate stages 1 and 2 moved to the first area SP1 of the exposure station ST1, the measurement process is executed by using the measuring member SM and the reference member FMM of one of the first and second substrate stages 1 and 2. However, it is allowable that only the measurement process using the reference member FMM without performing the measurement process using the measuring member SM. Further, in this embodiment, the mark of the mask and the reference mark FM are detected by the above-described mask alignment system. However, it is allowable to use, for example, the measuring member SM to detect the mark of the mask.

There is a possibility that the first cap member C1 may be deteriorated and/or polluted. If the first cap member C1 is continuously used while leaving the state that the first cap member C1 is deteriorated and/or polluted as it is, then there is a possibility that the following inconvenience or problem might arise such that the liquid LQ retained between the first cap member C1 and the light exit surface of the first optical element 8 of the projection optical system PL might leak, that the light exit surface of the first optical element 8 of the projection optical system PL might be polluted, and/or the like. If such an inconvenience or problem arises, there is a possibility for example that the exposure accuracy might be deteriorated. Further, due to the leakage of the liquid LQ, the pollution of, for example, the first optical element 8 of the projection optical system PL, and/or the like, if the maintenance operation is required to be frequently performed, then there is a possibility that the rate of operation of the exposure apparatus EX might be lowered.

In view of the above, in this embodiment, the exchange system CHS is used to execute the operation for exchanging, at a predetermined timing, a first cap member C1 which might possibly be degraded for a new (clean) second cap member C2.

An explanation will be made below with reference to plan views shown in FIGS. 15 to 26 and a flow chart shown in FIG. 30 about the sequence for exchanging the first cap member C1 for the second cap member C2. Note that in the flow chart shown in FIG. 30, the first cap member C1 is referred simply to as "C1", the second cap member C2 is referred simply to as "C2", and the liquid immersion space LS is referred simply to as "LS". During the cap member exchange sequence to be explained below, the seal member 30 always concurrently performs the supply operation of the liquid LQ and recovery operation of the liquid LQ using the flow passage 81.

Figure 15:
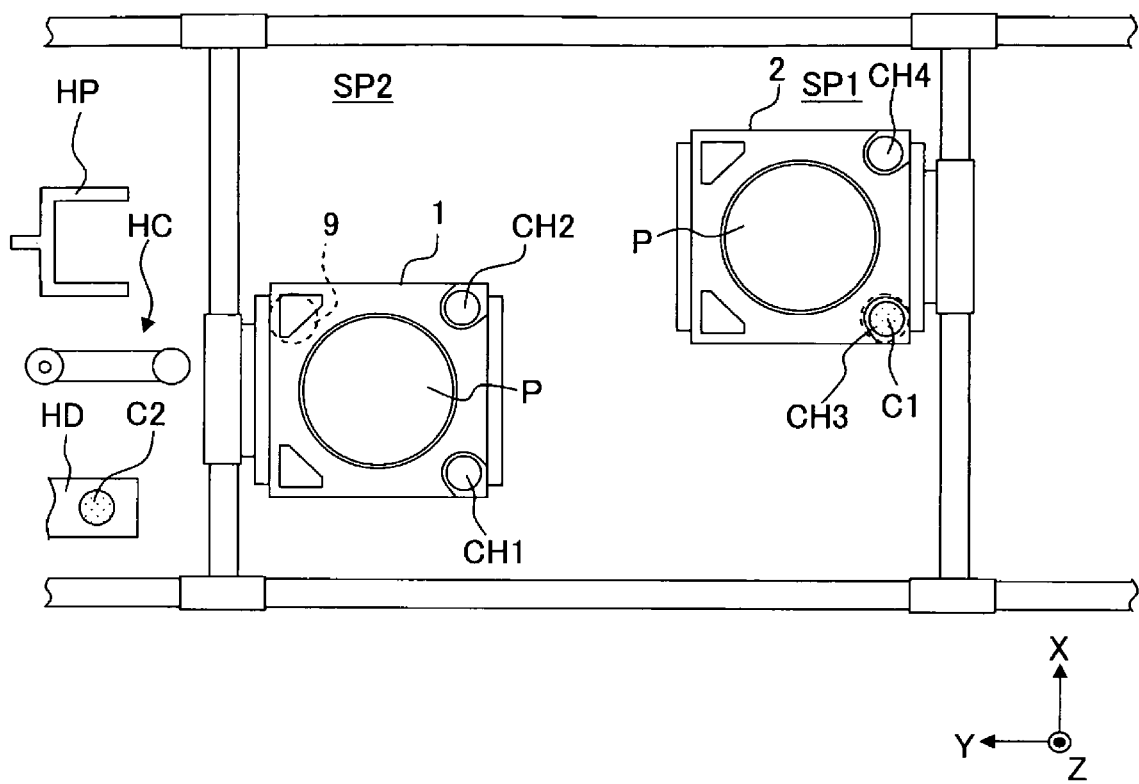
FIG. 15 illustrates the exposure method according to the first embodiment.
Figure 16:
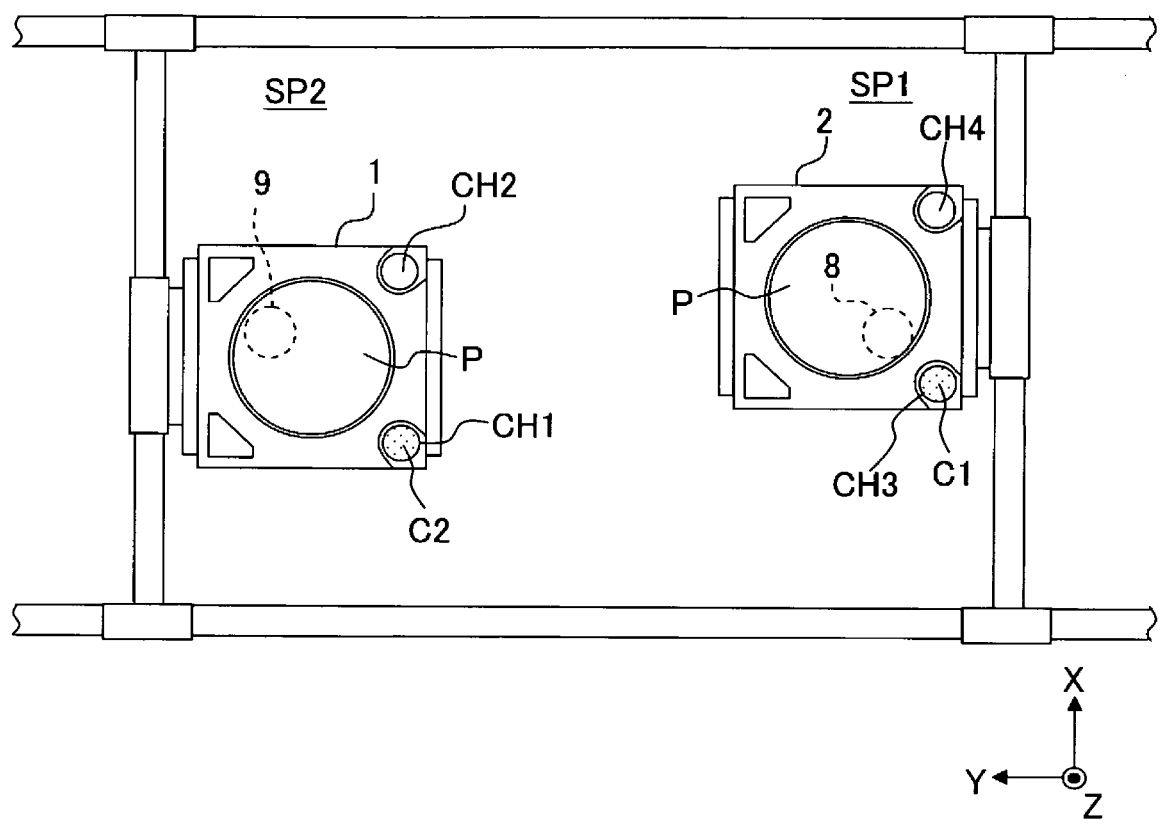
FIG. 16 illustrates the exposure method according to the first embodiment.

In FIG. 15, for the purpose of exchanging the first cap member C1 for the second cap member C2, the controller 7 uses the cap member transport system HS to transport the second cap member C2 placed on the placing table HD to the first cap holder CH1 of the first substrate stage 1 arranged at the measuring station ST2. With this, as shown in FIG. 16, the second cap member C2 is held, in the measuring station ST2, by the first cap holder CH1 of the first substrate stage 1. Further, the controller 7 is capable of performing the substrate exchange operation with respect to the first substrate stage 1 by the substrate transport system HP concurrently with at least a part of the transport operation of the second cap member C2 by the cap member transport system HC. Next, the controller 7 performs the measurement process using the alignment system AL etc. as described above (MS1).

Further, the controller 7 is capable of performing, in the exposure station ST1, the liquid immersion exposure of the substrate P held in the second substrate table 2 concurrently with at least a part of the transport operation of the second cap member C2 to the first cap member CH 1 performed in the measuring station ST2 by the cap member transport system HC. In the exposure station ST1, the second substrate stage 2 in which the substrate is held at the position opposite to the first optical element 8 is arranged and the liquid immersion space LS is formed between the first optical element 8 and the second substrate stage 2.

Upon exposing the substrate P held to the second substrate stage 2, the first cap member C1 held to the seal member 30 is released from the seal member 30 and is held by the third cap holder CH3. The controller 7 exposes the substrate P held in the second substrate stage 2 in the state that the first cap member C1 is held by the third cap holder CH3 (ES1).

Figure 17:
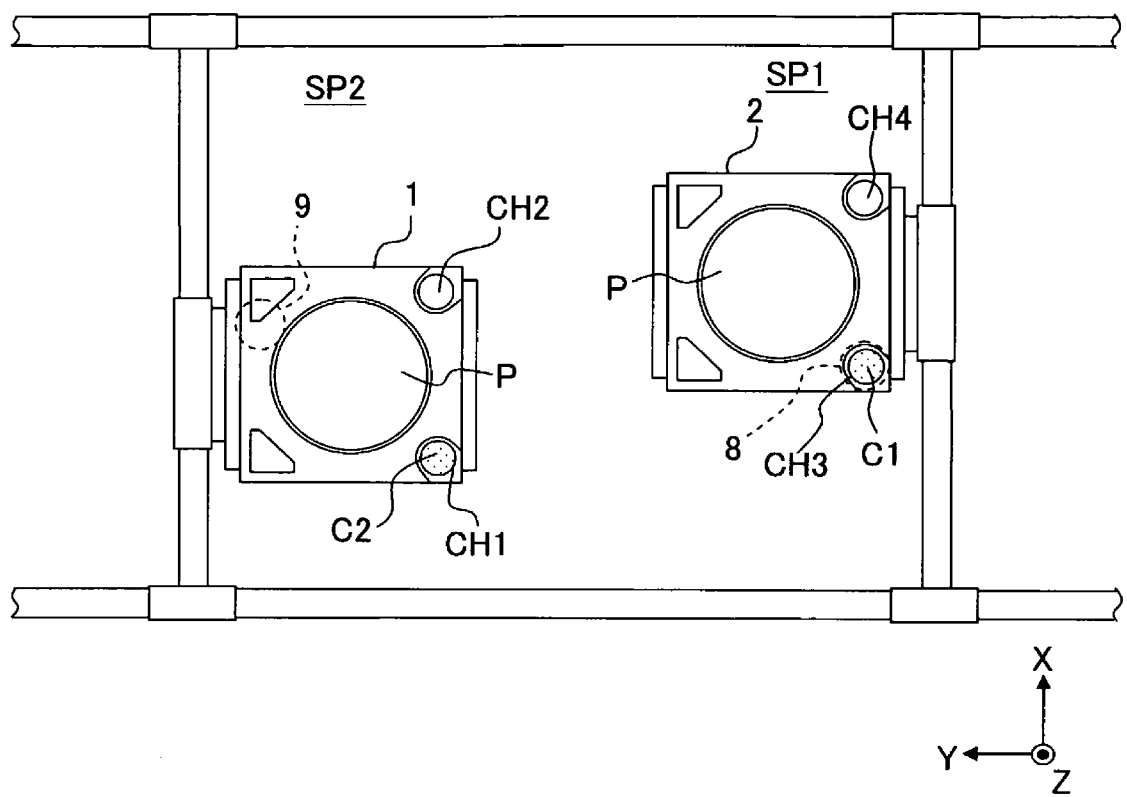
FIG. 17 illustrates the exposure method according to the first embodiment.

As shown in FIG. 17, after the liquid immersion exposure is completed for the substrate P on the second substrate stage 2, the controller 7 controls the substrate stage-driving system 5 to move the second substrate stage 2 in the XY directions so that the state, that the light exit surface of the first optical element 8 is opposite to the surface of the substrate P held by the substrate holder 23 in the second substrate stage 2, is changed to a state that the light exit surface of the first optical element 8 is opposite to the upper surface of the first cap member C1 held by the third cap holder CH3 of the second substrate stage 2 (ES2). Accordingly, the liquid immersion space LS is formed between the light exit surface of the first optical element 8 and the upper surface of the first cap member C1 held by the third cap holder CH3. When attention is made to the liquid retained by the seal member 30 between the seal member 30 and the first optical element 8, it is possible to see that the liquid LQ is moved on the second substrate stage 2 from the substrate P to the first cap member C1, namely the liquid LQ is moved from the space between the first optical element 8 and the substrate P to another space between the first optical element 8 and the first cap member C1.

Subsequently, the controller 7 stops the holding of the first cap member C1 having been effected by the third cap holder CH3 to thereby release the first cap member C1 from the third cap holder CH3, and the controller 7 utilizes the sucking-attracting action of the gas bearing 87 to hold the first cap member C1 with the seal member 30. The first cap member C1, which is held by the seal member 30, is arranged at the position opposite to the light exit surface of the first optical element 8.

The first cap member C1, held by the seal member 30, can retain the liquid LQ between the first optical member 8 and the first cap member C1, and the liquid immersion space LS is formed between the first optical element 8 and the first cap member C1 which is held by the seal member 30.

After moving the opposing surface 25 of the second substrate table 22 to a position lower than (in the −Z direction with respect to) the lower surface of the first cap member C1 in the state that the first cap member C1 is held by the seal member 30, the controller 7 moves the first substrate stage 1 from the first area SP1 to the third area SP3 (ES3).

Figure 18:
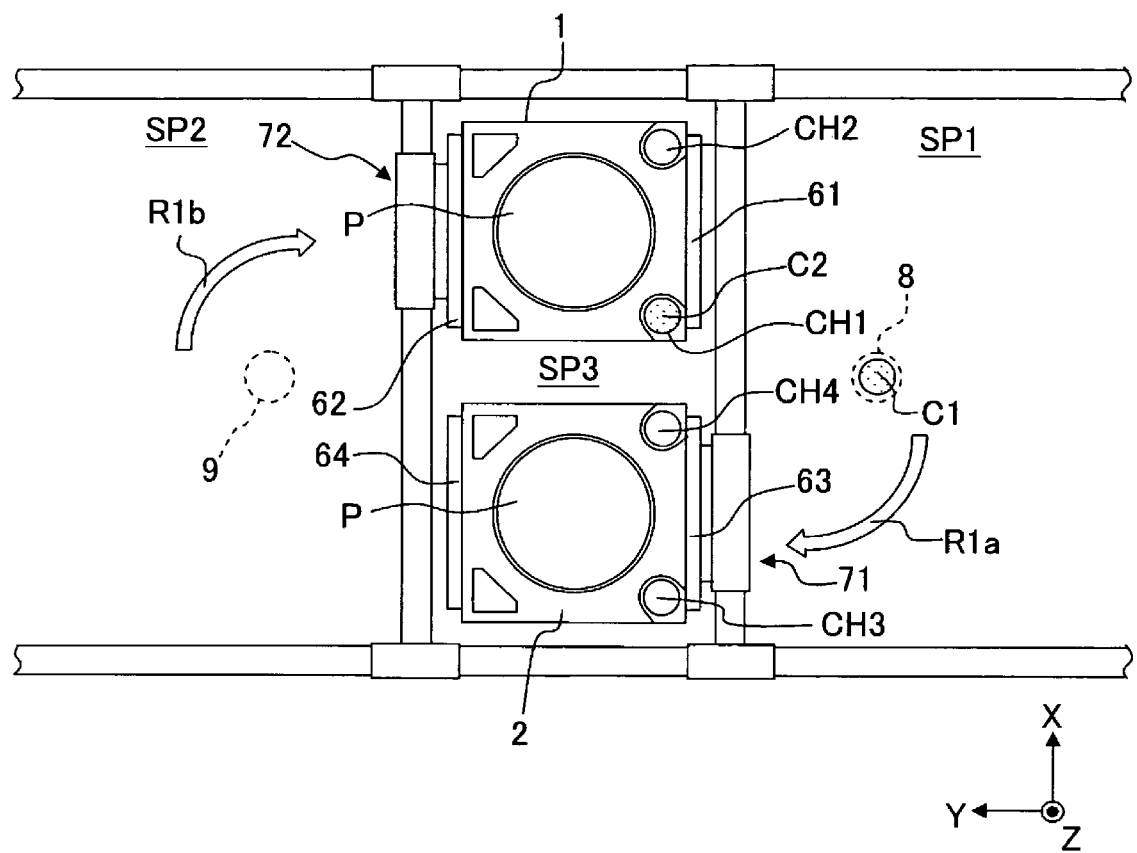
FIG. 18 illustrates the exposure method according to the first embodiment.

Subsequently, the controller 7 controls the substrate stage-driving system 5 to move each of the first substrate stage 1 and the second substrate stage 2 to the third area SP3 as shown in FIG. 18, while using the measuring system 6 to measure the positions of the first and second substrate stages 1, 2. The first substrate stage 1 is moved from the second area SP2 to the third area SP3 while holding the second cap member C2 to the first cap holder CH1 (MS2). The second substrate stage 2, moved from the first area SP1 to the third area SP3, is arranged in the area which is included in the third area SP3 and which is on the −X side as shown in the drawing; and the first substrate stage 1 moved from the second area SP2 to the third area SP3 is arranged in the area which is included in the third area SP3 and which is on the +X side as shown in the drawing. When the second substrate stage 2 is moved from the first area SP1 to the third area SP3, the second substrate stage 2 is moved along a route indicated by an arrow R1a in FIG. 18; and when the first substrate stage 1 is moved from the second area SP2 to the third area SP3, the first substrate stage 1 is moved along a route indicated by an arrow R1b in FIG. 18.

Figure 19:
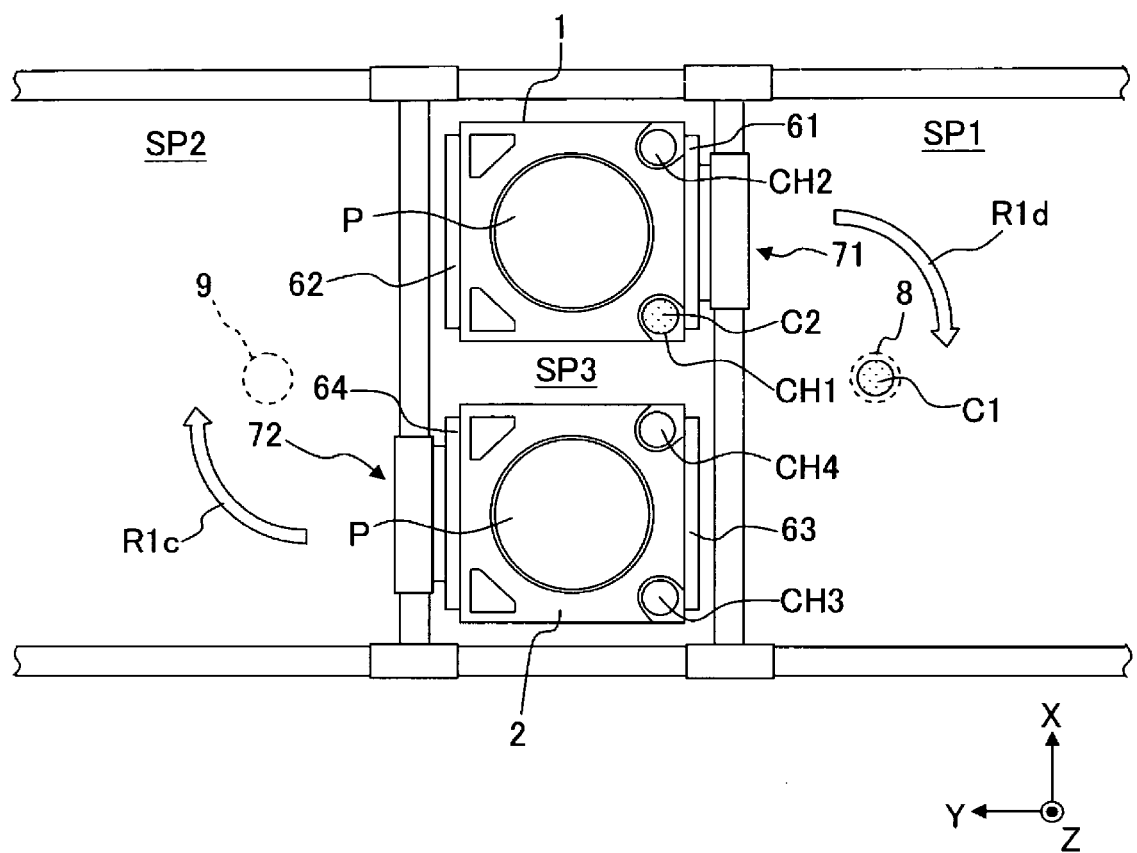
FIG. 19 illustrates the exposure method according to the first embodiment.

Subsequently, as shown in FIG. 19, the controller 7 executes the release of the connection between the first connecting member 71 and the third joint member 63 of the second substrate stage 2 and the release of the connection between the second connecting member 72 and the second joint member 62 of the first substrate stage 1 in the third area SP3; and the controller 7 executes the connection between the first connecting member 71 and the first joint member 61 of the first substrate stage 1 and the connection between the second connecting member 72 and the fourth joint member 64 of the second substrate stage 2 in the third area SP3. In this way, the controller 7 executes the exchange operation for the first connecting member 71 and the second connecting member 72 with respect to the first substrate stage 1 and the second substrate stage 2 in the third area SP3.

Subsequently, the controller 7 controls the substrate stage-driving system 5 to move the first substrate stage 1 to the first area SP1 of the exposure station ST1, and to move the second substrate stage 2 to the second area SP2 of the measuring station ST2 (MS2, ES3). When the second substrate stage 2 is moved from the third area SP3 to the second area SP2, the second substrate stage 2 is moved along a route indicated by an arrow R1c in FIG. 19; and when the first substrate stage 1 is moved from the third area SP3 to the first area SP1, the first substrate stage 1 is moved along a route indicated by an arrow R1d in FIG. 19.

Figure 20:
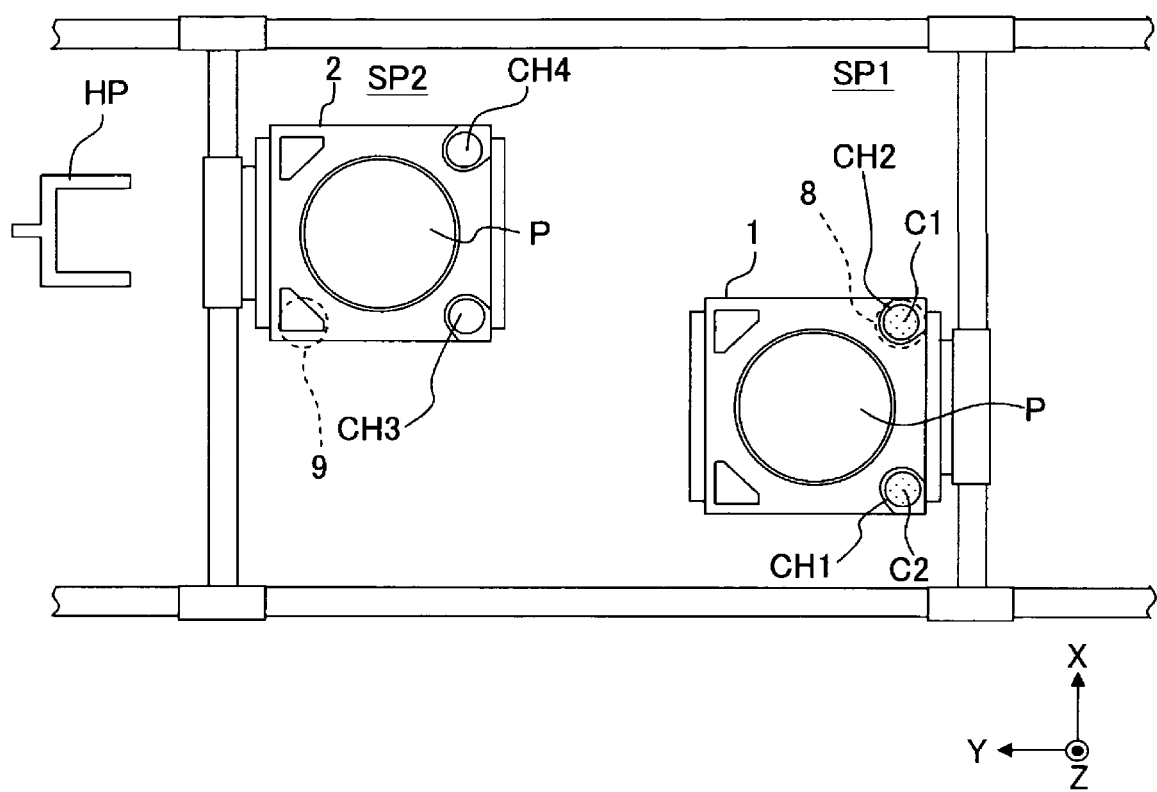
FIG. 20 illustrates the exposure method according to the first embodiment.

As shown in FIG. 20, in the measuring station ST2, the exchange operation of substrate P with respect to the second substrate stage 2 is performed by the substrate transport system HP, and the measurement process for another substrate P held on the second substrate stage 2 is performed (MS3).

On the other hand, in the exposure station ST1, the controller 7 moves the first substrate stage 1 so that the first cap member C1 held by the seal member 30 faces the second cap holder CH2 of the first substrate stage 1. Subsequently, the controller 7 releases, from the seal member 30, the first cap member C1 having been held by the seal member 30 and makes the first cap member C1 to be held by the second cap holder CH2. The first cap holder CH1 holds the second cap member C2.

Then, after the first cap member C1 is held by the second cap holder CH2, the controller 7 controls the substrate stage-driving system 5 to move the first substrate stage 1 in the XY directions so that the state that the light exit surface of the first optical element 8 is opposite to the upper surface of the first cap member C1 held by the second cap holder CH2 of the first substrate stage 1, is changed to a state that the light exit surface of the first optical element 8 is opposite to the surface of the substrate P held by the substrate holder 13 of the first substrate stage 1. Accordingly, the liquid immersion space LS is formed between the light exit surface of the first optical element 8 and the surface of the substrate P held by the substrate holder 13 of the first substrate stage 1 (ES4). When attention is made to the liquid retained by the seal member 30 between the seal member 30 and the first optical element 8, it is possible to see that the liquid LQ is moved on the first substrate stage 1 from the first cap member C1 to the substrate P, namely the liquid LQ is moved from the space between the first optical element 8 and the first cap member C1 to another space between the first optical element 8 and the substrate P.

Figure 21:
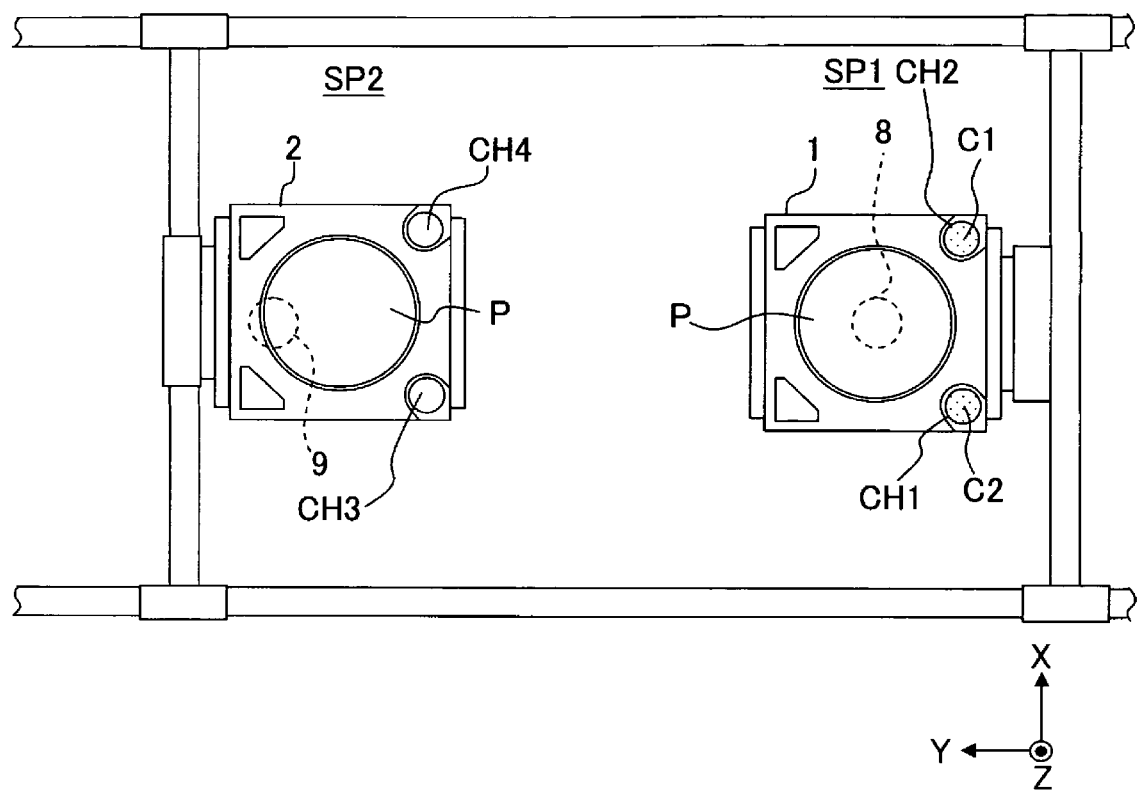
FIG. 21 illustrates the exposure method according to the first embodiment.

Then, as shown in FIG. 21, the controller 7 holds the first cap member C1 with the second cap holder CH2 of the first substrate stage 1 and performs the liquid immersion exposure for the substrate P in a state that the light exit surface of the first optical element 8 is opposite to the surface of the substrate P held by the first substrate stage 1 and that the second cap member C2 is held by the first cap holder CH1 and (ES5).

Figure 22:
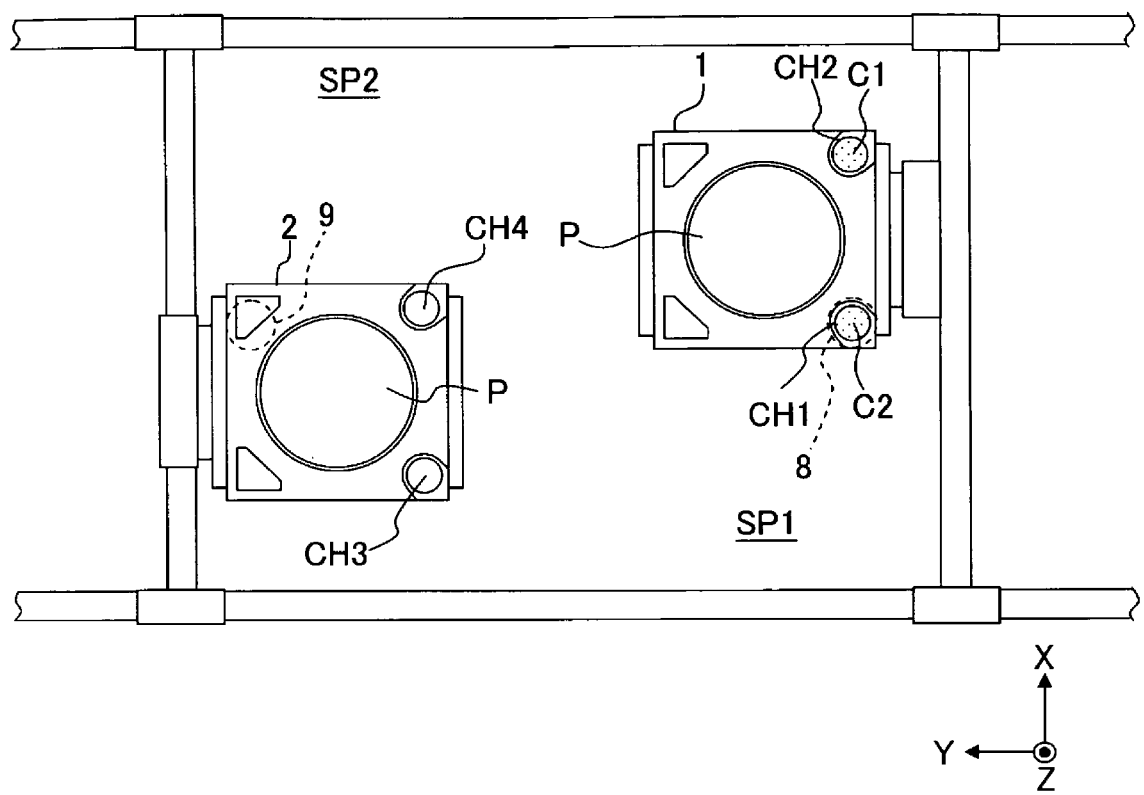
FIG. 22 illustrates the exposure method according to the first embodiment.

After the liquid immersion exposure is completed for the substrate P on the first substrate stage 1, the controller 7 controls the substrate stage-driving system 5 to move the first substrate stage 1 in the XY directions so that the state, that the light exit surface of the first optical element 8 is opposite to the opposing surface 15 of the substrate stage 1 or to the surface of the substrate P held by the substrate holder 13 in the first substrate stage 1, is changed to a state that the light exit surface of the first optical element 8 is opposite to the upper surface of the second cap member C2 held by the first cap holder CH1 of the first substrate stage 1. Accordingly, as shown in FIG. 22, the liquid immersion space LS is formed between the light exit surface of the first optical element 8 and the upper surface of the second cap member C2 held by the first cap holder CH1 (ES6). When attention is made to the liquid retained by the seal member 30 between the seal member 30 and the first optical element 8, it is possible to see that the liquid LQ is moved on the first substrate stage 1 from the substrate P or the opposing surface 15 to the second cap member C2, namely the liquid LQ is moved from the space between the first optical element 8 and the substrate P or the opposing surface 15 to another space between the first optical element 8 and the second cap member C2.

In such a manner, the controller 7 changes the state that the first optical member 8 is opposite to the first cap member C1 held by the seal member 30 to the state that the first optical element 8 is opposite to the second cap member C2 held by the first cap holder CH1, via a state that the first cap member C1 is held by the second cap holder CH2 and the first optical element 8 is opposite to the first substrate stage 1 including the substrate P (including the exposure state).

Then, the controller 7 releases the second cap member C2 held by the first cap holder CH1 from the first cap holder CH1 to be held by the seal member 30. The second cap member C2, held by the seal member 30, retains the liquid LQ between the first optical element 8 and the second cap member C2. The second cap holder CH2 holds the first cap member C1.

Figure 23:
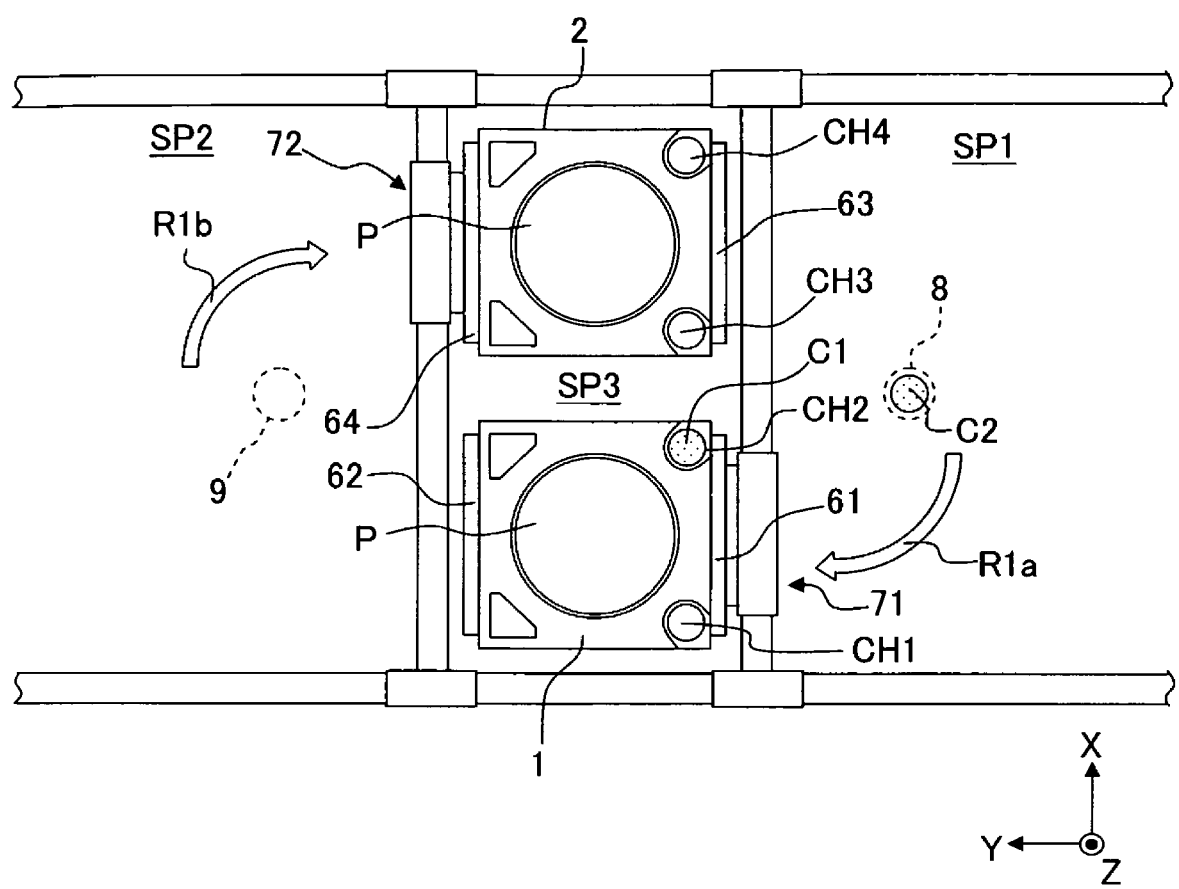
FIG. 23 illustrates the exposure method according to the first embodiment.
Figure 24:
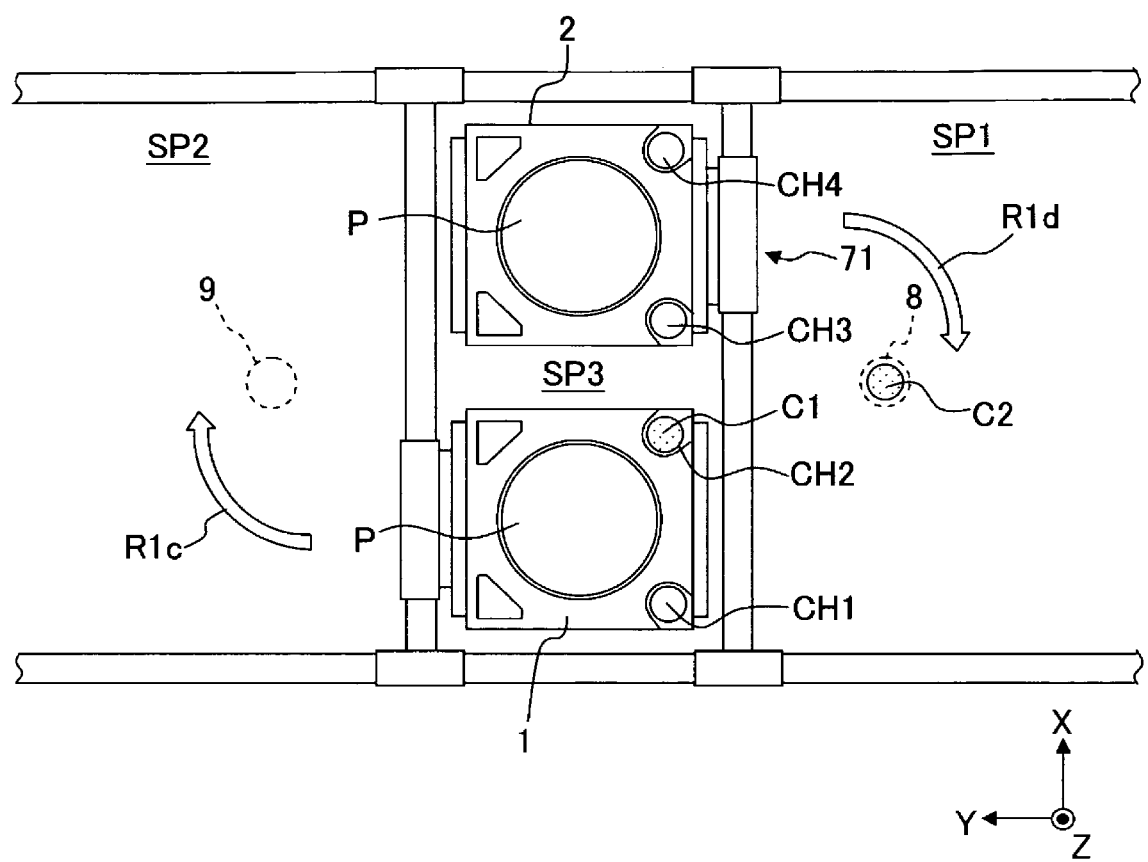
FIG. 24 illustrates the exposure method according to the first embodiment.

The controller 7 controls the substrate stage-driving system 5 in a state that the first cap member C1, released from the seal member 30, is held by the second cap holder CH2 to start to move the first substrate stage 1 to the second area SP2, and starts to move the second substrate stage 2 to the first area SP1. Namely, as shown in FIG. 23, the controller 7 moves, to the third area SP3, each of the second substrate stage 2 holding the substrate P for which the measurement process has been completed in the measuring station ST2 and the first substrate stage 1 holding the first cap member C1 and another substrate P for which the exposure process has been completed in the exposure station ST1 (MS4, ES7). Then, as shown in FIG. 24, the controller 7 executes the exchange operation for the first connecting member 71 and the second connecting member 72 with respect to the first substrate stage 1 and the second substrate stage 2 in the third area SP3.

Subsequently, the controller 7 controls the substrate stage-driving system 5 to move the second substrate stage 2 to the first area SP1 of the exposure station ST1, and to move the first substrate stage 1 holding the first cap member C1 to the second area SP2 of the measuring station ST2 (MS4, ES7)

Figure 25:
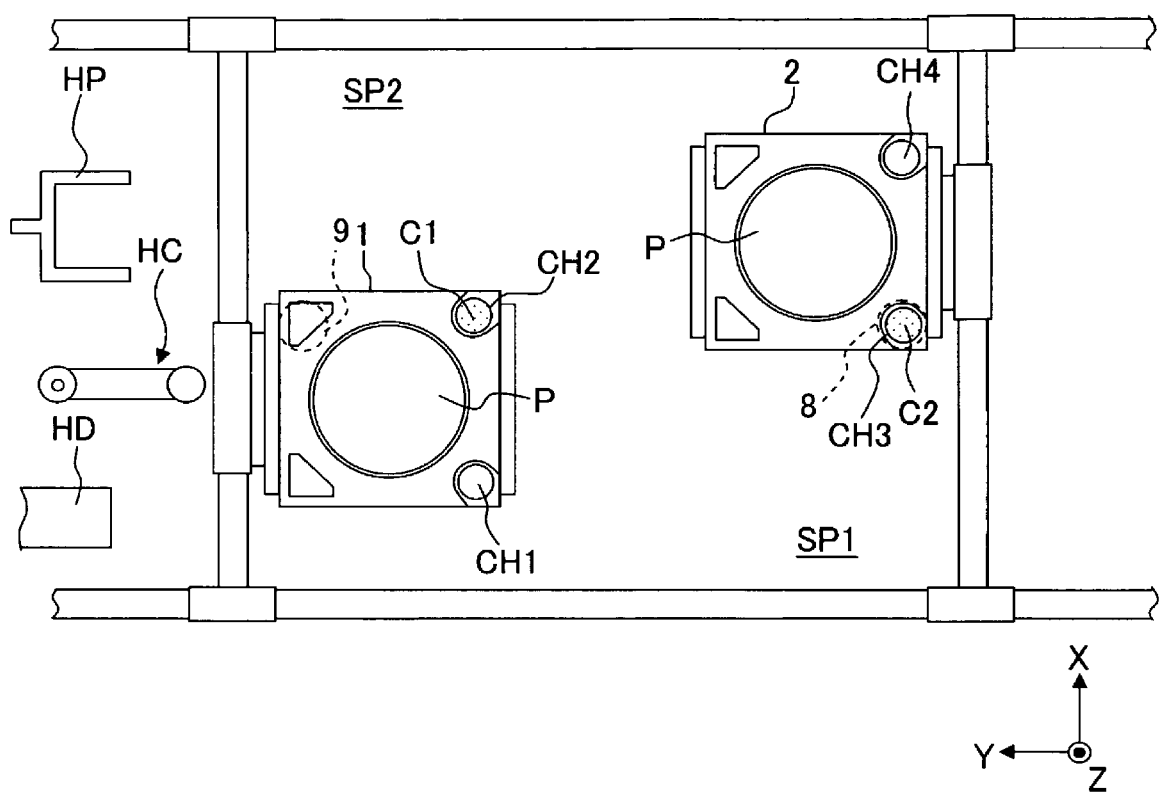
FIG. 25 illustrates the exposure method according to the first embodiment.

Next, after the controller 7 makes the second cap member C2 held by the seal member 30 to be opposite to or to face the third cap holder CH3 of the second substrate stage 2 moved to the first area SP1 as shown in FIG. 25, the controller 7 releases the second cap member C2 held by the seal member 30 from the seal member 30, and holds the second cap member C2, released from the seal member 30, by the third cap holder CH3 of the second substrate stage 2. When attention is made to the operation shown in FIGS. 22 to 25, it is possible to deem that the liquid LQ is moved from the first substrate stage 1 to the second substrate stage 2. Then, the controller 7 execute the liquid immersion exposure for the substrate P held by the substrate holder 23 of the second substrate stage 2 in the state that the second cap member C2 is held by the third cap holder CH3 of the second substrate stage 2 (ES8).

Further, the controller 7 performs the substrate exchange operation and the measurement process using the substrate stage 1 arranged at the measuring station ST2 concurrently with at least a part of the process using the second substrate stage 2 arranged at the exposure station ST1 (MS5).

Figure 26:
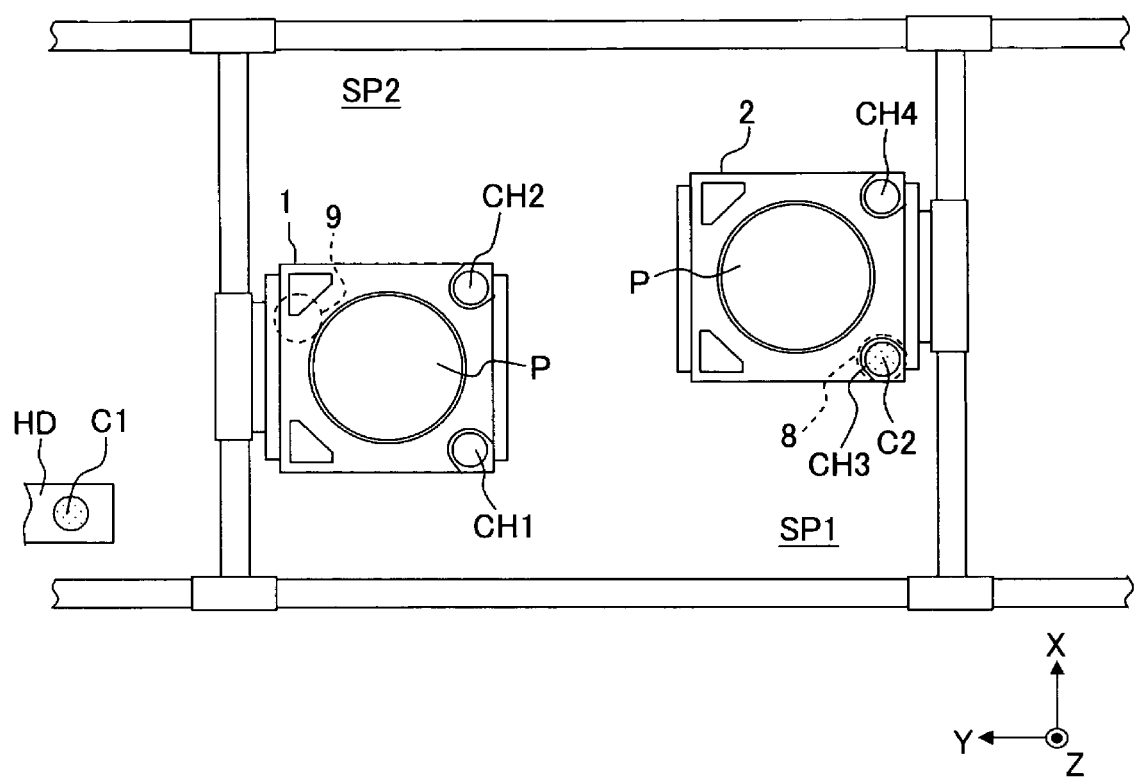
FIG. 26 illustrates the exposure method according to the first embodiment.

Furthermore, as shown in FIG. 25, the controller 7 uses the cap member transport system HC to transport, in the measuring station ST2, the first cap member C1, which has been released from the seal member 30 and which is held by the second cap holder CH2, to the placing stand HD (MS5). The cap member transport system HS transports, to the placing stand HD, the first cap member C1 released from the second cap holder CH2 of the first substrate stage 1 moved to the second area SP2 of the measuring station ST2. By doing so, the collection (recovery) of the first cap member C1 is completed, and as shown in FIG. 26, the first cap member C1 is placed on the placing stand HD.

The exposure apparatus EX executes the ordinary exposure sequence by using the second cap member C2, as explained referring to FIGS. 9 to 14.

The placing stand HD is constructed such that an external apparatus can access to the placing stand HD. The external apparatus include, for example, a transport system which transports the first cap member C1 transported to the placing stand HD to the outside of the exposure apparatus EX, a cleaning system which is capable of cleaning the first cap member C1, and the like. The first cap member C1, transported to the placing stand HD by the cap member transport system HC, is processed by the external apparatus (MS6). For example, when the external apparatus includes the cleaning system, then the first cap member C1 is transported (exported) to the outside of the exposure apparatus EX, the first cap member C1 is transported to the cleaning system, and then the first cap member C1 is subjected to the cleaning process (washing process) by the cleaning system. In the embodiment, the cleaning system has a construction same as that of a cleaning system CS, which will be explained later in the second embodiment and which cleans the first cap member C1, for example, by using a cleaning liquid. Alternatively, the cleaning system may clean the first cap member C1 by using, for example, the so-called ultrasonic cleaning technique in which the first cap member C1 is cleaned by applying the ultrasonic vibration to the cleaning liquid brought into contact with the first cap member C1. The first cap member C1, for which the cleaning process has been performed, is placed on the placing stand HD again. Further, the exchange operation for exchanging the second cap member C2 for the first cap member C1 is performed at a predetermined timing. The controller 7 is capable of performing the exchange operation of the first cap member C1 for the second cap member C2 by executing the sequence as explained with reference to FIGS. 15 to 26 and by performing the steps as shown in the flow chart of FIG. 30.

Note that in the embodiment, the first cap member C1 transported to the placing stand HD may be exported to the outside of the exposure apparatus EX; and after that, without reusing the transported first cap member C1, a new cap member may be placed on the placing stand HD and the second cap member C2 may be exchanged for the new cap member. This new cap member may be a reused cap member, rather than an unused cap member.

Alternatively, the placing stand HD may be constructed to be accessible by an operator; the first cap member C1 placed on the placing stand HD may be transported to the outside of the exposure apparatus EX by the operator; or the first cap member C1 may be subjected to the cleaning process by the operator.

The controller 7 uses the substrate transport system HP to thereby make it possible to execute the operation for unloading the substrate P, for which the exposure process has been completed in the exposure station ST1, from the substrate holder 13 of the first substrate stage 1 concurrently with at least a part of the operation for transporting, by using the cap member transport system HC, the first cap member C1 from the second cap holder CH2 of the first substrate stage 1 to the placing stand HD.

It is also possible to execute the unload operation for the substrate P, on the first substrate stage 1, for which the exposure process has been completed in the exposure station ST1, concurrently with at least a part of the exporting (transporting) operation for exporting the first cap member C1 transported to the placing stand HD to the outside of the exposure apparatus EX.

Here, the first substrate stage 1 is used to transport a new (clean) second cap member C2 to the position opposite to the light exit surface of the first optical element 8 and to transport the first cap member C1 which might possibly be degraded to the placing stand HD. However, it is of course allowable to use the second substrate stage 2. Further, in the embodiment, in the operation for exchanging the second cap member C2, which might possibly be degraded, for a first cap member C1 for which the cleaning process has been performed, it is allowable to use either one of the first and second substrate stages 1 and 2. In this case, for example, right before the exchange time (timing) at which the exchange of the second cap member C2 is required, the first cap member C1 on the placing stand HD may be transported to one of the first and second substrate stages 1, 2 and the second cap member C2 may be exchanged for the first cap member C1. Alternatively, it is allowable that the first cap member C1 on the placing stand HD is previously transported to one of the first and second substrate stages 1 and 2, and the second cap member C2 is exchanged for the first cap member C1 at the exchange timing.

As described above, according to this embodiment, the exchange system CHS is provided which is capable of exchanging the first cap member C1 for the second cap member C2. Therefore, it is possible to exchange the first cap member C1 which might possibly be degraded for a new cap member C2 smoothly without interrupting or pausing the operation of the exposure apparatus EX for a long period of time. Accordingly, it is possible to suppress the lowering in the performance of the exposure apparatus EX due to the degraded first cap member C1 while suppressing the lowering in the operation rate of the exposure apparatus EX.

Further, according to the embodiment, an object (at least one of the first cap member C1, first substrate stage 1, substrate P held in the first substrate stage 1, second cap member 2, second substrate stage 2, substrate P held in the second substrate stage 2) is always arranged at the position opposite to the light exit surface of the first optical element 8 not only during the ordinary exposure sequence but also during the exchange sequence for the cap member. Therefore, it is possible to perform the exchange operation of the first cap member C1 for the second cap member C2 while always forming the liquid immersion space LS between the object and the light exit surface of the first optical element 8. In other words, the exchange operation can be performed for the first and second cap members C1, C2 without performing an operation for recovering all the liquid in the liquid immersion space LS.

When the operation of recovering all the liquid LQ in the liquid immersion space LS is performed, there is a possibility that various inconveniences or problems might occur due to the evaporation of the liquid LQ. For example, when all the liquid is recovered, then the degradation of the exposure accuracy is caused such that adhesion mark (water mark) of the liquid LQ is formed, due to the vaporization of the liquid LQ, on the light exit surface of the first optical element 8 etc.; the temperature change is caused by the heat of vaporization of the liquid LQ to thermally deform, for example, various members of the exposure apparatus EX and the optical path of the exposure light EL is varied, and the like. Further, in a case that the supply operation of the liquid LQ via the flow passage 81 is stopped to recover all the liquid LQ and afterwards the supply operation of the liquid LQ is restarted to form the liquid immersion space LS again, then there is a possibility that time is required for forming a satisfactory liquid immersion space LS. In this embodiment, since an object is always arranged at the position opposite to the light exit surface of the first optical element 8 to thus make it possible to continuously form the liquid immersion space LS, it is possible to perform exchange of the first cap member C1 for the second cap member C2 smoothly and effectively while suppressing the above-described inconveniences or problems from occurring.

Further, according to this embodiment, the first and second cap members C1, C2 released from the seal member 30 is transported to the predetermined position which is different from the seal member 30 and the first to fourth cap holders CH1 to CH4 by using the cap member transport system HC. Therefore, the appropriate process (for example, the cleaning process, the exchange process) can be executed for the first and second cap member C1, C2 transported to the predetermined position in order to suppress the deterioration of the performance of the exposure apparatus EX which would be otherwise caused due to the first and second cap members C1, C2.

In this embodiment, the cap member transport system HC is arranged in the measuring station ST2. The first and second cap members C1, C2, released from the first to fourth cap holders CH1 to CH4 of the first and second substrate stages 1, 2 moved to the measuring station ST2, is moved to the predetermined position (the placing stand HD in this embodiment). Accordingly, it is possible to smoothly execute the transport operation for transporting the first cap member C1 (or second cap member C2); and it is possible to perform, for example, the unload operation for unloading the substrate P held by the substrate holder 13, 23 of the first and second substrate stages 1, 2 after the exposure process for the substrate P held in the substrate holder 13, 23 of the first and second substrate stages 1, 2 concurrently with the transport operation performed by the cap member transport system HC for the first and second cap members C1, C2 held by the first to fourth cap holders CH1 to CH4 of the first and second first substrate stages 1, 2.

In this embodiment, the first cap member C1 (or the second cap member C2) is transported to the placing stand HD of the measuring station ST2. However, the first cap member C1 (or the second cap member C2) may be transported to any position other than the placing stand HD provided that the predetermined process can be executed for the first cap member C1 (or the second cap member C2) in order to suppress the deterioration of the performance of the exposure apparatus EX.

Note that in this embodiment, it is possible to execute the exchange operation regarding the first and second cap members C1, C2 by using the exchange system CHS at a predetermined timing such as every predetermined period of time, etc. Further, the exchange operation regarding the first and second cap members C1, C2 by using the exchange system CHS may be executed every time when the exposure has been performed for a predetermined number of the substrates P or every time when the exposure has been performed for a lot of the substrate P. Furthermore, the controller 7 may determine whether or not the exchange operation regarding the first and second cap members C1, C2 is required or determine the timing for performing the exchange operation. In this case, the exchange system CHS is driven by an instruction from the controller 7.

For example, if the first cap member C1 is polluted in the state that the first cap member C1 is held by the cap holder CH1 (or the cap holder CH3), there is a possibility that a lot of pattern defects might arise, due to the polluted first cap member C1, in the vicinity of the first cap holder CH1 (or the third cap holder CH3) on the surface of the substrate P held by the substrate holder 13 (or the substrate holder 23). Therefore, when the substrate P after the exposure process is inspected by a defect-inspecting device and when a lot of pattern defects appear in the area of the surface of the substrate P in the vicinity of the first cap holder CH1 (or the third cap holder CH3) holding the first cap member C1, then it can be postulated that the first cap member C1 is polluted. Accordingly, the following procedure may be adopted that when the substrate P after the exposure process is inspected by the defect-inspecting device and it is judged based on the inspection result that a lot of pattern defects appear in the area of the surface of the substrate P in the vicinity of the first cap holder CH1 (or the third cap holder CH3) holding the first cap member C1, then it is allowable to execute the exchange process for exchanging the first cap member C1 for the second cap member C2. For example, when the exposure apparatus EX and the inspection device for inspecting the substrate are connected via a communication line, the controller 7 can control the exchange system CHS based on the information from the inspecting device.

For example, an observing device (for example, a camera), which includes an image pickup device capable of photographing or imaging an image (optical image) of, for example, the first cap member C1, may be provided; and based on the image pickup result, the exchange operation for exchanging the first cap member C1 for the second cap member C2 may be executed by using the exchange system CHS. Specifically, if it is judged based on the image pickup result of the observing device that the first cap member C1 is polluted, then the exchange operation for exchanging the first cap member C1 for the second cap member C2 is executed. The observing device may be arranged, for example, at the exposure station ST1 and may be capable of observing the first cap member C1, held by the first substrate stage 1 or the second substrate stage 2, at a position above or over the first cap member C1; or the observing device may be capable of observing the first cap member C1 held by the seal member 30 at a position below or under the first cap member C1.

Second Embodiment

Next, a second embodiment will be explained. In the following description, the constitutive components or parts, which are same as or equivalent to those of the first embodiment described above, are designated by the same reference numerals, and any explanation therefor will be simplified or omitted.

Figure 27:
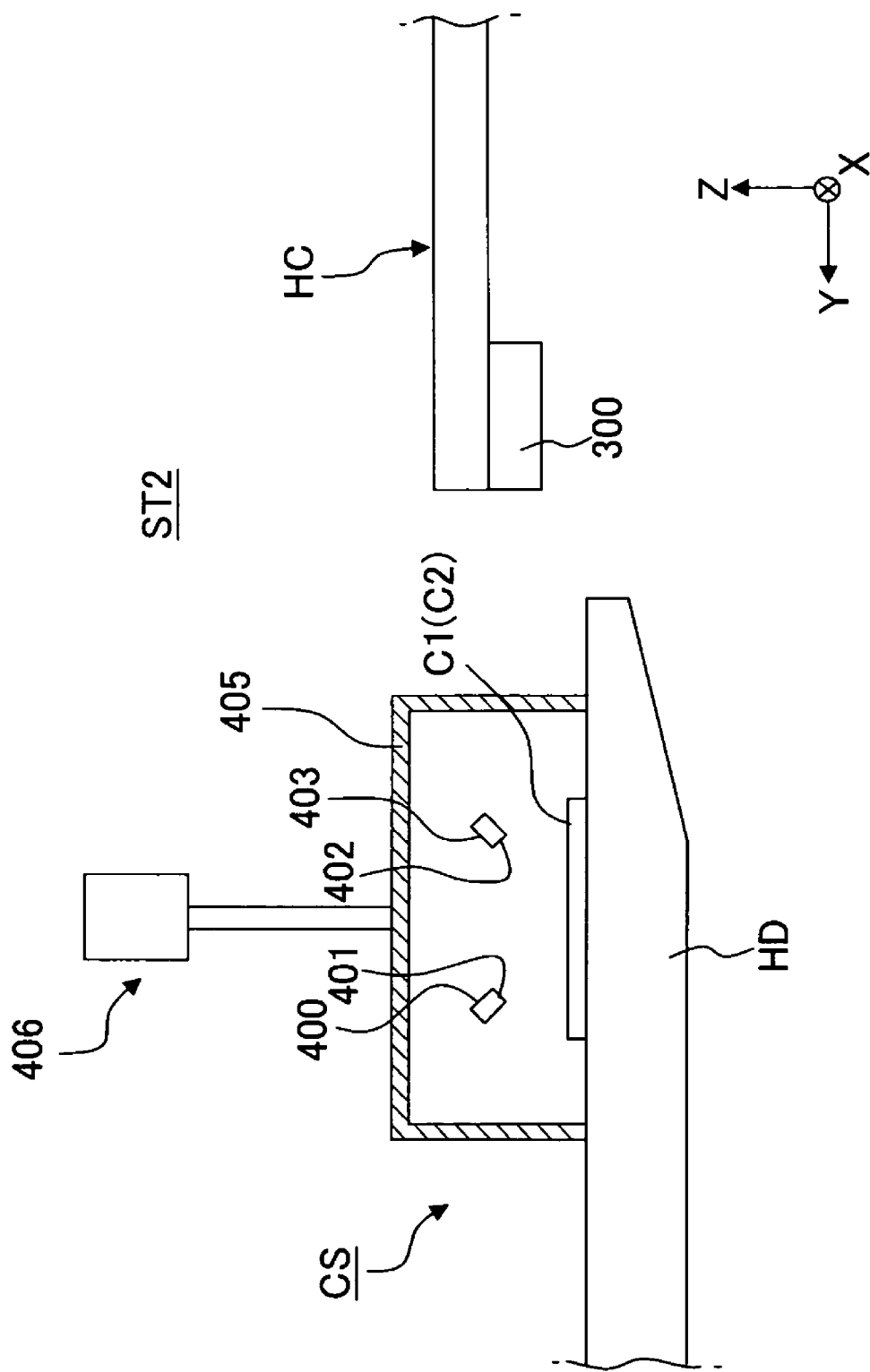
FIG. 27 shows a part of an exposure apparatus according to a second embodiment.

FIG. 27 shows a part of an exposure apparatus EX according to the second embodiment. The feature of the second embodiment is that the exposure apparatus EX is provided with a cleaning system CS which cleans a first cap member C1 (or second cap member C2) which might possibly be polluted or dirtied. In this embodiment, an explanation is made about a case, as an example, in which the cleaning system CS cleans the first cap member C1.

As shown in FIG. 27, the exposure apparatus EX is provided with the cleaning system CS which cleans the first cap member C1. The cleaning system CS is arranged at a predetermined position different from the seal member 30 and the first to fourth cap holders CH1 to CH4. The cleaning system CS is capable of performing the cleaning process for the first cap member C1 transported to the predetermined position. The cleaning system CS cleans the first cap member C1 released from the seal member 30 and the first to fourth cap holders CH1 to CH4.

In this embodiment, the cleaning system CS is arranged in the vicinity of the placing stand HD of the measuring station ST2. In this embodiment, the cap member transport system HC can transport the first cap member C1, released from the seal member 30 and the first to fourth cap holders CH1 to CH4, to the cleaning system CS arranged on the placing stand HD.

The cleaning system CS includes a supply nozzle 400 which has a supply port 401 for supplying the cleaning liquid to the first cap member C1, and a recovery nozzle 403 which has a recovery port 402 for recovering the cleaning liquid supplied to the first cap member C1. The cleaning system CS further includes a chamber mechanism 405 which accommodates the first cap member C1 to be subjected to the cleaning, and a driving device 406 which moves the chamber mechanism 405. When the controller 7 makes the first cap member C1 to be transported to the placing stand HD by using the cap member transport system HC, the controller 7 controls the driving device 406 to move the chamber mechanism 405 in the +Z direction and to move the chamber mechanism 405 away from the placing stand HD so that the cap member transport system HC can transport the first cap member C1 to the placing stand HD. When the controller 7 makes the first cap member C1 to be cleaned by using the cleaning system CS, the controller 7 controls the driving device 406 to move the chamber mechanism 405 in the −Z direction and to move the chamber mechanism 405 closer to the placing stand HD so that the chamber mechanism 405 forms a space for accommodating the first cap member C1 between the chamber mechanism 405 and the placing stand HD.

Next, an explanation will be made about an example of the operation of the cleaning system CS. Note that in the following explanation, the first cap member C1 to be cleaned by the cleaning system CS is exchanged for the second cap member C2 by the exchange system CHS and is transported by the first substrate stage 1 from the position opposite to the light exit surface of the first optical element 8 to the measuring station ST2, as explained in the first embodiment.

In order to clean the first cap member C1 by using the cleaning system CS, the controller 7 uses the cap member transport system HC to transport the first cap member C1, which is held to the second cap holder CH2 of the first substrate stage 1 arranged in the measuring station ST2, from the second cap holder CH2 to the placing stand HD. As described above, upon transporting the first cap member C1 to the placing stand HD, the controller 7 moves the chamber mechanism 405 away from the placing stand HD. After placing the first cap member C1 on the placing stand HD with the cap member transport system HC, the controller 7 moves the chamber mechanism 405 closer to the placing stand HD to form the space between the chamber mechanism 405 and the placing stand HD for accommodating the first cap member C1 therein. In this embodiment, each of the chamber mechanism 405, the placing stand HD, and the boundary portion therebetween is sealed so that the cleaning liquid does not leak, namely the space formed between the chamber mechanism 405 and the placing stand HD is a tightly closed space.

The supply nozzle 400 and the recovery nozzle 403 are arranged inside the space formed between the chamber mechanism 405 and the placing stand HD. The controller 7 supplies the cleaning liquid from the supply port 401 to the first cap member C1 to clean the first cap member C1. Accordingly, the first cap member C1 is cleaned. The cleaning liquid supplied from the supply port 401 is recovered from the recovery port 402.

After completing the cleaning operation with the cleaning system CS, the controller 7 moves the chamber mechanism 405 away from the placing stand HD, and performs, with the exchange system CHS including the cap member transport system HD, the operation for exchanging the cleaned first cap member C1 for the second cap member C2 which might possibly be degraded. After that, the ordinary exposure sequence is started. That is, the liquid immersion exposure and the measurement process are performed as explained in relation to FIGS. 9 to 14 in the first embodiment.

The cleaning system CS may clean the first cap member C1 by using, for example, the so-called ultrasonic cleaning technique in which the first cap member C1 is cleaned by applying the ultrasonic vibration to the cleaning liquid brought into contact with the first cap member C1. In this case, the cleaning system CS includes an ultrasonic washer or cleaner provided with an ultrasonic generator which applies the ultrasonic vibration to the cleaning liquid.

As explained above, the exposure apparatus EX can be provided with the cleaning system CS for cleaning the first cap member C1. When the first cap member C1 is cleaned by using the cleaning system CS provided for the exposure apparatus EX, it is possible to suppress the deterioration of the performance of the exposure apparatus EX which would be otherwise caused due to the pollution of the first cap member C1, etc. Note that in the second embodiment, as an example, the exposure apparatus EX is provided with a part of the external apparatus explained in the first embodiment, namely the cleaning system CS as the processing system. However, the processing system provided on the exposure apparatus EX is not limited to the cleaning system CS. For example, the exposure apparatus EX may include, for example, a mechanism (system) which exchanges the first cap member C1 or the second cap member C2 recovered from the exposure station ST1 for a new cap member. Such a system includes, as an example, a first cassette holding an unused cap member which is to be placed on the placing stand HD; a second cassette which holds the recovered cap member; and a transport device which transports the cap member between the second cassette and the first substrate stage 1 or the second substrate stage 2. In this case, even when the first cap member C1 or the second cap member C2 is polluted or degraded due to the contact with the liquid LQ or the like, it is possible to exchange such polluted or degraded cap member C for a new cap member by the processing system. Accordingly, similar to the second embodiment, it is possible to suppress the lowering in the performance of the exposure apparatus EX, the lowering in working rate (throughput) of the exposure apparatus, and the like. Note that here the first and second cassettes (accommodating or storage device for the cap members) is arranged in the exposure apparatus EX, the first and second cassettes may be arranged at the outside of the exposure apparatus EX.

Figure 28:
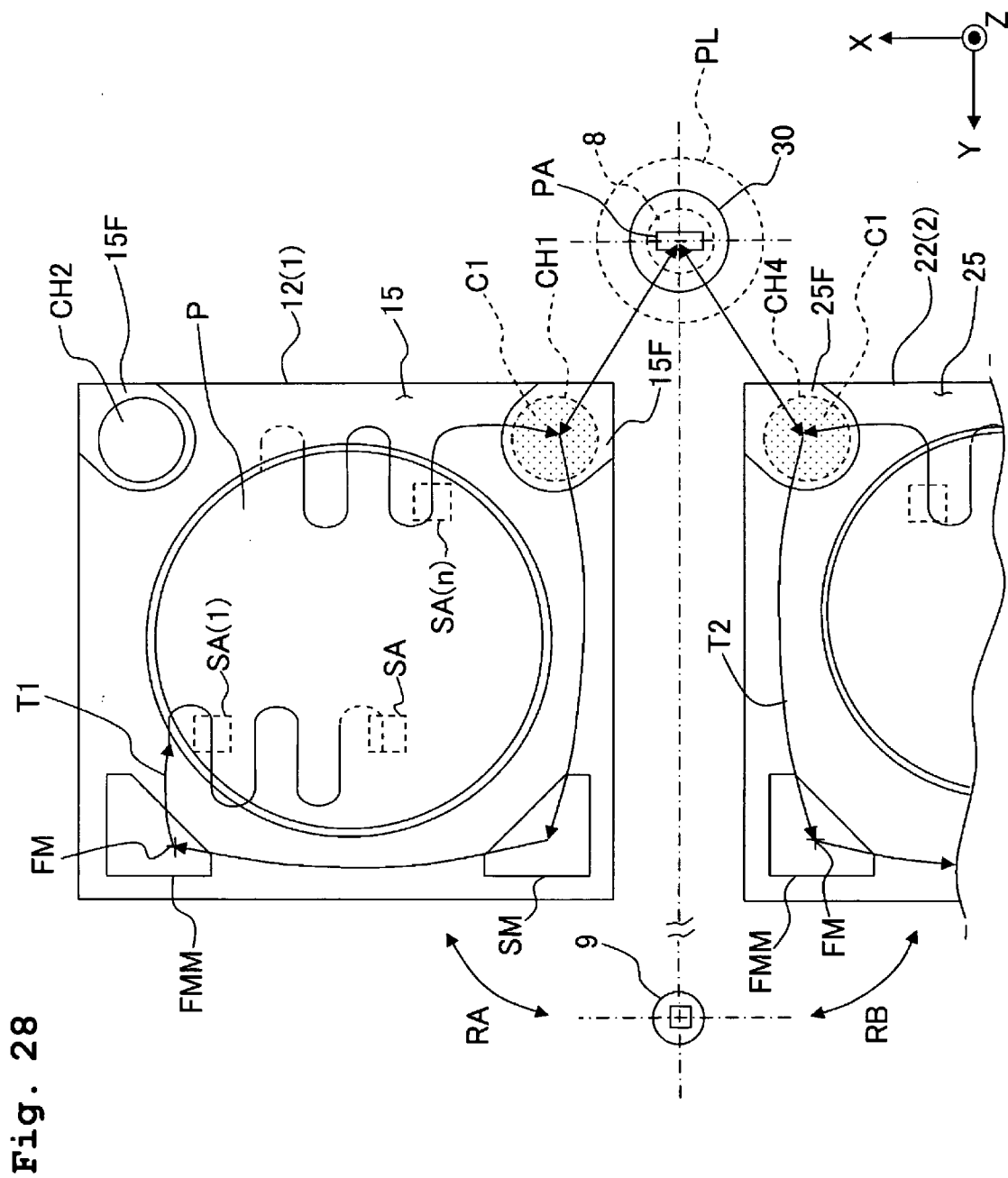
FIG. 28 shows a modification of the exposure apparatus.

In the first and second embodiments described above, the first cap holder CH1 and the third cap holder CH3 holding the first cap member C1 released from the seal member 30 are provided at the approximately identical positions on the first and second substrate tables 12, 22 respectively. However, as shown in FIG. 28, it is allowable to use, as the cap holders holding the first cap member C1 released from the seal member 30, the first cap holder CH1 and the fourth cap holder CH4 provided at different positions on the first and second substrate tables 12, 22 respectively. As shown in FIG. 28, the first cap holder CH1 is arranged at a corner on the −X side and on the −Y side among the four corners of the first substrate table 12; and the fourth cap holder CH4 is arranged at a corner on the +X side and on the −Y side among the four corners of the second substrate table 22. Upon moving each of the first substrate stage 1 and the second substrate stage 2 between the first area SP1 and the second area SP2 in the exposure apparatus EX shown in FIG. 28, the controller 7 controls the substrate stage-driving system 5 so that the first substrate stage 1 always passes across an area on the +X side of the third area SP3 (see an arrow RA shown in FIG. 28), and that the second substrate stage 2 always passes across an area on the −X side of the third area SP3 (see an arrow RB shown in FIG. 28). By doing so, it is possible to shorten the distance between the seal member 30 and the first cap holder CH1 on the first substrate stage 1 existing in the third area SP3 and the distance between the seal member 30 and the fourth cap holder CH4 on the second substrate stage 2 existing in the third area SP3. Therefore, it is possible to quickly perform each of the operation for delivering the first cap member C1 held by the seal member 30 to the first cap holder CH1 and the operation for delivering the first cap member C1 held by the seal member 30 to the fourth cap holder CH4.

The shot areas SA of the substrates P, which are placed on the first substrate table 12 and the second substrate table 22 respectively as shown in FIG. 28, are subjected to the liquid immersion exposure in accordance with the step-and-scan manner as described above. In the exposure performed in the step-and-scan manner, the exposure is executed such that for each of the shot areas SA on the substrate P, the substrate P is moved in the scanning direction (in the +Y direction or in the −Y direction in the drawing) relative to an exposure area PA in which the exposure light EL is radiated in the image field of the projection optical system PL (namely, a projection area of the mask pattern). Further, when the exposure is completed for one shot area SA among the shot areas SA, the substrate P is step-moved in a direction perpendicular to the scanning direction (in the +X direction or in the −X direction shown in the drawing) so that a next shot area SA is positioned at the exposure start position. Such movement loci of the projection area PA on the substrate P are shown as T1 and T2 in FIG. 28 respectively. In each of these embodiments, although the first and second substrate tables 12, 22 are actually moved, the relative movement of the projection area PA with respect to the substrate stages is depicted as the movement loci T1, T2 for the convenience of the explanation.

As shown in FIG. 28, when the first cap holder CH1 of the first substrate table 12 receives the first cap member C1 which maintains (retains) the liquid immersion area LS, then the projection area PA (as well as the liquid immersion area LS) is moved along the movement locus T1 by the movement of the first substrate table 12. On the first substrate table 12, the projection area PA (as well as the liquid immersion area LS) arrives, via the measuring member SM and the reference member FMM, to an exposure start position for a shot area SA(1) which is first to be exposed on the substrate P. Note that during this movement, the above-described measurement process is performed using the measuring member SM and the reference member FMM. Then, the step-and-scan exposure is performed along the movement locus T1. Here, a shot area SA(n) is a shot area which is to be exposed last on the substrate P, and is located at a position closest to the first cap holder CH1. Therefore, the liquid immersion area LS is quickly moved from the substrate P onto the first cap member C1 after the completion of the exposure. On the other hand, on the second substrate table 22, as shown in FIG. 28, the projection area PA (and the liquid immersion area LS) moves along the movement locus T2. Namely, the projection area PA (and the liquid immersion area LS) moves onto the substrate P via the cap member C1 on the fourth cap holder CH4, the reference member FMM and the measuring member SM (not shown in FIG. 28), and the step-and-scan exposure is performed. Since the shot area SA(n) located at a position closest to the fourth cap holder CH4 is exposed last, the liquid immersion area LS is quickly moved from the substrate P onto the first cap member C1 after the completion of the exposure. Note that as apparent from the movement loci T1 and T2 in FIG. 28, the order of exposure for the shot areas in substrate P is different between the first and second substrate tables 12 and 22.

In the example shown in FIG. 28, areas 15F, 25F, which are lower than the upper surface of the first cap member C1 and the second cap member C2, respectively, are formed around the first cap member C1 and the second cap member C2 held by the first and second cap holders CH1 to CH4 (third cap holder CH3 is not shown in the drawing) of the first and second substrate tables 12, 22. In other words, parts of the opposing surfaces 15, 25, which are around the first to fourth second cap holders CH1 to CH4 capable of holding the first and second cap members C1, C2, are cut out. Accordingly, it is possible to smoothly perform the operation for delivering the first and second cap members C1, C2 between the seal member 30 and the first to fourth cap holders CH1 to CH4.

Note that in each of the embodiments, the explanation has been made as exemplified by a case that the exposure apparatus EX is an exposure apparatus of the multi-stage (twin-stage) type provided with a plurality of (two) substrate stages 1, 2. However, even when the exposure apparatus EX is an exposure apparatus having one substrate stage, it is possible to execute the exchange operation for the first and second cap members C1, C2 by using a plurality of (two) cap holders provided on the one substrate stage. Further, when the above-described cleaning system is provided on the exposure apparatus EX or on an external device or apparatus connected to the exposure apparatus EX, the collected first cap member C1 or the collected second cap member C2 can be cleaned.

In each of the above-described embodiments, the above-described observing device is used to observe the first cap member C1 (or the second cap member C2) so as to determine whether or not the first cap member C1 (or the second cap member C2) needs to be cleaned or exchanged. However, it is allowable to use, as the observing device, a sensor of the exposure apparatus EX, such as the alignment system AL etc. Further, the observing device is not limited to a device based on the image-processing system, but may be a device based on a system, for example, in which a detection beam is radiated to detect a scattered light generated from the cap member due to the radiation of the detection light.

In the respective embodiments described above, the optical path space, on the side of the image plane (light exit surface) of the first optical element at the end portion of the projection optical system PL, is filled with the liquid LQ. However, it is also allowable that an optical path space, on the side of an object plane (light incident surface) of the first optical element at the end portion, is also filled with the liquid, as disclosed, for example, in International Application Publication No. 2004/019128 (corresponding to United States Patent Application Publication No. 2005/0248856). Further, a thin film, which has a liquid-attractive property and/or an anti-dissolution function, may be formed on all or a part (including at least the contact surface with the liquid) of the surface of the terminal end optical element 8. The silica glass has a high affinity for the liquid, and thus any anti-dissolution film is unnecessary therefor. However, it is preferable to form at least the anti-dissolution film for the calcium fluoride.

The liquid LQ is water in the embodiments of the present invention. However, the liquid LQ may be any liquid other than water. For example, when the light source of the exposure light EL is the $F_2$ laser, the $F_2$ laser beam is not transmitted through water. Therefore, it is allowable to use, as the liquid LQ, fluorine-based fluids such as fluorine-based oil, perfluoropolyether (PFPE), etc. Alternatively, other than the above, it is also possible to use, as the liquid LQ, liquids (for example, cedar oil) which have the transmittance with respect to the exposure light EL, which have a refractive index as high as possible, and which are stable against the photoresist forming the surface of the substrate P and the projection optical system PL. It is also allowable to use, as the liquid LQ, liquids having the refractive index of about 1.6 to 1.8. The liquid LQ, which has the refractive index higher than that of pure or purified water (for example, not less than 1.5), includes, for example, predetermined liquids having the C—H bond or the O—H bond such as isopropanol having a refractive index of about 1.50 and glycerol (glycerin) having a refractive index of about 1.61, predetermined liquids (organic solvents) such as hexane, heptane, and decane, and decalin (decahydronaphthalene) having a refractive index of about 1.60. As for the liquid LQ, it is also allowable to use liquids obtained by mixing arbitrary two or more of the foregoing liquids and liquids obtained by adding (mixing) at least one of the foregoing liquid or liquids to (with) pure water. Further, as for the liquid LQ, it is also allowable to use liquids obtained by adding (mixing) base or acid such as $H^+$, $Cs^+$, $K^+$, $Cl^-$, $SO_4^{2-}$, and $PO_4^{2-}$ to (with) pure water, and it is also allowable to use liquids obtained by adding (mixing) fine particles of Al oxide or the like to (with) pure water. As for the liquid LQ, it is preferable to use liquids which have a small coefficient of light absorption, which have a small temperature dependency, and which are stable against the photosensitive material (or, for example, the top coat film or the antireflection film) coated on the surface of the substrate P and/or the projection system PL. As for the liquid LQ, it is also possible to use various fluids including, for example, supercritical fluids.

In the respective embodiments described above, the measuring system including the laser interferometer (interferometer system) is used to measure the position information about each of the mask stage and the substrate stage. However, the measurement of positional information is not limited to this. For example, it is also allowable to use an encoder system which detects a scale (diffraction grating) provided for each of the stages as disclosed, for example, in International Publication No. 2007/083758 (corresponding to U.S. patent application Ser. No. 11/655,082) and International Publication No. 2007/097379 (corresponding to U.S. patent application Ser. No. 11/708,533). Alternatively, it is also allowable to use an encoder system in which an encoder head is provided for a substrate table, and a scale is arranged over or above the substrate table as disclosed, for example, in United States Patent Application Publication No. 2006/0227309. In this case, it is preferable that a hybrid system including both of the interferometer system and the encoder system is provided, and the measurement result of the encoder system is calibrated (subjected to the calibration) by using the measurement result of the interferometer system. The position control of the stage may be performed by switchingly using the interferometer system and the encoder system or by using both of them. Further alternatively, in the respective embodiments described above, it is also allowable to use a plane motor as the actuator for driving each of the first and second substrate stages.

The substrate P, which is usable in the respective embodiments described above, is not limited to the semiconductor wafer for producing a semiconductor device. Substrates applicable include, for example, a glass substrate for a display device, a ceramic wafer for a thin film magnetic head, a master plate (synthetic silica glass, silicon wafer) for the mask or the reticle to be used for the exposure apparatus, a film member, etc. Further, the shape of the substrate P is not limited to the circular shape, and may be any other shape including, for example, rectangular shapes.

As for the exposure apparatus EX, the present invention is also applicable to a scanning type exposure apparatus (scanning stepper) based on the step-and-scan manner for performing the scanning exposure for the substrate P with the image of the pattern of the mask M while moving the substrate P in synchronization with the movement of the mask M as well as to a projection exposure apparatus (stepper) based on the step-and-repeat system for performing the full field exposure with the image of the pattern of the mask M in a state that the mask M and the substrate P are allowed to stand still, while successively step-moving the substrate P.

Further, in the exposure based on the step-and-repeat system, a reduction image of a first pattern may be projected onto the substrate P by using the projection optical system in a state that the first pattern and the substrate P are allowed to substantially stand still, and then the full field projection may be performed on the substrate P by partially overlaying a reduction image of a second pattern with respect to the first pattern by using the projection optical system in a state that the second pattern and the substrate P are allowed to substantially stand still (i.e., for example, the full field exposure apparatus based on the stitch system may be the exposure apparatus EX). As for the exposure apparatus based on the stitch system, the present invention is also applicable to an exposure apparatus based on the step-and-stitch system in which at least two patterns are partially overlaid and transferred on the substrate P, and the substrate P is successively moved. The exposure apparatus based on the stitch system may be a scanning type exposure apparatus in which respective patterns are transferred by the scanning exposure.

Further, the present invention is also applicable to an exposure apparatus including a substrate stage which holds the substrate and a measuring stage which is provided with a reference member having a reference mark formed therein and/or various types of photoelectric sensors as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). Contents of U.S. Pat. No. 6,897,963 and the like are incorporated herein by reference.

The respective embodiments described above have been explained as exemplified by the exposure apparatus provided with the projection optical system PL. However, the present invention is applicable to an exposure apparatus and an exposure method in which the projection optical system PL is not used. Even in such a case that the projection optical system PL is not used, the exposure light is radiated onto the substrate via an optical member such as a lens, and the liquid immersion space is formed in a predetermined space between such an optical member and the substrate. Further, the mask stage can be also omitted depending on the exposure system as described above.

The optical element (terminal end optical element) 8 of the projection optical system PL may be formed of, for example, a single crystal material of fluorine compound such as barium fluoride, strontium fluoride, lithium fluoride, and sodium fluoride, or silica glass (silica), instead of calcium fluoride. Alternatively, the optical element (terminal end optical element) 8 may be formed of a material having a refractive index higher than those of silica glass and calcium fluoride (for example, a material having a refractive index of not less than 1.6). Materials usable as the material having the refractive index of not less than 1.6 include, for example, sapphire and germanium dioxide disclosed in International Publication No. 2005/059617 and potassium chloride (refractive index: about 1.75) disclosed in International Publication No. 2005/059618.

In the respective embodiments described above, the ArF excimer laser is used as the light source for the exposure light EL. However, it is also allowable to use a high harmonic wave-generating device which includes a solid laser light source such as a DFB semiconductor laser or a fiber laser, a light-amplifying device having a fiber amplifier or the like, a wavelength-converting device and the like, and which outputs a pulse light beam having a wavelength of 193 nm as disclosed, for example, in U.S. Pat. No. 7,023,610. Further, in the respective embodiments described above, although the projection area (exposure area) is rectangular, it is also allowable to adopt any other shape including circular arc-shaped, trapezoidal, parallelogramic, rhombic shapes and the like.

As for the type of the exposure apparatus EX, the present invention is not limited to the exposure apparatus for the semiconductor device production which exposes the substrate P with the semiconductor device pattern. The present invention is also widely applicable, for example, to an exposure apparatus for producing the liquid crystal display device or for producing the display as well as an exposure apparatus for producing, for example, a thin film magnetic head, an image pickup device (CCD), a micromachine, MEMS, a DNA chip, a reticle, or a mask.

In the embodiments described above, the light-transmissive type mask is used, in which the predetermined light-shielding pattern (or phase pattern, or dimming or light-reducing pattern) is formed on the light-transmissive substrate. However, instead of such a mask, as disclosed, for example, in U.S. Pat. No. 6,778,257, it is also allowable to use an electronic mask on which a transmissive pattern, a reflective pattern, or a light-emitting pattern is formed based on the electronic data of the pattern to be subjected to the exposure (also referred to as "variable shaped mask", "active mask", or "image generator" including, for example, DMD (Digital Micro-mirror Device) as one of the non-light emission type image display device (spatial optical modulator)). An exposure apparatus using DMD is disclosed, for example, in Japanese Patent Application Laid-open Nos. 8-313842 and 2004-304135 in addition to in U.S. Pat. No. 6,778,257 mentioned above. Contents of U.S. Pat. No. 6,778,257 are incorporated herein by reference.

The present invention is also applicable to an exposure apparatus (lithography system) in which the substrate P is exposed with a line-and-space pattern by forming interference fringes on the substrate P as disclosed, for example, in International Publication No. 2001/035168.

Further, the present invention is also applicable, for example, to an exposure apparatus in which patterns of two masks are combined on the substrate via the projection optical system, and one of the shot areas on the substrate is subjected to the double exposure substantially simultaneously by one time of the scanning exposure as disclosed, for example, in Published Japanese Translation of PCT International Publication for Patent Application No. 2004-519850 (corresponding to U.S. Pat. No. 6,611,316). Contents of U.S. Pat. No. 6,611,316 are incorporated herein by reference. Further, the present invention is also applicable, for example, to an exposure apparatus based on the proximity system, a mirror projection aligner, and the like.

As described above, the exposure apparatus EX according to each of the embodiments of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include the mechanical connection, the wiring connection of the electric circuits, the piping connection of the air pressure circuits, and the like in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness and the like are managed.

Figure 29:
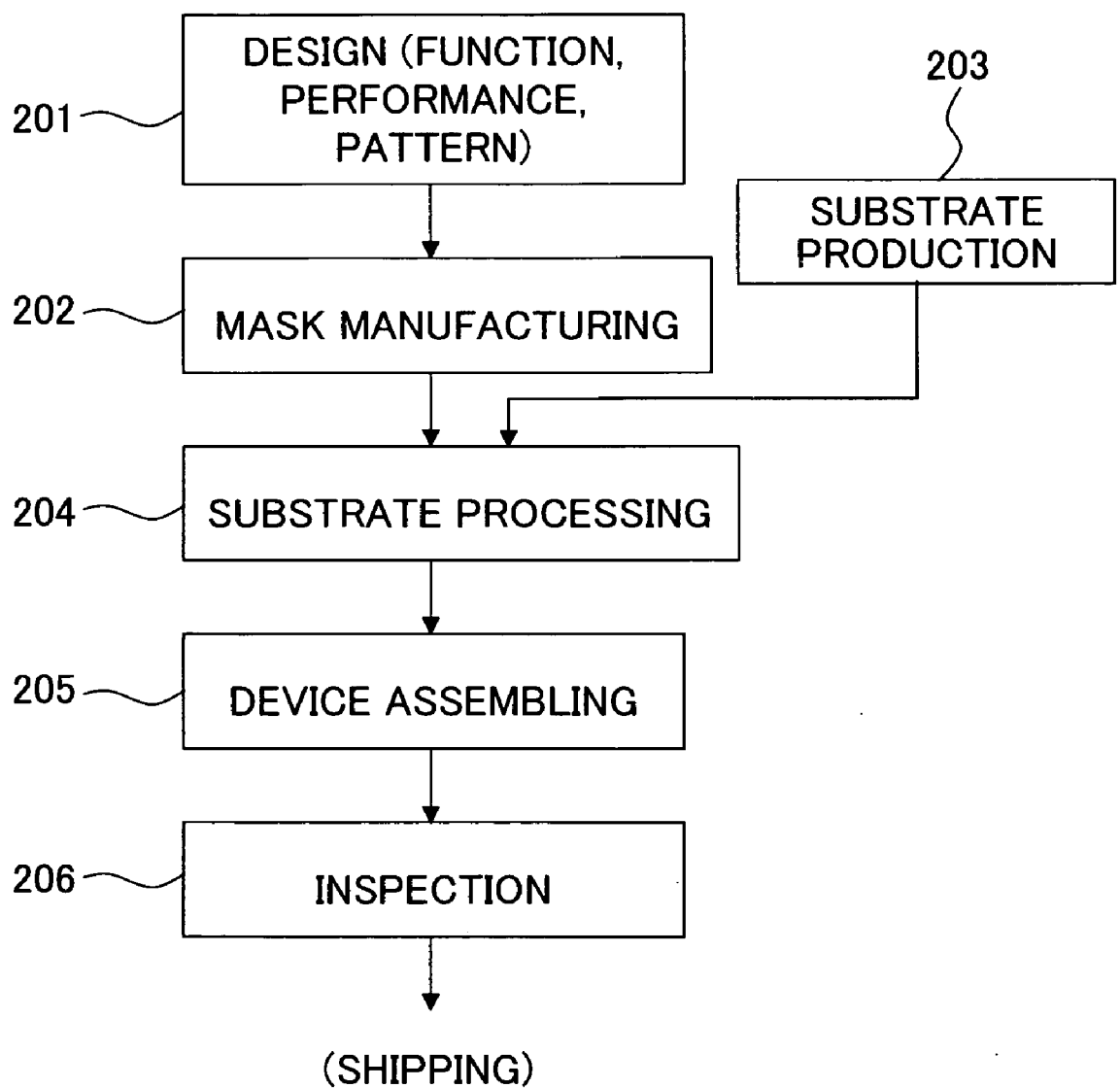
FIG. 29 shows a flow chart illustrating exemplary steps of producing a microdevice.

As shown in FIG. 29, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate-processing step 204 including the substrate processing (exposure process) for exposing the substrate with the pattern of the mask and developing the exposed substrate in accordance with the embodiment as described above, a step 205 of assembling the device (including processing processes such as a dicing step, a bonding step, a packaging step and the like), an inspection step 206, and the like.

As for various United States patents, United States patent application Publications etc. referred to in this specification, the contents of the of the United States patents and United States patent application Publications etc. are incorporated herein by reference, in relation to those other than those having been specifically and explicitly incorporated herein by reference as well.

According to the present invention, the substrate can be exposed efficiently and satisfactorily, and it is possible to produce a device having a desired performance at a good productivity. Therefore, the present invention can remarkably contribute to the development of the precision mechanical equipment industry including the semiconductor industry in our country.

What is claimed is:

1. An exposure apparatus which exposes a substrate by radiating an exposure beam onto the substrate, the exposure apparatus comprising:
   a first optical member having an exit surface via which the exposure beam exits;
   a first movable body which is movable, while holding the substrate, in a predetermined area including a first area and a second area, the first area including a position opposite to the exit surface of the first optical member and the second area being different from the first area;
   a first holding device which releasably holds a first cover member, capable of forming a liquid-retaining space retaining a liquid between the first optical member and the first cover member, such that when the first movable body is away from the first optical member, the first cover member is arranged at the position opposite to the exit surface of the first optical member; and
   a second holding device which is arranged at a first position on the first movable body and which is capable of holding the first cover member released from the first holding device; and
   a third holding device which is arranged at a second position on the first movable body and which releasably holds a second cover member different from the first cover member.

2. The exposure apparatus according to claim 1, wherein the substrate held by the first movable body is exposed while releasing the first cover member, held by the first holding device, from the first holding device and holding the first cover member by the second holding device.

3. The exposure apparatus according to claim 2, wherein the substrate held by the first movable body is exposed while holding the first cover member by the second holding device and holding the second cover member by the third holding device.

4. The exposure apparatus according to claim 3, wherein after the substrate is exposed, the second cover member held by the third holding device is released from the third holding device and is held by the first holding device.

5. The exposure apparatus according to claim 1, wherein at least one of the first cover member, the first movable body, the substrate held by the first movable body and the second cover member is arranged to the position opposite to the exit surface of the first optical member to continuously form the liquid-retaining space retaining the liquid between the first optical member and at least one of the first cover member, the first movable body, the substrate held by the first movable body and the second cover member.

6. The exposure apparatus according to claim 5, wherein a first state that the first optical member faces the first cover member held by the first holding device is changed to a third state that the first optical member faces the second cover member held by the third holding device, via a second state that the first cover member is held by the second holding device and that the first optical member faces the first movable body.

7. The exposure apparatus according to claim 1, wherein after the first cover member released from the first holding device is held by the second holding device, the first movable body is moved to the second area.

8. The exposure apparatus according to claim 1, further comprising a transport device which transports the first cover member, released from the first holding device and held by the second holding device, to a predetermined position different from the first, second and third holding devices.

9. The exposure apparatus according to claim 8, wherein after the first cover member released from the first holding device is held by the second holding device, the first movable body is moved to the second area; and
   the transport device transports the first cover member, released from the second holding device of the first movable body moved to the second area, to the predetermined position.

10. The exposure apparatus according to claim 8, wherein the exposure apparatus is accessible by an external apparatus at the predetermined position.

11. The exposure apparatus according to claim 8, wherein the first cover member transported to the predetermined position is transported to outside of the exposure apparatus.

12. The exposure apparatus according to claim 8, further comprising a cleaning system which cleans the first cover member transported to the predetermined position.

13. The exposure apparatus according to claim 8, further comprising:
   an exposure station at which the first optical member is arranged and which includes the first area; and
   a measuring station at which a second optical member is arranged and which includes the second area, the second optical member obtaining a position information of the substrate;
   wherein the transport device is arranged at the measuring station.

14. The exposure apparatus according to claim 1, further comprising:
   a second movable body which is movable, while holding the substrate, independently from the first movable body in the predetermined area including the first and second areas; and a fourth holding device which is arranged at a third position on the second movable body and is capable of holding the first cover member released from the first holding device;

wherein the first holding device holds the cover member when each of the first and second movable bodies is away from the first optical member.

15. The exposure apparatus according to claim 14, further comprising a fifth holding device which is arranged at a fourth position on the second movable body and is capable of releasably holding the second cover member.

16. A method for producing a device, comprising:
exposing a substrate by using the exposure apparatus as defined in claim 1;
developing the exposed substrate; and
processing the developed substrate.

17. An exposure apparatus which exposes a substrate by radiating an exposure beam onto the substrate, the exposure apparatus comprising:
a first optical member having an exit surface via which the exposure beam exits;
a first movable body which is movable, while holding the substrate, in a predetermined area including a first area and a second area, the first area including a position opposite to the exit surface of the first optical member and the second area being different from the first area;
a first holding device which releasably holds a first cover member capable of forming a liquid-retaining space retaining a liquid between the first optical member and the first cover member, such that when the first movable body is away from the first optical member, the first cover member is arranged at the position opposite to the exit surface of the first optical member; and
an exchange system which exchanges the first cover member for a second cover member different from the first cover member while forming the liquid-retaining space between the first optical member and the exchange system, wherein the exchange system includes:
a second holding device which is arranged at a first position on the first movable body and which is capable of holding the first cover member released from the first holding device; and
a third holding device which is arranged at a second position on the first movable body and which releasably holds the second cover member.

18. The exposure apparatus according to claim 17, wherein the exchange system arranges at least one of the first cover member, the first movable body, the substrate held by the first movable body and the second cover member at the position opposite to the exit surface of the first optical member to continuously form the liquid-retaining space between the first optical member and at least one of the first cover member, the first movable body, the substrate held by the first movable body and the second cover member.

19. The exposure apparatus according to claim 17, wherein the exchange system changes a first state that the first optical member faces the first cover member held by the first holding device to a third state that the first optical member faces the second cover member held by the third holding device, via a second state that the first cover member is held by the second holding device and that the first optical member faces the first movable body.

* * * * *